United States Patent
Song et al.

(10) Patent No.: US 12,191,340 B2
(45) Date of Patent: Jan. 7, 2025

(54) DISPLAY DEVICE

(71) Applicant: Samsung Display Co., LTD., Yongin-si (KR)

(72) Inventors: Dae Ho Song, Hwaseong-si (KR); Sung Eun Baek, Suwon-si (KR); Ki Seong Seo, Seoul (KR); Byung Choon Yang, Seoul (KR); Tae Hee Lee, Hwaseong-si (KR); Byeong Hwa Choi, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 410 days.

(21) Appl. No.: 17/558,079

(22) Filed: Dec. 21, 2021

(65) Prior Publication Data
US 2022/0352237 A1 Nov. 3, 2022

Related U.S. Application Data

(60) Provisional application No. 63/182,607, filed on Apr. 30, 2021.

(30) Foreign Application Priority Data

Apr. 30, 2021 (KR) .................. 10-2021-0056219

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/50* (2013.01);
(Continued)

(58) Field of Classification Search
CPC ......... H10K 59/38; H01L 33/50; H01L 33/58; H01L 2933/0041; H01L 2933/0058; H01L 33/505; H01L 33/08
See application file for complete search history.

(56) References Cited

U.S. PATENT DOCUMENTS

2017/0358503 A1* 12/2017 Liu .................. B65G 43/08
2018/0151543 A1* 5/2018 Lee .................. H01L 23/5386
(Continued)

FOREIGN PATENT DOCUMENTS

JP   2018-14475 A    1/2018
KR   10-2017-0084139 A   7/2017
(Continued)

OTHER PUBLICATIONS

Liang, Kai-Ling, et al., "Advances in color-converted micro-LED arrays," Japanese Journal of Applied Physics, 2021, vol. 60, SA0802, 10 pages.

*Primary Examiner* — Evan G Clinton
(74) *Attorney, Agent, or Firm* — Lewis Roca Rothgerber Christie LLP

(57) ABSTRACT

A display device includes: a plurality of light emitting elements on a first substrate; a second substrate facing the first substrate; a partition wall on one surface of the second substrate facing the first substrate, and including a plurality of openings; a plurality of color filters in the plurality of openings; wavelength conversion layers on the plurality of color filters, respectively, and to convert wavelengths of light emitted from the plurality of light emitting elements; and an adhesive layer adhering the first substrate and the second substrate to each other. The partition wall includes a silicon single crystal.

27 Claims, 50 Drawing Sheets

(51) Int. Cl.
    *H01L 33/50*           (2010.01)
    *H01L 33/58*           (2010.01)
    *H01L 33/60*           (2010.01)
    *H01L 33/62*           (2010.01)

(52) U.S. Cl.
    CPC .............. *H01L 33/58* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(56) References Cited

U.S. PATENT DOCUMENTS

2020/0219438 A1\*   7/2020   Shin ........................ H04N 25/76
2020/0349882 A1\*  11/2020   Kim ................... H01L 33/0075

FOREIGN PATENT DOCUMENTS

| KR | 10-2018-0009116 A | 1/2018 |
| --- | --- | --- |
| KR | 10-2018-0118488 A | 10/2018 |
| KR | 10-2019-0127666 A | 11/2019 |
| KR | 10-2019-0127872 A | 11/2019 |
| KR | 10-2021-0006567 A | 1/2021 |

\* cited by examiner

FIG. 3
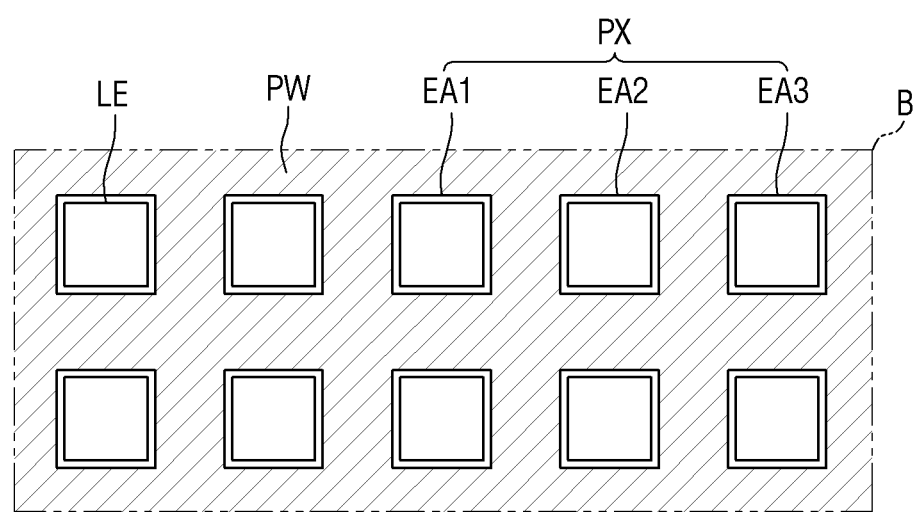
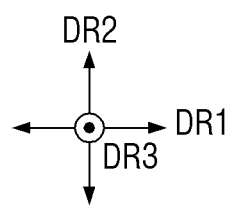

FIG. 14
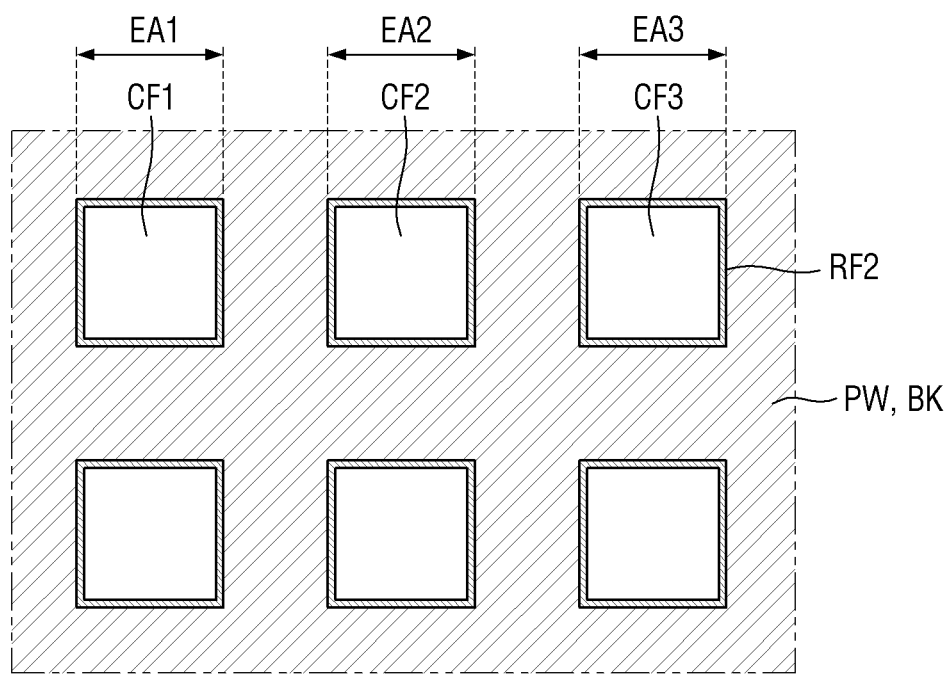
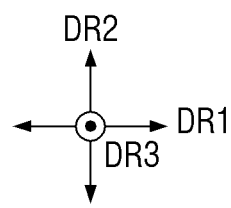

FIG. 29
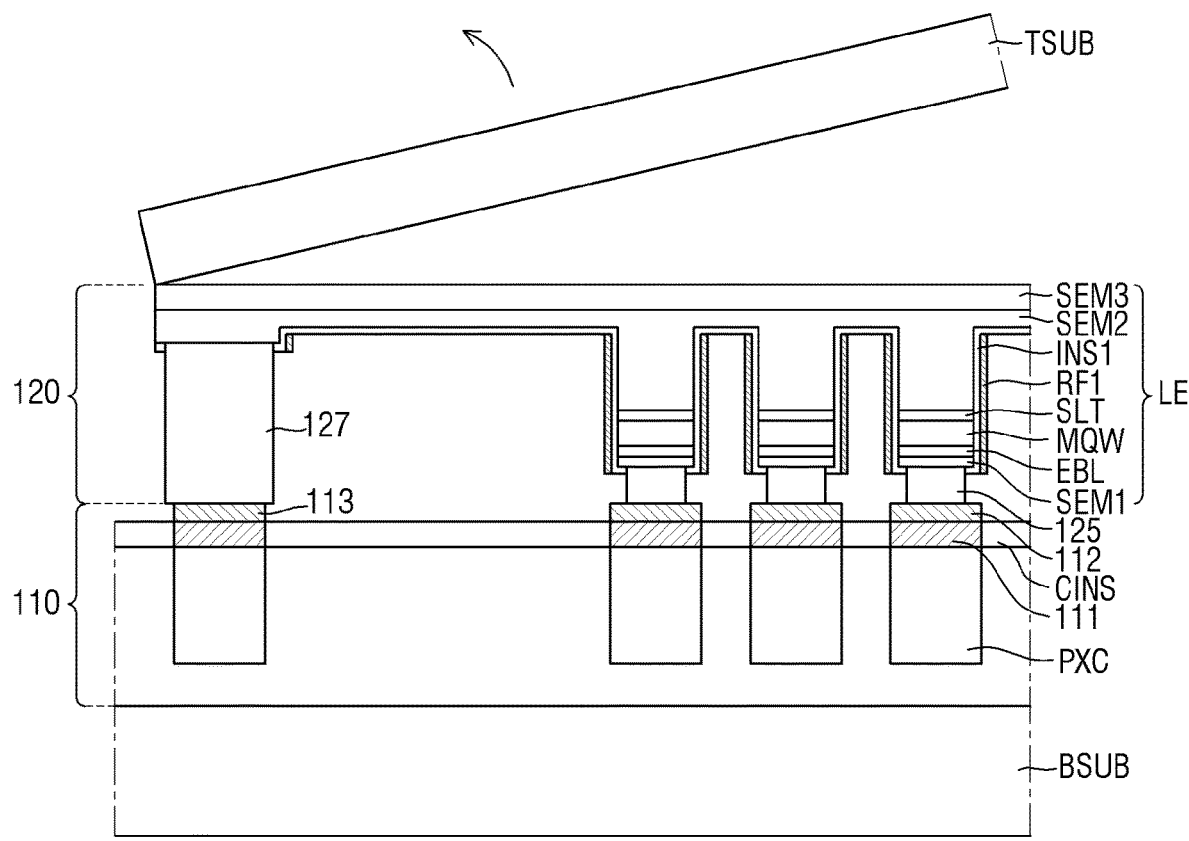
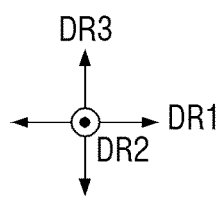

FIG. 30
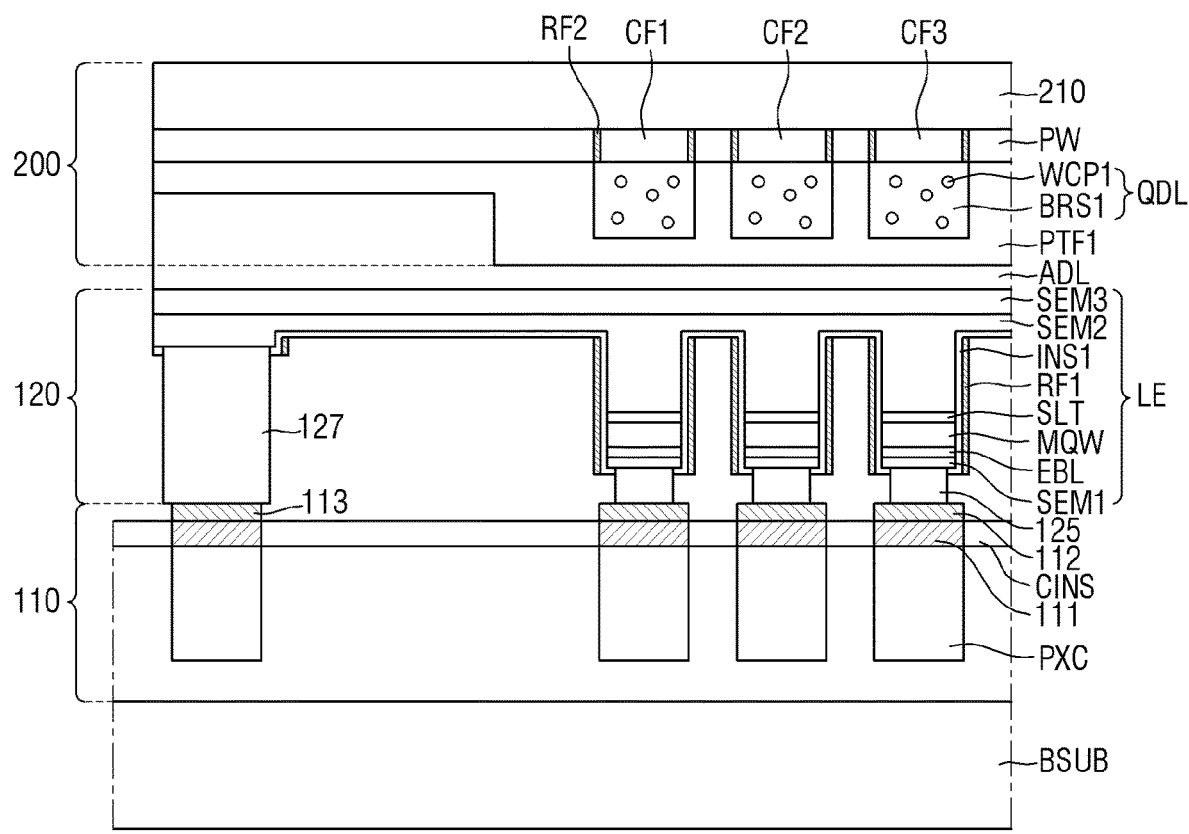
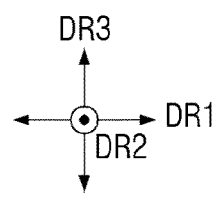

DISPLAY DEVICE

CROSS-REFERENCE TO RELATED APPLICATION

This application claims priority to and the benefit of U.S. Provisional Application No. 63/182,607, filed on Apr. 30, 2021, entitled "PROCESS FOR FABRICATION OF SILICON-ON-SAPPHIRE (SOS) BASED COLOR CONVERSION SUBSTRATE FOR APPLICATION IN A DISPLAY DEVICE AND A DISPLAY DEVICE INCLUDING THE SAME," and also claims priority to and the benefit of Korean Patent Application No. 10-2021-0056219, filed on Apr. 30, 2021, in the Korean Intellectual Property Office, the entire content of all of which is incorporated by reference herein.

BACKGROUND

1. Field

Aspects of one or more embodiments of the present disclosure relate to a display device.

2. Description of the Related Art

As information society develops, the demand for display devices for displaying images has increased and diversified. A display device may be a flat panel display, such as a liquid crystal display (LCD), a field emission display (FED), or a light emitting display (LED). Light emitting display devices may include an organic light emitting display device including an organic light emitting diode element as a light emitting element, an inorganic light emitting display device including an inorganic semiconductor element as a light emitting element, or a micro light emitting diode display device including a micro light emitting diode element as a light emitting element.

Recently, head mounted displays (HMDs) including light emitting display devices have been developed. The head mounted display (HMD) is a glasses-type monitor device for virtual reality (VR) or augmented reality (AR) that is worn in the form of glasses or a helmet by a user, and forms a focus at a distance close to the user's eyes in front of the user's eyes.

A high-resolution micro light emitting diode display panel including a micro light emitting diode element may be applied to the head mounted display. Because the micro light emitting diode element may emit light of a single color, the micro light emitting diode display panel may include a wavelength conversion layer for converting a wavelength of light emitted from the micro light emitting diode element in order to display various colors.

The above information disclosed in this Background section is for enhancement of understanding of the background of the present disclosure, and therefore, it may contain information that does not constitute prior art.

SUMMARY

One or more embodiments of the present disclosure are directed to a display device having ultra-high resolution by forming emission areas having ultra-high resolution.

However, the aspects and features of the present disclosure are not restricted to those set forth herein. The above and other aspects and features of the present disclosure will become more apparent to those of ordinary skill in the art to which the present disclosure pertains by referencing the detailed description of the present disclosure given below.

According to one or more embodiments of the present disclosure, a display device includes: a plurality of light emitting elements on a first substrate; a second substrate facing the first substrate; a partition wall on one surface of the second substrate facing the first substrate, and including a plurality of openings; a plurality of color filters in the plurality of openings; wavelength conversion layers on the plurality of color filters, respectively, and configured to convert wavelengths of light emitted from the plurality of light emitting elements; and an adhesive layer adhering the first substrate and the second substrate to each other. The partition wall includes a silicon single crystal.

In an embodiment, the plurality of light emitting elements may be configured to emit first light, and the plurality of color filters may include: a first color filter configured to transmit the first light; a second color filter configured to transmit second light having a wavelength band different from that of the first light; and a third color filter configured to transmit third light having a wavelength band different from those of the first light and the second light.

In an embodiment, the plurality of openings may include: a first opening; a second opening spaced from the first opening; and a third opening spaced from the first and second openings. The first color filter may be located in the first opening, the second color filter may be located in the second opening, and the third color filter may be located in the third opening.

In an embodiment, the wavelength conversion layers may be configured to convert a portion of the first light into fourth light, and emit fifth light formed by mixing the first light with the fourth light therein.

In an embodiment, the first color filter may be configured to convert the fifth light emitted from the wavelength conversion layers into the first light; the second color filter may be configured to convert the fifth light emitted from the wavelength conversion layers into the second light; and the third color filter may be configured to convert the fifth light emitted from the wavelength conversion layers into the third light.

In an embodiment, the wavelength conversion layers may include: a light transmission pattern configured to transmit the first light; a first wavelength conversion pattern configured to convert the first light into the second light; and a second wavelength conversion pattern configured to convert the first light into the third light.

In an embodiment, the light transmission pattern may overlap with the first color filter, the first wavelength conversion pattern may overlap with the second color filter, and the second wavelength conversion pattern may overlap with the third color filter.

In an embodiment, the partition wall may have a thickness of 1 μm to 10 μm.

In an embodiment, each of the plurality of light emitting elements may include: a first semiconductor layer; an active layer on the first semiconductor layer; a second semiconductor layer on the active layer; and a third semiconductor layer on the second semiconductor layer.

In an embodiment, the second semiconductor layer and the third semiconductor layer may be common layers that are commonly connected to the plurality of light emitting elements.

In an embodiment, a thickness of an area of the second semiconductor layer that overlaps with the first semiconductor layer may be greater than a thickness of an area of the second semiconductor layer that does not overlap with the first semiconductor layer.

In an embodiment, each of the plurality of light emitting elements may further include: first insulating layers on side surfaces of the first semiconductor layer, the active layer, and the second semiconductor layer; and first reflective layers on side surfaces of the first insulating layers.

In an embodiment, the display device may further include second reflective layers on side surfaces of each of the plurality of openings, and the second reflective layers may surround the plurality of color filters, respectively.

In an embodiment, the wavelength conversion layers may overlap with the plurality of color filters, the second reflective layers, and the plurality of openings.

In an embodiment, the first substrate may include: a plurality of pixel circuit parts including at least one transistor; pixel electrodes on the plurality of pixel circuit parts, and connected to the plurality of pixel circuit parts, respectively; a circuit insulating layer between the plurality of pixel circuit parts and the pixel electrodes; and contact electrodes on the pixel electrodes, respectively.

In an embodiment, each of the plurality of light emitting elements may include a connection electrode between the first semiconductor layer and a corresponding one of the contact electrodes, and the corresponding one of the contact electrodes may be in contact with the connection electrode.

In an embodiment, the display device may further include a first passivation layer covering the partition wall and the wavelength conversion layers, and one surface of the first passivation layer that is adjacent to the light emitting elements may be flat.

In an embodiment, the display device may further include a second passivation layer between the plurality of color filters and the wavelength conversion layers.

In an embodiment, the plurality of color filters and the wavelength conversion layers may be located in the plurality of openings, respectively.

In an embodiment, the display device may further include a light blocking member on the partition wall, and partitioning the wavelength conversion layers, and the light blocking member may not overlap with the plurality of openings.

According to one or more embodiments of the present disclosure, a display device includes: a first substrate and a second substrate facing each other, the first and second substrates including a first emission area configured to emit first light, a second emission area configured to emit second light, and a third emission area configured to emit third light; a plurality of light emitting elements on the first substrate in the first emission area, the second emission area, and the third emission area; a partition wall on one surface of the second substrate facing the first substrate, and including a plurality of openings corresponding to the first emission area, the second emission area, and the third emission area; a plurality of color filters in the plurality of openings; wavelength conversion layers on the plurality of color filters, respectively; and an adhesive layer adhering the first substrate and the second substrate to each other. The partition wall includes a silicon single crystal, and the plurality of openings include a first opening corresponding to the first emission area, a second opening corresponding to the second emission area, and a third opening corresponding to the third emission area.

In an embodiment, the plurality of color filters may include: a first color filter configured to transmit the first light, a second color filter configured to transmit the second light, and a third color filter configured to transmit the third light. The first color filter may be located in the first opening, the second color filter may be located in the second opening, and the third color filter may be located in the third opening.

In an embodiment, the wavelength conversion layers may correspond to the plurality of openings in a one-to-one manner, and may completely overlap with the plurality of openings.

In an embodiment, the first substrate and the second substrate may include a display area including the first emission area, the second emission area, and the third emission area, and a non-display area other than the display area.

In an embodiment, each of the plurality of light emitting elements may include: a first semiconductor layer; an active layer on the first semiconductor layer; a second semiconductor layer on the active layer; and a third semiconductor layer on the second semiconductor layer. The second semiconductor layer and the third semiconductor layer may extend from the display area to the non-display area.

In an embodiment, the first substrate may further include: a plurality of pixel circuit parts including at least one transistor; pixel electrodes on the plurality of pixel circuit parts, and connected to the plurality of pixel circuit parts, respectively; a circuit insulating layer between the plurality of pixel circuit parts and the pixel electrodes; contact electrodes on the pixel electrodes, respectively, at the display area; and common contact electrodes on the pixel electrodes, respectively, at the non-display area.

In an embodiment, the display device may further include common connection electrodes between the second semiconductor layer and the common contact electrodes at the non-display area, and the common connection electrodes may be in contact with the common contact electrodes.

According to one or more embodiments of the present disclosure, a display device includes: a color conversion layer including: a sapphire substrate; a plurality of silicon separation walls on the sapphire substrate; and a plurality of color conversion units at locations defined by the silicon separation walls; and a display layer connected to the color conversion layer and including: a driving substrate; and a light emitting layer connected to the driving substrate.

In an embodiment, the light emitting layer may include a plurality of light emitting diodes (LEDs) that are spaced from each other by an interval.

In an embodiment, the LEDs may include gallium nitride (GaN) LEDs to emit a blue light.

In an embodiment, each of the LEDs may have multi quantum wells (MQW) formed therein and configured to emit light.

In an embodiment, the light emitting layer may be connected to the driving substrate via a first electrode, and each of the LEDs may be connected to the driving substrate via a corresponding one of a plurality of second electrodes.

In an embodiment, the display layer may further include a reflector around the LEDs.

In an embodiment, the color conversion units may include color filters and/or quantum dot layers.

In an embodiment, the color filters may include a red color filter, a green color filter, and a blue color filter, and the color conversion layer may further include at least one of a scattering layer or a filler corresponding to the blue color filter.

In an embodiment, the color conversion layer may further include a passivation layer covering the quantum dot layers.

In an embodiment, the color conversion layer may include a reflector around at least some of the color filters.

In an embodiment, the color conversion layer may include a black matrix to separate the quantum dot layers from each other.

In an embodiment, the color conversion layer may further include an adhesive layer connecting the color conversion layer to the display layer.

According to one or more embodiments of the present disclosure, a method of fabricating a display layer includes: forming a light emitting layer on a sapphire substrate; forming a plurality of light emitting diodes (LEDs) from the light emitting layer; placing a first electrode on the light emitting layer and a plurality of second electrodes on the LEDs; combining the light emitting layer with a driving substrate; and removing the sapphire substrate from the light emitting layer to form the display layer.

According to one or more embodiments of the present disclosure, a method of fabricating a color conversion layer includes: forming a silicon layer on a sapphire substrate; etching the silicon layer to form a plurality of separator walls; placing color filters between the separator walls to correspond to pixels; forming quantum dot layers on at least some of the color filters; and forming a planarization layer on the quantum dot layers and the silicon layer to form the color conversion layer.

In an embodiment, the method may further include forming at least one of a scattering layer or a filler on a blue color filter from among the color filters.

In an embodiment, the method may further include forming an adhesive layer on the planarization layer.

In an embodiment, the method may further include forming a reflector on a side of the plurality of separator walls prior to placing the color filters.

In an embodiment, the method may further include forming a black matrix on the separator walls prior to forming the quantum dot layers.

A display device according to one or more embodiments of the present disclosure may include the partition wall having a high aspect ratio that may be easily manufactured by forming the partition wall including silicon, and etching the partition wall in a high aspect ratio. Accordingly, the emission areas having ultra-high resolution may be formed, and thus, the display device having ultra-high resolution may be realized.

In addition, a display device according to one or more embodiments of the present disclosure may improve light emission efficiency of blue light, green light, and red light by forming the wavelength conversion layers including the light transmission pattern, the first wavelength conversion pattern, and the second wavelength conversion pattern.

Further, a display device according to one or more embodiments of the present disclosure may include the first passivation layer having the same or substantially the same thickness at (e.g., in or on) the display area and the non-display area, such that the lower surface of the wavelength conversion substrate that is adhered to the light emitting element layer may be formed to be flat or substantially flat. Accordingly, adhesion between the wavelength conversion substrate and the light emitting element layer may be easily performed, and an adhesive force between the wavelength conversion substrate and the light emitting element layer may be improved.

Further, a display device according to one or more embodiments of the present disclosure may include the second passivation layer between the color filters and the wavelength conversion layers to prevent or substantially prevent the color filters from being damaged by a subsequent process.

Further, a display device according to one or more embodiments of the present disclosure may include the partition wall that is formed to have a large thickness, and the color filters and the wavelength conversion layers that are formed in the openings, such that alignment between the color filters and the wavelength conversion layers may be facilitated, and a thickness of the wavelength conversion layers may be increased to improve light conversion efficiency.

Further, a display device according to one or more embodiments of the present disclosure may include the display panel including the light blocking member surrounding (e.g., around peripheries of) the emission areas to prevent or substantially prevent the light from penetrating between the emission areas and mixing the colors, such that the color reproduction rate may be improved.

However, the aspects and features of the present disclosure are not limited to those described above, and various other aspects and features may be included in the present specification.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which:

FIG. 3 is a layout diagram illustrating pixels of a display panel according to an embodiment;

FIG. 14 is a plan view illustrating a portion of a display panel according to another embodiment;

FIGS. 16-30 are cross-sectional views illustrating a method of manufacturing a display panel according to an embodiment;

DETAILED DESCRIPTION

Figure 1:
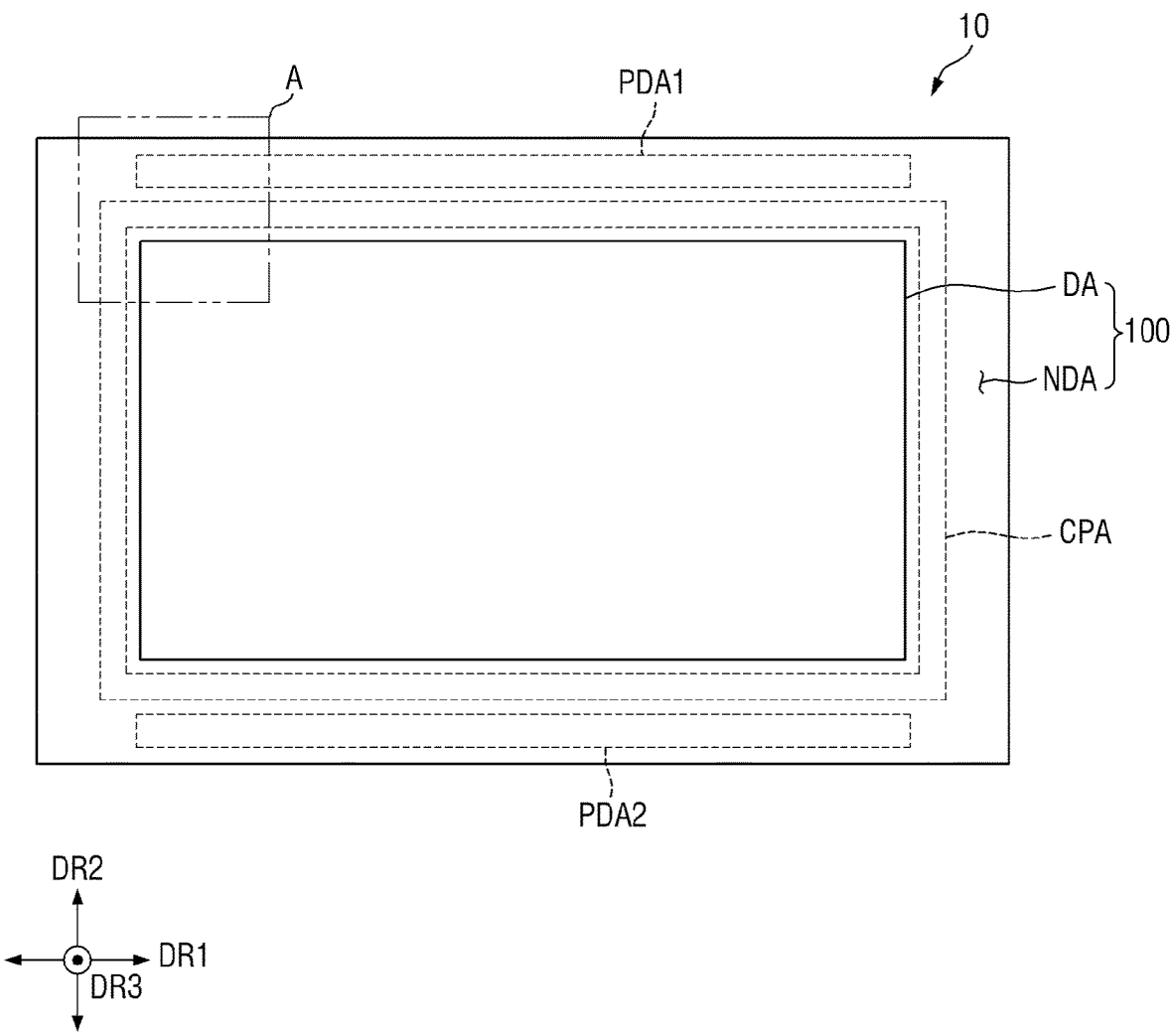
FIG. 1 is a layout diagram illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, a first direction DR1, a second direction DR2, and a third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
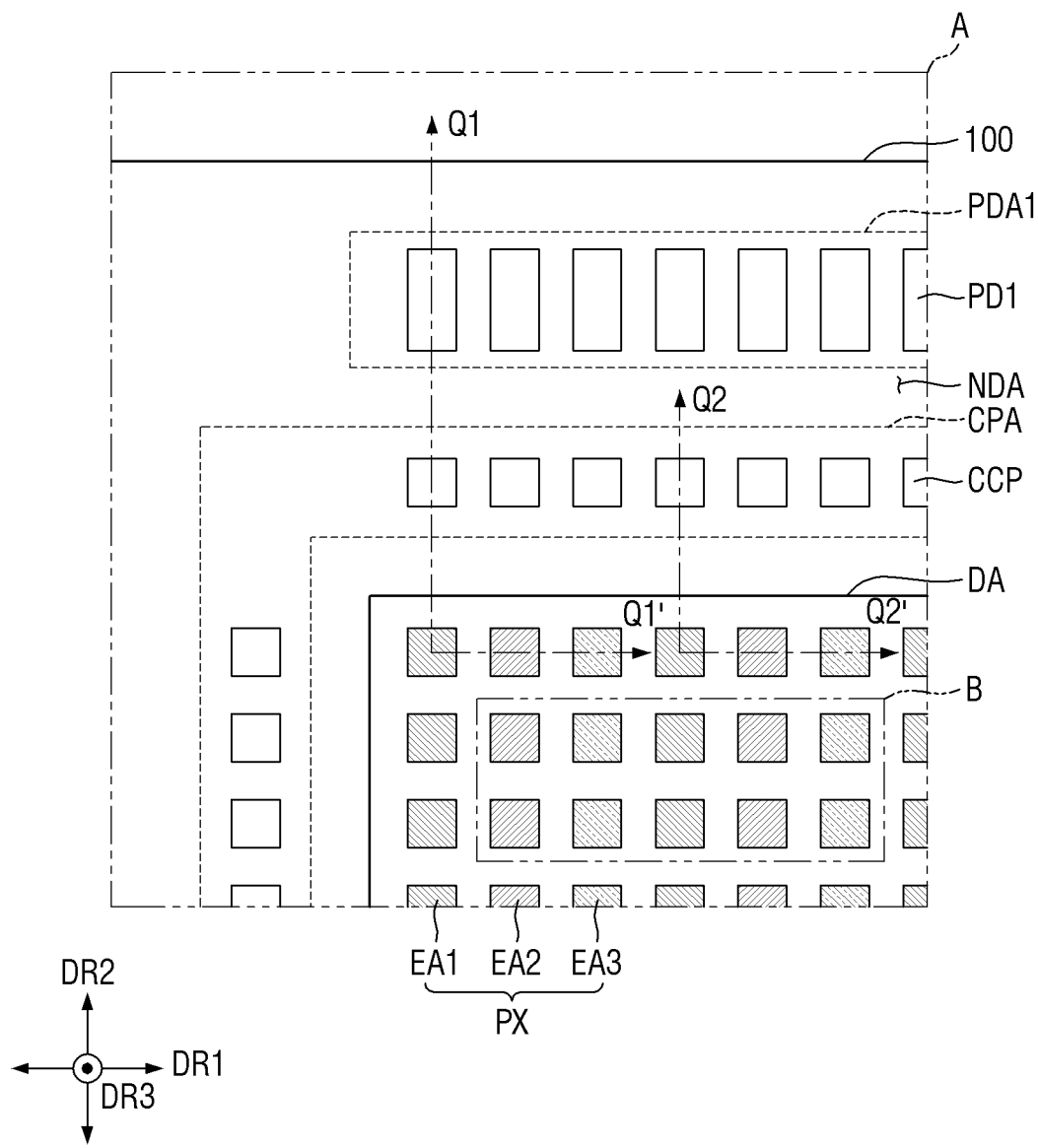
FIG. 2 is a layout diagram illustrating the region A of FIG. 1 in more detail.

FIG. 1 is a layout diagram illustrating a display device according to an embodiment. FIG. 2 is a layout diagram illustrating the region A of FIG. 1 in more detail. FIG. 3 is a layout diagram illustrating pixels of a display panel according to an embodiment.

For convenience, a display device according to one or more embodiments of the present disclosure will be mainly described with reference to FIGS. 1 to 3 as a micro light emitting diode display device including a micro light emitting diode as a light emitting element, but the present disclosure is not limited thereto.

In addition, the display device according to one or more embodiments of the present disclosure will be mainly described with reference to FIGS. 1 to 3 as including a Light Emitting Diode on Silicon (LEDoS) in which light emitting diodes are disposed on a semiconductor circuit substrate formed using a semiconductor process, but the present disclosure is not limited thereto.

In FIGS. 1 to 3, the first direction DR1 refers to a horizontal direction of a display panel 100, the second direction DR2 refers to a vertical direction of the display panel 100, and the third direction DR3 refers to a thickness direction of the display panel 100. In this case, "left", "right", "upper", and "lower" indicate directions when the display panel 100 is viewed in a plan view (e.g., when the display panel 100 is viewed from a direction that is perpendicular to or substantially perpendicular to a relevant surface of the display panel 100). For example, "right side" refers to one side in the first direction DR1, "left side" refers to the other side (e.g., an opposite side) in the first direction DR1, "upper side" refers to one side in the second direction DR2, and "lower side" refers to the other side (e.g., an opposite side) in the second direction DR2. In addition, "upper portion" refers to one side in the third direction DR3, and "lower portion" refers to the other side (e.g., an opposite side) in the third direction DR3.

Referring to FIGS. 1 to 3, a display device 10 according to an embodiment includes a display panel 100 including a display area DA and a non-display area NDA.

The display panel 100 may have a rectangular shape (e.g., in a plan view), having long sides extending in the first direction DR1 and short sides extending in the second direction DR2. However, the shape of the display panel 100 in the plan view is not limited thereto, and the display panel 100 may have various suitable shapes in the plan view other than the rectangular shape, for example, such as a polygonal shape, a circular shape, an elliptical shape, or an irregular shape.

The display area DA may be an area at (e.g., in or on) which an image is displayed, and the non-display area NDA may be an area at (e.g., in or on) which an image is not displayed. A shape of the display area DA in a plan view may follow the shape of the display panel 100 in a plan view. For example, as shown in FIG. 1, the shape of the display area DA in a plan view may be a rectangular shape. The display area DA may be disposed at (e.g., in or on) a central area of the display panel 100. The non-display area NDA may be disposed around the display area DA. For example, the non-display area NDA may be disposed to surround (e.g., around a periphery of) the display area DA.

The display area DA of the display panel 100 may include a plurality of pixels PX. A pixel PX may be defined as a minimum light emitting unit capable of displaying white light.

Each of the plurality of pixels PX may include a plurality of emission areas EA1, EA2, and EA3 for emitting light. While it is shown that each of the plurality of pixels PX includes three emission areas EA1, EA2, and EA3 according to an embodiment of the present disclosure, the present disclosure is not limited thereto. For example, each of the plurality of pixels PX may include four emission areas.

Each of the plurality of emission areas EA1, EA2, and EA3 may include a light emitting element LE for emitting first light. While it is shown that the light emitting element LE has a rectangular shape in a plan view, the present disclosure is not limited thereto. For example, the light emitting element LE may have any suitable shape in a plan view other than the rectangular shape, for example, such as a polygonal shape, a circular shape, an elliptical shape, or an irregular shape.

Each of the first emission areas EA1 refers to an area for emitting the first light. Each of the first emission areas EA1 may emit the first light emitted from a corresponding light emitting element LE as is. The first light may be light of a blue wavelength band. The blue wavelength band may be approximately 370 nm to 460 nm, but the present disclosure is not limited thereto.

Each of the second emission areas EA2 refers to an area for emitting second light. Each of the second emission areas EA2 may convert the first light emitted from a corresponding light emitting element LE into the second light, and may emit the second light. The second light may be light of a green wavelength band. The green wavelength band may be approximately 480 nm to 560 nm, but the present disclosure is not limited thereto.

Each of the third emission areas EA3 refers to an area for emitting third light. Each of the third emission areas EA3 may convert the first light emitted from a corresponding light emitting element LE into the third light, and may emit the third light. The third light may be light of a red wavelength band. The red wavelength band may be approximately 600 nm to 750 nm, but the present disclosure is not limited thereto.

The first emission areas EA1, the second emission areas EA2, and the third emission areas EA3 may be alternately arranged along the first direction DR1. For example, the first emission areas EA1, the second emission areas EA2, and the third emission areas EA3 may be sequentially disposed in a repeating order of the first emission area EA1, the second emission area EA2, and the third emission area EA3 along the first direction DR1.

The first emission areas EA1 may be arranged along the second direction DR2. The second emission areas EA2 may be arranged along the second direction DR2. The third emission areas EA3 may be arranged along the second direction DR2.

The plurality of emission areas EA1, EA2, and EA3 may be partitioned by a partition wall PW. The partition wall PW may be disposed to surround (e.g., around a periphery of) the light emitting element LE. The partition wall PW may be disposed to be spaced apart from the light emitting element LE. The partition wall PW may have a mesh shape, a net shape, or a lattice shape in a plan view.

While FIGS. 2 and 3 show that each of the plurality of emission areas EA1, EA2, and EA3 defined by the partition wall PW has a rectangular shape in a plan view, the present disclosure is not limited thereto. For example, each of the plurality of emission areas EA1, EA2, and EA3 defined by the partition wall PW may have any suitable shape in a plan view other than the rectangular shape, for example, such as a polygonal shape, a circular shape, an elliptical shape, or an irregular shape.

The non-display area NDA may include a first pad part PDA1 and a second pad part PDA2.

The first pad part PDA1 may be disposed at (e.g., in or on) the non-display area NDA. The first pad part PDA1 may be disposed at (e.g., in or on) an upper side of the display panel 100. The first pad part PDA1 may include first pads PD1 connected to an external circuit board CB (e.g., see FIG. 4).

The second pad part PDA2 may be disposed at (e.g., in or on) the non-display area NDA. The second pad part PDA2 may be disposed at (e.g., in or on) a lower side of a semiconductor circuit substrate. The second pad part PDA2 may include second pads to be connected to the external circuit board CB (e.g., see FIG. 4). However, the present disclosure is not limited thereto, and the second pad part PDA2 may be omitted as needed or desired.

In addition, the non-display area NDA may further include a common electrode connection part CPA surrounding (e.g., around a periphery of) the display area DA.

The common electrode connection part CPA may be disposed at (e.g., in or on) the non-display area NDA. The common electrode connection part CPA may be disposed between the first pad part PDA1 and the display area DA, and between the second pad part PDA2 and the display area DA. In addition, the common electrode connection part CPA may be disposed at (e.g., in or on) one side and the other side (e.g., the opposite side) of the display area DA in the first direction DR1, and may be disposed at (e.g., in or on) one side and the other side (e.g., the opposite side) of the display area DA in the second direction DR2. The common electrode connection part CPA may include a plurality of connection electrodes CCP to be connected to the semiconductor circuit substrate.

While FIG. 1 shows that the common electrode connection part CPA completely surrounds (e.g., around a periphery of) the display area DA, the present disclosure is not limited thereto. For example, the common electrode connection part CPA may partially surround (e.g., around a periphery of) the display area DA, such that the common electrode connection part CPA may be disposed at (e.g., in or on) one side, two sides, or at least three sides of the display area DA.

Figure 4:
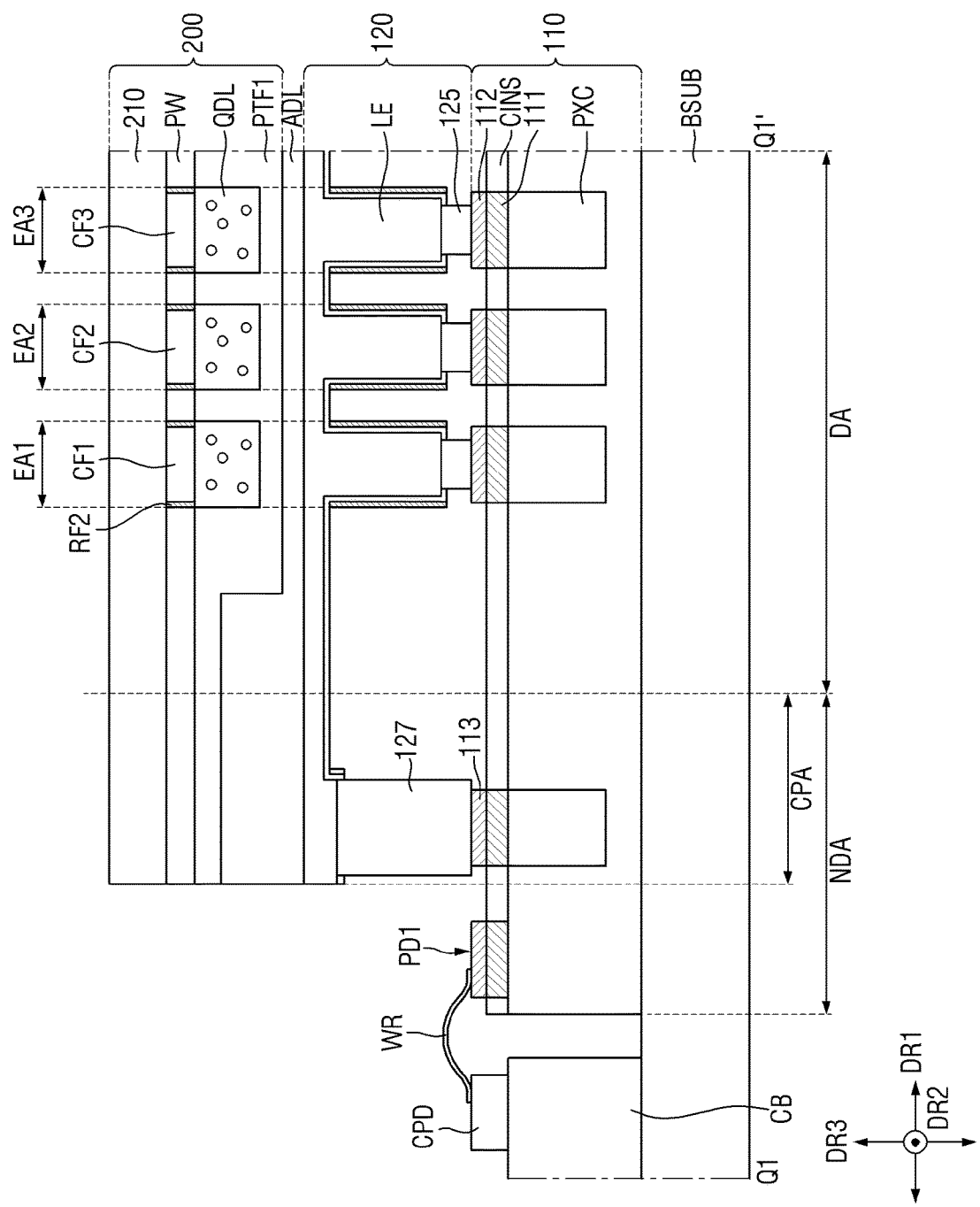
FIG. 4 is a cross-sectional view illustrating an example of the display panel taken along the line Q1-Q1' of FIG. 2.
Figure 5:
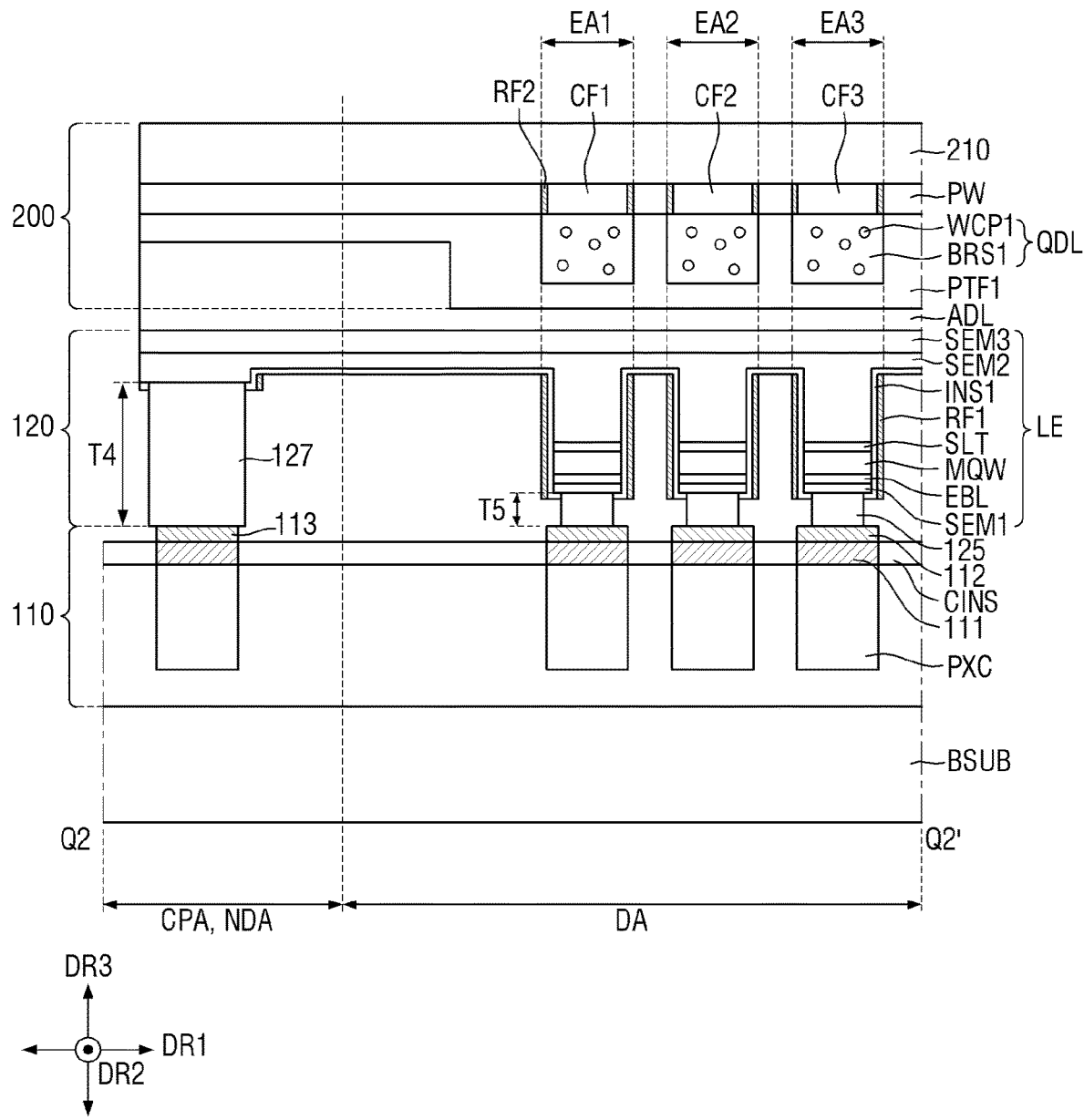
FIG. 5 is a cross-sectional view illustrating an example of the display panel taken along the line Q2-Q2' of FIG. 2.
Figure 6:
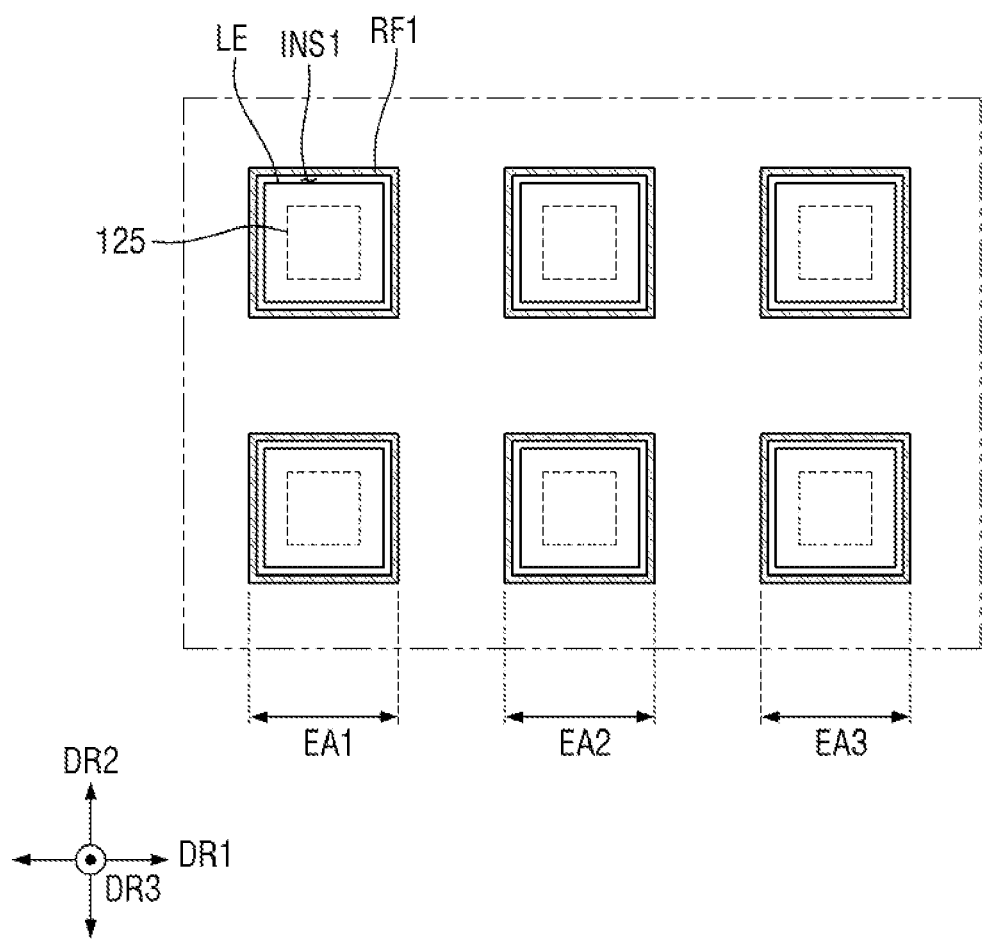
FIG. 6 is a plan view illustrating an example of a wavelength conversion substrate of the display panel according to an embodiment.
Figure 7:
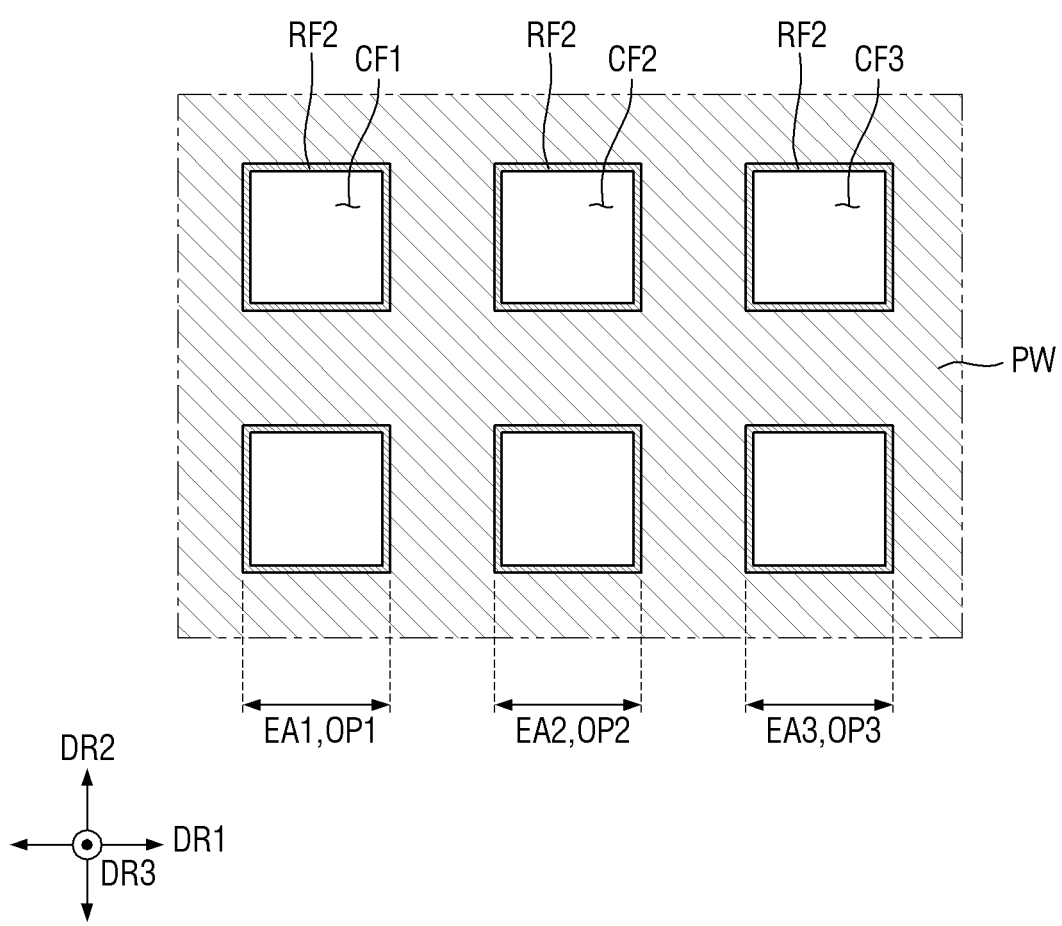
FIG. 7 is a plan view illustrating an example of a light emitting element layer of the display panel according to an embodiment.
Figure 8:
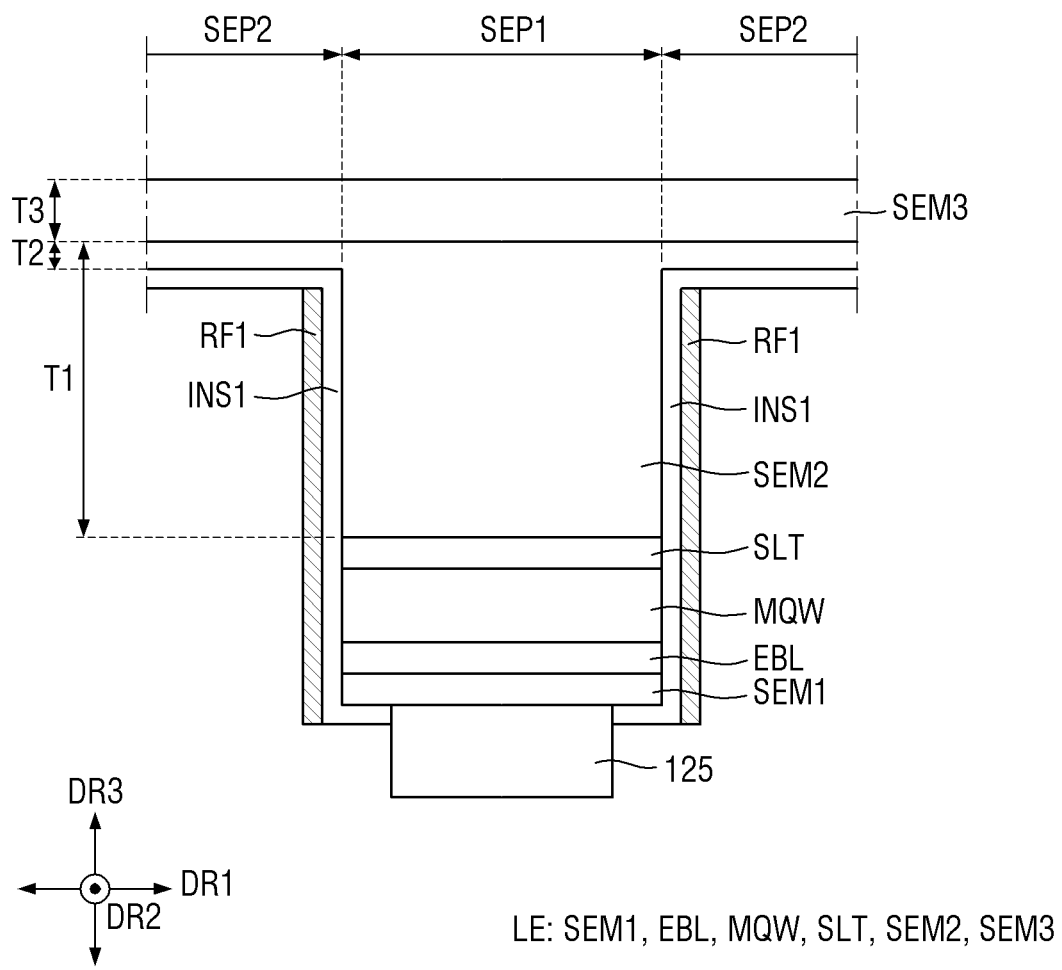
FIG. 8 is a cross-sectional view illustrating an example of a light emitting element of the display panel according to an embodiment.

FIG. 4 is a cross-sectional view illustrating an example of the display panel taken along the line Q1-Q1' of FIG. 2. FIG. 5 is a cross-sectional view illustrating an example of the display panel taken along the line Q2-Q2' of FIG. 2. FIG. 6 is a plan view illustrating an example of a wavelength conversion substrate of the display panel according to an embodiment. FIG. 7 is a plan view illustrating an example of a light emitting element layer of the display panel according to an embodiment. FIG. 8 is a cross-sectional view illustrating an example of a light emitting element of the display panel according to an embodiment.

Referring to FIGS. 4 to 8, the display panel 100 according to an embodiment may include a semiconductor circuit substrate 110, a light emitting element layer 120, and a wavelength conversion substrate 200.

The semiconductor circuit substrate 110 may include a plurality of pixel circuit parts PXC, pixel electrodes 111, contact electrodes 112, first pads PD1, a common contact electrode 113, and a circuit insulating layer CINS.

The semiconductor circuit substrate 110 may be a silicon wafer substrate formed using a semiconductor process, and may be referred to as a first substrate. The plurality of pixel circuit parts PXC of the semiconductor circuit substrate 110 may be formed using a semiconductor process.

The plurality of pixel circuit parts PXC may be disposed at (e.g., in or on) the display area DA and the non-display area NDA. Each of the plurality of pixel circuit parts PXC may be connected to a corresponding pixel electrode 111. In other words, the plurality of pixel circuit parts PXC and a plurality of pixel electrodes 111 may be connected to each other so as to correspond to each other in a one-to-one manner. Each of the plurality of pixel circuit parts PXC may overlap with a corresponding light emitting element LE in the third direction DR3.

Each of the plurality of pixel circuit parts PXC may include at least one transistor formed by a semiconductor process. In addition, each of the plurality of pixel circuit parts PXC may further include at least one capacitor formed by a semiconductor process. The plurality of pixel circuit parts PXC may include, for example, complementary metal oxide semiconductor (CMOS) circuits. Each of the plurality of pixel circuit parts PXC may apply a pixel voltage or an anode voltage to the corresponding pixel electrode 111.

The circuit insulating layer CINS may be disposed on the plurality of pixel circuit parts PXC. The circuit insulating layer CINS may protect the plurality of pixel circuit parts PXC, and may planarize or substantially planarize a step of the plurality of pixel circuit parts PXC. The circuit insulating layer CINS may expose each of the pixel electrodes 111 so that the pixel electrodes 111 may be connected to the light emitting element layer 120. The circuit insulating layer CINS may include an inorganic insulating material, for example, such as silicon oxide (SiOx), silicon nitride (SiNx), silicon oxynitride (SiOxNy), aluminum oxide (AlxOy), or aluminum nitride (AlN).

The plurality of pixel electrodes 111 may be disposed on the pixel circuit parts PXC corresponding thereto. Each of the pixel electrodes 111 may be an exposed electrode that is exposed from the pixel circuit parts PXC. Each of the pixel electrodes 111 may be formed integrally with the corresponding pixel circuit part PXC. Each of the pixel electrodes 111 may receive the pixel voltage or the anode voltage supplied from the corresponding pixel circuit part PXC. The pixel electrodes 111 may include a metal material, for example, such as aluminum (Al).

The contact electrodes 112 may be disposed on the pixel electrodes 111 corresponding thereto. The contact electrodes 112 may include a metal material for adhering the pixel electrodes 111 to the light emitting elements LE. For example, the contact electrodes 112 may include at least one of gold (Au), copper (Cu), aluminum (Al), and tin (Sn). As another example, the contact electrodes 112 may include a first layer including any one of gold (Au), copper (Cu), aluminum (Al), and tin (Sn), and a second layer including another one of gold (Au), copper (Cu), aluminum (Al), and tin (Sn).

The common contact electrode 113 may be disposed at (e.g., in or on) the common electrode connection part CPA of the non-display area NDA. The common contact electrode 113 may be disposed to surround (e.g., around a periphery of) the display area DA. The common contact electrode 113 may be connected to any one of the first pads PD1 of the first pad part PDA1 through a circuit part formed at (e.g., in or on) the non-display area NDA to receive a common voltage. The common contact electrode 113 may include the same material as that of the contact electrodes 112. In other words, the common contact electrode 113 and the contact electrodes 112 may be formed by the same process.

Each of the first pads PD1 may be connected to a corresponding pad electrode CPD of the circuit board CB through a conductive connection member, for example, such as a wire WR corresponding thereto. In other words, the first pads PD1, the wires WR, and the pad electrodes CPD of the circuit board CB may be connected to each other in a one-to-one manner. The semiconductor circuit substrate 110 and the circuit board CB may be disposed on a base substrate BSUB. However, the present disclosure is not limited thereto, and the base substrate BSUB may be omitted as needed or desired.

The circuit board CB may be a flexible film, for example, such as a flexible printed circuit board (FPCB), a printed circuit board (PCB), a flexible printed circuit (FPC), or a chip on film (COF).

The second pads of the second pad part PDA2 may be the same or substantially the same as (e.g., may have the same or substantially the same structure as those of) the first pads PD1 described above with reference to FIGS. 4 and 5, and thus, redundant description thereof may not be repeated.

The light emitting element layer 120 may include light emitting elements LE, first insulating layers INS1, connection electrodes 125, a common connection electrode 127, and first reflective layers RF1.

The light emitting element layer 120 may include the light emitting elements LE corresponding to first emission areas EA1, second emission areas EA2, and third emission areas EA3 partitioned by a partition wall PW of the wavelength conversion substrate 200. The light emitting elements LE may be disposed in each of the first emission areas EA1, the second emission areas EA2, and the third emission areas EA3, so as to correspond to the first emission areas EA1, the second emission areas EA2, and the third emission areas EA3 in a one-to-one manner.

The light emitting elements LE may be disposed on the contact electrode 112 in each of the first emission areas EA1, the second emission areas EA2, and the third emission areas EA3. The light emitting element LE may be a vertical light emitting diode element extending to be elongated in the third direction DR3. In other words, a length of the light emitting element LE in the third direction DR3 may be greater than a length of the light emitting element LE in the horizontal direction. The length in the horizontal direction refers to the length in the first direction DR1 or the length in the second direction DR2. For example, the length of the light emitting element LE in the third direction DR3 may be approximately 1 to 5 μm.

The light emitting element LE may be a micro light emitting diode device element. The light emitting element LE may include the connection electrode 125, a first semiconductor layer SEM1, an electron blocking layer EBL, an active layer MQW, a superlattice layer SLT, a second semiconductor layer SEM2, and a third semiconductor layer SEM3 along the third direction DR3 as illustrated in FIG. 8. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

As illustrated in FIG. 8, the light emitting element LE may have a cylindrical shape, a disk shape, or a rod shape having a width (e.g., in the first direction DR1 and/or the second direction DR2) greater than a height (e.g., in the third direction DR3) thereof. However, the present disclosure is not limited thereto, and the light emitting element LE may have any suitable shape, for example, such a rod shape, a wire shape, a tube shape, a polygonal prism shape, for example, such as a cube shape, a rectangular parallelepiped shape, or a hexagonal prism shape, a shape extending in one direction and having outer surfaces partially inclined, an irregular shape, or the like.

The connection electrode 125 may be disposed on the contact electrode 112. The connection electrode 125 may be adhered to the contact electrode 112 to apply a light emitting signal to the light emitting element LE. The connection electrode 125 may be an ohmic connection electrode. However, the present disclosure is not limited thereto, and the connection electrode 125 may be a Schottky connection electrode. The light emitting element LE may include at least one connection electrode 125. While FIG. 8 shows that the light emitting element LE includes one connection electrode 125, the present disclosure is not limited thereto. For example, in other embodiments, the light emitting element LE may include a larger number of connection electrodes 125, or the connection electrode 125 may be omitted as needed or desired. Accordingly, a light emitting element LE described in more detail below may be the same or substantially the same as the light emitting element LE described above, even though the number of the connection electrodes 125 may be variously modified, or the light emitting element LE may include a different structure, and thus, redundant description thereof may not be repeated.

The connection electrode 125 may decrease a resistance between the light emitting element LE and the contact electrode 112 when the light emitting element LE is electrically connected to the contact electrode 112 in the display device 10 according to an embodiment. The connection electrode 125 may include a conductive metal. For example, the connection electrode 125 may include at least one of gold (Au), copper (Cu), tin (Sn), titanium (Ti), aluminum (Al), or silver (Ag). For example, the connection electrode 125 may include an alloy of gold and tin in a ratio of about 9:1, 8:2, or 7:3, or an alloy (e.g., SAC305) of copper, silver, and tin.

The first semiconductor layer SEM1 may be disposed on the connection electrode 125. The first semiconductor layer SEM1 may be a p-type semiconductor, and may include a semiconductor material having a chemical formula of: $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with a p-type dopant. The first semiconductor layer SEM1 may be doped with a p-type dopant, which may be Mg, Zn, Ca, Se, Ba, or the like. For example, the first semiconductor layer SEM1 may include (e.g., may be made of) p-GaN doped with p-type Mg. A thickness of the first semiconductor layer SEM1 may be in a range of about 30 nm to 200 nm, but the present disclosure is not limited thereto.

The electron blocking layer EBL may be disposed on the first semiconductor layer SEM1. The electron blocking layer EBL may be a layer for suppressing or preventing excessively many electrons from flowing into the active layer MQW. For example, the electron blocking layer EBL may include (e.g., may be made of) p-AlGaN doped with p-type Mg. A thickness of the electron blocking layer EBL may be in a range of about 10 nm to 50 nm, but the present disclosure is not limited thereto. In some embodiments, the electron blocking layer EBL may be omitted as needed or desired.

The active layer MQW may be disposed on the electron blocking layer EBL. The active layer MQW may emit light by a combination of electron-hole pairs according to an electrical signal applied through the first semiconductor layer SEM1 and the second semiconductor layer SEM2. The active layer MQW may emit first light having a central wavelength band in a range of about 450 nm to 495 nm, or in other words, light of a blue wavelength band.

The active layer MQW may include a suitable material having a single quantum well structure or a multiple quantum well structure. When the active layer MQW includes a material having the multiple quantum well structure, the active layer MQW may have a structure in which a plurality of well layers and barrier layers are alternately stacked. In this case, the well layer may include (e.g., may be made of) InGaN, and the barrier layer may include (e.g., may be made of) GaN or AlGaN, but the present disclosure is not limited thereto. A thickness of the well layer may be approximately 1 nm to 4 nm, and a thickness of the barrier layer may be about 3 nm to 10 nm, but the present disclosure is not limited thereto.

In another embodiment, the active layer MQW may have a structure in which semiconductor materials having large band gap energy and semiconductor materials having small band gap energy are alternately stacked, and may include other Group III to Group V semiconductor materials depending on a wavelength band of the emitted light therefrom. The light emitted by the active layer MQW is not limited to the first light, and in some embodiments, the active layer MQW may emit second light (e.g., light of a green wavelength band) or third light (e.g., light of a red wavelength band).

The superlattice layer SLT may be disposed on the active layer MQW. The superlattice layer SLT may be a layer for relaxing a stress between the second semiconductor layer SEM2 and the active layer MQW. For example, the superlattice layer SLT may include (e.g., may be made of) InGaN or GaN. A thickness of the superlattice layer SLT may be approximately 50 nm to 200 nm. However, the present disclosure is not limited thereto, and the superlattice layer SLT may be omitted as needed or desired.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of: $Al_xGa_yIn_{1-x-y}N$ ($0 \le x \le 1$, $0 \le y \le 1$, and $0 \le x+y \le 1$). For example, the semiconductor material may be one or more of AlGaInN, GaN, AlGaN, InGaN, AlN, and InN doped with an n-type dopant. The second semiconductor layer SEM2 may be doped with an n-type dopant, which may be Si, Ge, Sn, or the like. For example, the second semiconductor layer SEM2 may include (e.g., may be made of) n-GaN doped with n-type Si. A thickness of the second semiconductor layer SEM2 may be in a range of about 2 μm to 4 μm, but the present disclosure is not limited thereto.

As illustrated in FIG. 5, the second semiconductor layer SEM2 may be a common layer that is commonly connected to and disposed in a plurality of light emitting elements LE. At least some portions of the second semiconductor layer SEM2 extending in the third direction DR3 may be disposed in respective light emitting elements LE to be formed in a patterned shape, and other portions of the second semiconductor layer SEM2 may continuously extend in the first direction DR1 to be commonly disposed at (e.g., in or on) the plurality of light emitting elements LE. The second semiconductor layer SEM2 may allow the common voltage applied through the common contact electrode 113 to be commonly applied to the plurality of light emitting elements LE.

A third semiconductor layer SEM3, which will be described in more detail below, may be disposed as a common layer together with the second semiconductor layer SEM2, but the third semiconductor layer SEM3 may not have conductivity, and thus, a signal may be applied through the second semiconductor layer SEM2 having conductivity. The second semiconductor layer SEM2 and the third semiconductor layer SEM3 may be disposed to extend from the display area DA to the non-display area NDA. In the second semiconductor layer SEM2, a thickness T1 of an area that overlaps with the first semiconductor layer SEM1 of the light emitting element LE may be greater than a thickness T2 of an area that does not overlap with the first semiconductor layer SEM1.

The third semiconductor layer SEM3 may be disposed on the second semiconductor layer SEM2. The third semiconductor layer SEM3 may be an undoped semiconductor. The third semiconductor layer SEM3 may include a suitable material that is the same or substantially the same as that of the second semiconductor SEM2, but may not be doped with an n-type or a p-type dopant. In an embodiment, the third semiconductor layer SEM3 may include (e.g., may be made of) at least one of undoped InAlGaN, GaN, AlGaN, InGaN, AlN, or InN, but the present disclosure is not limited thereto.

The third semiconductor layer SEM3 may be a common layer that is commonly connected to the plurality of light emitting elements LE. The third semiconductor layer SEM3 may continuously extend in the first direction DR1 to be commonly disposed in the plurality of light emitting elements LE. The third semiconductor layer SEM3 may act as a base layer of the plurality of light emitting elements LE. In a process of manufacturing a light emitting element layer described in more detail below, layers constituting the light emitting elements LE may be manufactured (e.g., may be formed or disposed) on the third semiconductor layer SEM3, such that the third semiconductor layer SEM3 may act as the base layer. A thickness T3 of the third semiconductor layer SEM3 may be smaller than a thickness T1 of a first semiconductor area SEP1 of the second semiconductor layer SEM2, and greater than a thickness T2 of a second semiconductor area SEP2 of the second semiconductor layer SEM2.

The common connection electrode 127 may be disposed at (e.g., in or on) the common electrode connection part CPA of the non-display area NDA. The common connection electrode 127 may be disposed on one surface of the second semiconductor layer SEM2. The common connection electrode 127 may serve to transfer a common voltage signal of the light emitting elements LE from the common contact electrode 113. The common connection electrode 127 may include (e.g., may be made of) the same or substantially the same material as that of the connection electrodes 125. The common connection electrode 127 may have a relatively large thickness T4 in the third direction DR3 in order to be connected to the common contact electrode 113. In other words, the thickness T4 of the common connection electrode 127 may be greater than a thickness T5 of the connection electrode 125.

The above-described light emitting elements LE may receive the pixel voltages or the anode voltages of the pixel electrodes 111 supplied through the connection electrodes 125, and may receive the common voltage supplied through the second semiconductor layer SEM2. The light emitting element LE may emit light having a desired luminance (e.g., a predetermined luminance) according to a voltage difference between the pixel voltage and the common voltage.

The first insulating layers INS1 may be disposed on side surfaces of the common connection electrode 127, side surfaces and an upper surface of the second semiconductor layer SEM2, side surfaces of each of the light emitting elements LE, and side surfaces of the connection electrodes 125. The first insulating layers INS1 may insulate the common connection electrode 127, the second semiconductor layer SEM2, the light emitting elements LE, and the connection electrodes 125 from other layers.

As illustrated in FIG. 6, the first insulating layers INS1 may be disposed to surround (e.g., around peripheries of) the light emitting elements LE. The first insulating layer INS1 may include an inorganic insulating material, for example, such as silicon oxide (SiOx), silicon nitride (SiNx), silicon oxynitride (SiOxNy), aluminum oxide (AlxOy), or aluminum nitride (AlN). A thickness of the first insulating layer INS1 may be approximately 0.1 μm, but the present disclosure is not limited thereto.

The first reflective layers RF1 may serve to reflect light emitted from the light emitting element LE traveling toward left and right side surfaces rather than in an upward direction. The first reflective layers RF1 may be disposed at (e.g., in or on) the display area DA and the non-display area NDA. The first reflective layers RF1 may be disposed to overlap with the first emission area EA1, the second emission area EA2, and the third emission area EA3 at (e.g., in or on) the display area DA.

The first reflective layers RF1 may be disposed on the side surfaces of the common connection electrode 127, the side surfaces of the connection electrodes 125, and the side surfaces of each of the light emitting elements LE. The first reflective layers RF1 may be disposed directly on the first insulating layers INS1, and may be disposed on side surfaces of the first insulating layers INS1. The first reflective layers RF1 may be disposed to be spaced apart from the common connection electrode 127, the connection electrodes 125, and the light emitting elements LE.

As illustrated in FIG. 6, the first reflective layers RF1 may be disposed to surround (e.g., around peripheries of) the light emitting elements LE at (e.g., in or on) the display area DA. The light emitting elements LE may be surrounded (e.g., around peripheries thereof) by the first insulating layers INS1, and the first insulating layers INS1 may be surrounded (e.g., around peripheries thereof) by the first reflective layers RF1. The first reflective layers RF1 may be disposed to be spaced apart from each other, and may be disposed to be spaced apart from the first reflective layers RF1 of adjacent light emitting elements LE. In other words, the first reflective layers RF1 may be disposed to be spaced apart from each other in the first direction DR1 and the second direction DR2. While the figures show that the first reflective layer RF1 and the first insulating layer INS1 have a rectangular closed loop shape in a plan view, the present disclosure is not limited thereto, and the first reflective layer RF1 and the first insulating layer INS1 may have various suitable shapes according to a shape of the light emitting element LE in the plan view.

The first reflective layer RF1 may include a metal material having high reflectivity, for example, such as aluminum (Al). A thickness of the first reflective layer RF1 may be approximately 0.1 μm, but the present disclosure is not limited thereto.

The wavelength conversion substrate 200 may be disposed on the light emitting element layer 120. The wavelength conversion substrate 200 may include an upper substrate 210, a partition wall PW, color filters CF1, CF2, and CF3, second reflective layers RF2, wavelength conversion layers QDL, and a first passivation layer PTF1.

The upper substrate 210 may be a second substrate facing the semiconductor circuit substrate 110, which is the first substrate. The upper substrate 210 may be a base substrate disposed at an uppermost portion of the wavelength conversion substrate 200, and may support the wavelength conversion substrate 200. The upper substrate 210 may face the semiconductor circuit substrate 110. The upper substrate 210 may include a transparent substrate, for example, such as a sapphire ($Al_2O_3$) substrate or a glass substrate. However, the present disclosure is not limited thereto, and the upper substrate 210 may be formed as a conductive substrate including (e.g., made of) GaN, SiC, ZnO, Si, GaP, GaAs, and/or the like. Hereinafter, for convenience, a case where the upper substrate 210 is a sapphire ($Al_2O_3$) substrate will be described by way of example, but the present disclosure is not limited thereto. A thickness of the upper substrate 210 is not particularly limited, but in some embodiments, the upper substrate 210 may have a thickness in a range of about 400 μm to 1500 μm as an example.

The partition wall PW may be disposed on one surface of the upper substrate 210. As illustrated in FIGS. 5 and 7, the partition wall PW may partition and define the first emission area EA1, the second emission area EA2, and the third emission area EA3. The partition wall PW may be disposed to extend in the first direction DR1 and the second direction DR2, and may be formed in a lattice pattern throughout the display area DA. In addition, the partition wall PW may extend from the display area DA to the non-display area NDA, and be disposed throughout the non-display area NDA.

The partition wall PW may include a plurality of openings OP1, OP2, and OP3 exposing the upper substrate 210 at (e.g., in or on) the display area DA. The plurality of openings OP1, OP2, and OP3 may include a first opening OP1 overlapping with the first emission area EA1, a second opening OP2 overlapping with the second emission area EA2, and a third opening OP3 overlapping with the third emission area EA3. Here, the plurality of openings OP1, OP2, and OP3 may correspond to the plurality of emission areas EA1, EA2, and EA3. In other words, the first opening OP1 may correspond to the first emission area EA1, the second opening OP2 may correspond to the second emission area EA2, and the third opening OP3 may corresponds to the third emission area EA3. On the other hand, the partition wall PW may not have a plurality of openings at (e.g., in or on) the non-display area NDA, and may be formed as a flat or substantially flat film.

The partition wall PW may partition the emission areas EA1, EA2, and EA3, and may serve to provide spaces in which the color filters CF1, CF2, and CF3 described in more detail below are to be formed. Thus, the partition wall PW may be formed to have a suitable thickness (e.g., a predetermined thickness), for example, such as a thickness in a range of about 1 µm to 10 µm.

The partition wall PW may include silicon (Si). For example, the partition wall PW may include a silicon single crystal layer. The partition wall PW including silicon may be etched to have a high aspect ratio using a deep reactive ion etching (DRIE) method. As a result, the partition wall PW having the high aspect ratio may be easily manufactured. Accordingly, the partition wall PW may form the emission areas EA1, EA2, and EA3 having ultra-high resolution, and thus, the display device 10 having ultra-high resolution may be manufactured.

The plurality of color filters CF1, CF2, and CF3 may be disposed in the plurality of openings OP1, OP2, and OP3 defined by the partition wall PW. The plurality of color filters CF1, CF2, and CF3 may include a first color filter CF1, a second color filter CF2, and a third color filter CF3.

The first color filter CF1 may be disposed to overlap with the first emission area EA1. In addition, the first color filter CF1 may be disposed in the first opening OP1 of the partition wall PW to fill the first opening OP1. The first color filter CF1 may transmit the first light emitted from the light emitting element LE, and may absorb or block the second light and the third light. For example, the first color filter CF1 may transmit light of a blue wavelength band, and may absorb or block light of other wavelength bands, such as the green and red wavelength bands.

The second color filter CF2 may be disposed to overlap with the second emission area EA2. In addition, the second color filter CF2 may be disposed in the second opening OP2 of the partition wall PW to fill the second opening OP2. The second color filter CF2 may transmit the second light, and may absorb or block the first light and the third light. For example, the second color filter CF2 may transmit light of a green wavelength band, and may absorb or block light of other wavelength bands, such as the blue and red wavelength bands.

The third color filter CF3 may be disposed to overlap with the third emission area EA3. In addition, the third color filter CF3 may be disposed in the third opening OP3 of the partition wall PW to fill the third opening OP3. The third color filter CF3 may transmit the third light, and may absorb or block the first light and the second light. For example, the third color filter CF3 may transmit light of a red wavelength band, and may absorb or block light of other wavelength bands, such as the blue and green wavelength bands.

Upper surfaces of the plurality of color filters CF1, CF2, and CF3 may coincide (e.g., may be coplanar) with an upper surface of the partition wall PW. The first color filter CF1 may fill the first opening OP1, and an upper surface of the first color filter CF1 may coincide (e.g., may be coplanar) with the upper surface of the partition wall PW. The second color filter CF2 may fill the second opening OP2, and an upper surface of the second color filter CF2 may coincide (e.g., may be coplanar) with the upper surface of the partition wall PW and the upper surface of the first color filter CF1. The third color filter CF3 may fill the third opening OP3, and an upper surface of the third color filter CF3 may coincide (e.g., may be coplanar) with the upper surface of the partition wall PW, the upper surface of the first color filter CF1, and the upper surface of the second color filter CF2. However, the present disclosure is not limited thereto, and an upper surface of at least one of the color filters may be higher than upper surfaces of the other color filters and/or higher than the upper surface of the partition wall PW.

The second reflective layers RF2 may be disposed in the plurality of openings OP1, OP2, and OP3 of the partition wall PW. The second reflective layers RF2 may be disposed on side surfaces of the partition wall PW, respectively. The side surfaces of the partition wall PW may include side surfaces of each of the plurality of openings OP1, OP2, and OP3 formed in the partition wall PW. The second reflective layers RF2 serve to reflect light emitted from the light emitting element LE traveling toward left and right side surfaces rather than in an upward direction. The second reflective layers RF2 may be disposed at (e.g., in or on) the display area DA, and may be disposed to overlap with the first emission area EA1, the second emission area EA2, and the third emission area EA3.

As illustrated in FIG. 7, the second reflective layers RF2 may be disposed to surround (e.g., around peripheries of) the plurality of color filters CF1, CF2, and CF3 at (e.g., in or on) the display area DA. The second reflective layers RF2 may be disposed to be spaced apart from each other, and may be disposed to be spaced apart from the second reflective layers RF2 of adjacent color filters. In other words, the second reflective layers RF2 may be disposed to be spaced apart from each other in the first direction DR1 and the second direction DR2. While the drawings show that the second reflective layer RF2 has a rectangular closed loop shape in a plan view, the present disclosure is not limited thereto, and the second reflective layer RF2 may have various suitable shapes according to a shape of the openings OP1, OP2, and OP3 of the partition wall PW in the plan view.

The second reflective layer RF2 may include the same or substantially the same material as that of the above-described first reflective layer RF1, and may include, for example, a metal material having high reflectivity, such as aluminum (Al). A thickness of the second reflective layer RF2 may be approximately 0.1 µm, but the present disclosure is not limited thereto.

The wavelength conversion layers QDL may be disposed on the plurality of color filters CF1, CF2, and CF3. The wavelength conversion layers QDL may convert or shift a peak wavelength of incident light to light having another specific peak wavelength, and may emit the light having the other specific peak wavelength. The wavelength conversion layer QDL may convert a portion of the first light of the blue wavelength band emitted from the light emitting element LE into fourth light having a yellowish color. The wavelength conversion layer QDL may mix the first light with the fourth light to emit fifth light of white light. The fifth light may be converted into the first light through the first color filter CF1, may be converted into the second light through the second color filter CF2, and may be converted into the third light through the third color filter CF3.

The wavelength conversion layers QDL may be disposed to overlap with each of the first color filter CF1, the second color filter CF2, and the third color filter CF3, and may be disposed to be spaced apart from each other. The wavelength conversion layers QDL may be formed as island patterns that are spaced apart from each other. The wavelength conversion layers QDL may correspond to the plurality of openings OP1, OP2, and OP3 disposed in the partition wall PW in a one-to-one manner, and may overlap with the plurality of openings OP1, OP2, and OP3, respectively. In an embodiment, the wavelength conversion layers QDL may completely overlap with the plurality of openings OP1, OP2, and OP3, respectively.

The wavelength conversion layer QDL may include a first base resin BRS1 and first wavelength conversion particles WCP1. The first base resin BRS1 may include a light-transmitting organic material. For example, the first base resin BRS1 may include an epoxy-based resin, an acrylic resin, a cardo-based resin, an imide-based resin, or the like.

The first wavelength conversion particles WCP1 may convert the first light incident from the light emitting element LE into the fourth light. For example, the first wavelength conversion particles WCP1 may convert light of a blue wavelength band into light of a yellow wavelength band. The first wavelength conversion particle WCP1 may be a quantum dot (QD), a quantum rod, a fluorescent material, or a phosphorescent material. For example, the quantum dot may be particulate matter for emitting a specific color while electrons are transitioning from a conduction band to a valence band.

The quantum dot may be a semiconductor nanocrystal material. The quantum dot may have a specific bandgap according to its composition and size to absorb light, and then may emit light having a unique wavelength. Examples of semiconductor nanocrystals of the quantum dot may include group IV nanocrystals, group II-VI compound nanocrystals, group III-V compound nanocrystals, group IV-VI compound nanocrystals, or combinations thereof.

A group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof; a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A group III-V compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPS, and mixtures thereof.

A group IV-VI compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. A group IV element may be selected from the group consisting of Si, Ge, and mixtures thereof. A group IV compound may be a binary compound selected from the group consisting of SiC, SiGe, and mixtures thereof.

In this case, the binary compound, the ternary compound, or the quaternary compound may be present in a particle at a uniform or substantially uniform concentration, or may be present in the same particle in a state of partially different concentration distributions. In addition, the quantum dot may have a core/shell structure in which one quantum dot may surround (e.g., around a periphery of) another quantum dot. An interface between a core and a shell may have a concentration gradient, so that a concentration of an element present in the shell decreases toward the center.

In an embodiment, the quantum dot may have a core-shell structure including a core including a suitable one or more of the above-described nanocrystals, and a shell surrounding (e.g., around a periphery of) the core. The shell of the quantum dot may serve as a passivation layer for maintaining or substantially maintaining semiconductor characteristics by preventing or substantially preventing chemical modification of the core, and/or may serve as a charging layer for imparting electrophoretic characteristics to the quantum dot. The shell may be a single layer or multilayers. Examples of the shell of the quantum dot may include a metal or non-metal oxide, a semiconductor compound, or a combination thereof.

Examples of the metal or non-metal oxide may include a binary compound, for example, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound, for example, such as $MgAl_2O_4$, $CoFe_2O_4$, $NiFe_2O_4$, or $CoMn_2O_4$, but the present disclosure is not limited thereto.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The wavelength conversion layer QDL may further include scatterers for scattering the light of the light emitting element LE in a random direction. The scatterer may have a refractive index that is different from that of the first base resin BRS1, and may form an optical interface with the first base resin BRS1. For example, the scatterer may be a light scattering particle. The scatterer is not particularly limited, as long as the scatter includes (e.g., is made of) a suitable material capable of scattering at least a portion of transmitted light, for example, such as a metal oxide particle or an organic particle. Examples of the metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like. Examples of a material of the organic particle may include an acrylic resin, a urethane resin, or the like. The scatterer may scatter incident light in a random direction regardless of an incident direction of the incident light, without converting or substantially converting a wavelength of the incident light.

As a thickness of the wavelength conversion layer QDL in the third direction DR3 increases, a content of the first wavelength conversion particles WCP1 included in the wavelength conversion layer QDL increases, and thus, light conversion efficiency of the wavelength conversion layer QDL may increase. Therefore, the thickness of the wavelength conversion layer QDL may be determined (e.g., may be set) in consideration of a desired or suitable light conversion efficiency of the wavelength conversion layer QDL.

In the above-described wavelength conversion substrate 200, a portion of the first light emitted from the light emitting element LE may be converted into the fourth light by the wavelength conversion layer QDL. The wavelength conversion layer QDL may mix the first light with the fourth light to emit the fifth light of the white light. A component (e.g., only a component) of the first light in the fifth light, which is the white light emitted from the wavelength conversion layer QDL, may be transmitted through the first color filter CF1, a component (e.g., only a component) of the second light in the fifth light may be transmitted through the second color filter CF2, and a component (e.g., only a component) of the third light in the fifth light may be transmitted through the third color filter CF3. Accordingly, the light emitted from the wavelength conversion substrate 200 may be blue light, red light, and green light of the first light, the second light, and the third light, through which a full color may be realized.

The first passivation layer PTF1 may be disposed on the partition wall PW and the wavelength conversion layers QDL, and may cover the partition wall PW and the wavelength conversion layers QDL. The first passivation layer PTF1 may be disposed throughout the display area DA and the non-display area NDA. The first passivation layer PTF1 may protect the wavelength conversion layers QDL at (e.g., in or on) the display area DA, and may planarize or substantially planarize a step formed due to the wavelength conversion layers QDL. One surface of the first passivation layer PTF1 adjacent to the light emitting elements LE may be flat or substantially flat.

The first passivation layer PTF1 may be disposed between the light emitting element LE and the wavelength conversion layer QDL, and may prevent or substantially prevent the first wavelength conversion particles WCP1 of the wavelength conversion layer QDL from being damaged due to heat generation of the light emitting element LE. A thickness of the first passivation layer PTF1 may be approximately 1 μm to 10 μm at a thickest portion thereof. The first passivation layer PTF1 may include an organic insulating material, for example, such as an epoxy-based resin, an acrylic resin, a cardo-based resin, or an imide-based resin.

An adhesive layer ADL may be disposed between the light emitting element layer 120 and the wavelength conversion substrate 200. The adhesive layer ADL adheres the semiconductor circuit substrate 110 on which the light emitting element layer 120 is formed and the wavelength conversion substrate 200 to each other, and may include a transparent material. The adhesive layer ADL may include, for example, an acryl-based material, a silicon-based material, a urethane-based material, or the like, and may include a UV curable or thermally curable material.

As described above, in the display device 10 according to one or more embodiments, the partition wall PW including silicon may be formed on the upper substrate 210, such that the partition wall PW having ultra-high resolution may be manufactured. Accordingly, the emission areas EA1, EA2, and EA3 having ultra-high resolution may be formed to realize the display device 10 having ultra-high resolution.

Hereinafter, a display device 10 according to one or more other embodiments will be described with reference to the other drawings.

Figure 9:
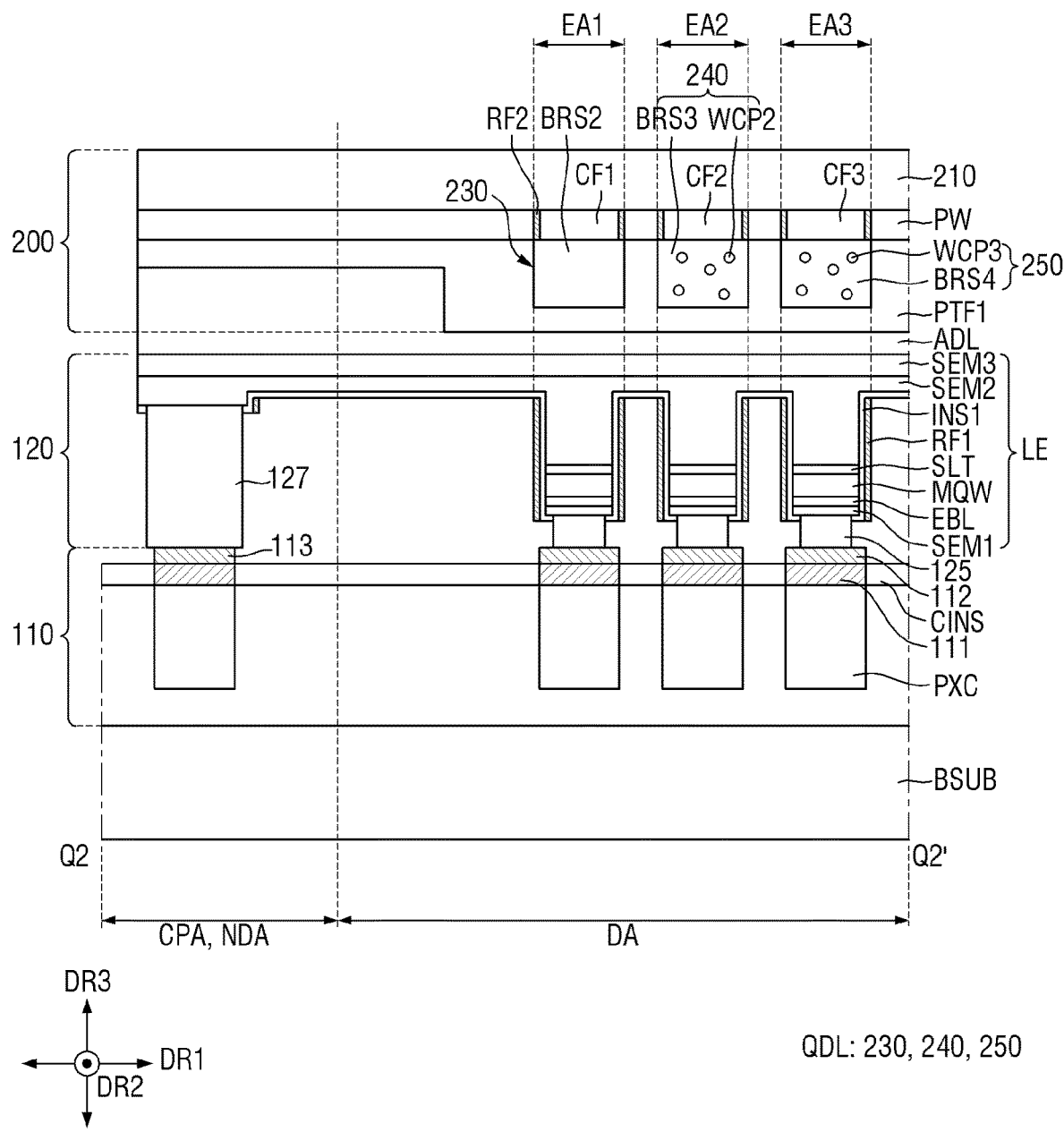
FIG. 9 is a cross-sectional view illustrating a display panel according to another embodiment.

FIG. 9 is a cross-sectional view illustrating a display panel according to another embodiment.

Referring to FIG. 9, a configuration of the wavelength conversion layer QDL of the display device 10 may be variously modified. The present embodiment may be different from the embodiments described above with reference to FIGS. 4 to 8, in that in the present embodiment, the wavelength conversion layers QDL include a light transmission pattern 230, a first wavelength conversion pattern 240, and a second wavelength conversion pattern 250. Hereinafter, redundant description for the same or substantially the same configuration as those described above may be simplified or may not be repeated, and the differences therebetween may be mainly described in more detail.

The wavelength conversion layers QDL may include the light transmission pattern 230, the first wavelength conversion pattern 240, and the second wavelength conversion pattern 250.

The light transmission pattern 230 may be disposed to overlap with the first emission area EA1 and the first color filter CF1. The light transmission pattern 230 may transmit incident light. The first light emitted from the light emitting element LE disposed in the first emission area EA1 may be blue light. The first light, which is the blue light, may be transmitted through the light transmission pattern 230, and be emitted to the first emission area EA1.

In another embodiment, the light transmission pattern 230 may include a second base resin BRS2. The second base resin BRS2 may include (e.g., may be made of) a material having high light transmittance. In another embodiment, the second base resin BRS2 may include (e.g., may be made of) an organic material. The second base resin BRS2 may include the same or substantially the same material as that of the above-described first base resin BRS1. For example, the second base resin BRS2 may include an organic material, such as an epoxy-based resin, an acrylic resin, a cardo-based resin, or an imide-based resin.

The first wavelength conversion pattern 240 may overlap with the second emission area EA2 and the second color filter CF2. The first wavelength conversion pattern 240 may convert or shift a peak wavelength of the incident light to light having another specific peak wavelength, and may emit the light having the other specific peak wavelength. In another embodiment, the first wavelength conversion pattern 240 may convert the first light emitted from the light emitting element LE of the second emission area EA2 into the second light, which is green light having a peak wavelength in the range of approximately 510 nm to 550 nm.

The first wavelength conversion pattern 240 may include a third base resin BRS3, and second wavelength conversion particles WCP2 dispersed in the third base resin BRS3.

The third base resin BRS3 may include (e.g., may be made of) a material having high light transmittance. In another embodiment, the third base resin BRS3 may include (e.g., may be made of) an organic material. The third base resin BRS3 may include (e.g., may be made of) the same or substantially the same material as that of the first base resin BRS1 or the second base resin BRS2, or may include at least one of the materials described above as example materials of the first base resin BRS1 or the second base resin BRS2.

The second wavelength conversion particles WCP2 may convert or shift the peak wavelength of the incident light to another specific peak wavelength. In another embodiment, the second wavelength conversion particles WCP2 may convert the first light, which is the blue light, provided from the light emitting element LE, into green light having a peak wavelength in the range of approximately 510 nm to 550 nm, and may emit the green light.

Examples of the second wavelength conversion particle WCP2 may include a quantum dot, a quantum rod, a phosphor, or the like. A more detailed description for the second wavelength conversion particle WCP2 is the same or substantially the same as (or similar to) the description for the first wavelength conversion particle WCP1 above, and thus, redundant description thereof may not be repeated.

A portion of the first light, which is the blue light, emitted from the light emitting element LE may be transmitted through the first wavelength conversion pattern 240 without being converted into the second light, which is the green light, by the second wavelength conversion particles WCP2. However, the light that is not converted to the green light may be blocked by the second color filter CF2. On the other hand, the green light converted by the first wavelength conversion pattern 240 from the first light emitted from the light emitting element LE is transmitted through the second color filter CF2, and is emitted to the outside.

The second wavelength conversion pattern 250 may overlap with the third emission area EA3 and the third color filter CF3. The second wavelength conversion pattern 250 may convert or shift a peak wavelength of the incident light to light having another specific peak wavelength, and may emit the light having the other specific peak wavelength. In another embodiment, the second wavelength conversion pattern 250 may convert the first light emitted from the light emitting element LE of the third emission area EA3 into the third light, which is the red light having a peak wavelength in the range of approximately 610 nm to 650 nm, and may emit the third light.

The second wavelength conversion pattern 250 may include a fourth base resin BRS4, and third wavelength conversion particles WCP3 dispersed in the fourth base resin BRS4.

The fourth base resin BRS4 may include (e.g., may be made of) a material having high light transmittance. In another embodiment, the fourth base resin BRS4 may include (e.g., may be made of) an organic material. The fourth base resin BRS4 may include (e.g., may be made of) the same or substantially the same material as that of the first base resin BRS1, the second base resin BRS2, and the third base resin BRS3 described above, or may include at least one of the materials described as example materials of the first base resin BRS1, the second base resin BRS2, and the third base resin BRS3.

The third wavelength conversion particles WCP3 may convert or shift the peak wavelength of the incident light to another specific peak wavelength. In another embodiment, the third wavelength conversion particles WCP3 may convert the first light, which is the blue light, provided from the light emitting element LE, into the third light, which is the red light having a single peak wavelength in the range of approximately 610 nm to 650 nm, and may emit the third light.

Examples of the third wavelength conversion particle WCP3 may include a quantum dot, a quantum rod, a phosphor, or the like. A more detailed description for the third wavelength conversion particle WCP3 is the same or substantially the same as (or similar to) the description for the first wavelength conversion particle WCP1 above, and thus, redundant description thereof may not be repeated.

A portion of the first light, which is the blue light, emitted from the light emitting element LE may not be converted into the third light, which is the red light, by the third wavelength conversion particles WCP3. However, the first light that is not converted to the red light may be blocked by the third color filter CF3 disposed on the second wavelength conversion pattern 250. On the other hand, the red light converted by the second wavelength conversion pattern 250 is transmitted through the third color filter CF3, and is emitted to the outside.

Each of the first wavelength conversion pattern 240 and the second wavelength conversion pattern 250 may further include the above-described scatterers, but the present disclosure is not limited thereto.

In the display device 10 according to the embodiment described above with reference to FIG. 9, light emission efficiency of the blue light, the green light, and the red light may be improved by forming the wavelength conversion layers QDL including the light transmission pattern 230, the first wavelength conversion pattern 240, and the second wavelength conversion pattern 250.

Figure 10:
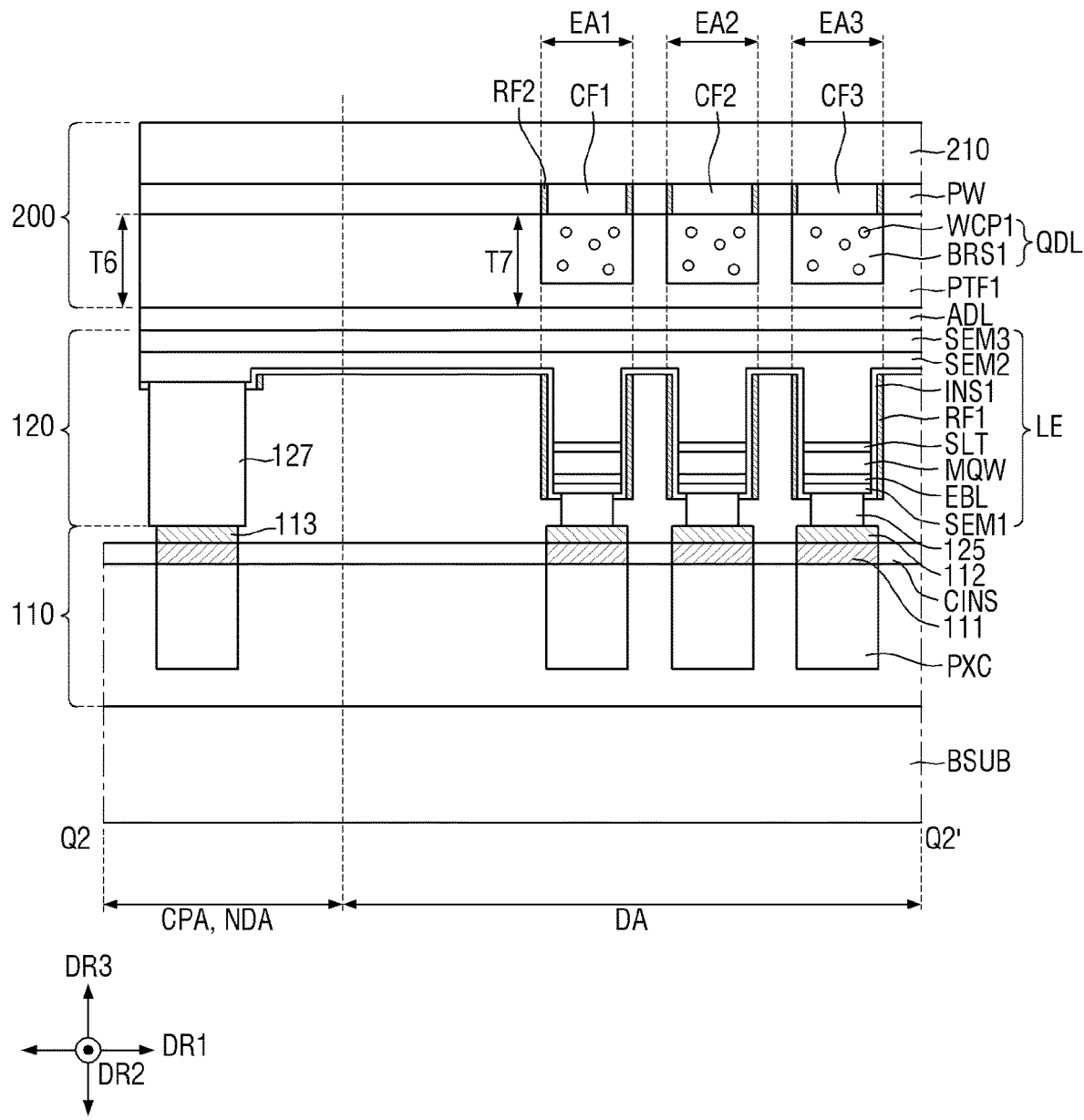
FIG. 10 is a cross-sectional view illustrating a display panel according to another embodiment.

FIG. 10 is a cross-sectional view illustrating a display panel according to another embodiment.

Referring to FIG. 10, a display device 10 may be different from the display devices according to the embodiments described above with reference to FIGS. 4 to 9, in that a lower surface of a first passivation layer PTF1 may be flat or substantially flat. Hereinafter, redundant description for the same or substantially the same configuration as those described above may be simplified or may not be repeated, and the differences therebetween may be mainly described in more detail.

The first passivation layer PTF1 may be disposed on the partition wall PW and the wavelength conversion layers QDL. The first passivation layer PTF1 may be disposed throughout the display area DA and the non-display area NDA. The first passivation layer PTF1 may be formed to be flat or substantially flat at (e.g., in or on) the display area DA and the non-display area NDA.

In more detail, a thickness T6 of the first passivation layer PTF1 at (e.g., in or on) the non-display area NDA may be the same or substantially the same as a maximum thickness T7 of the first passivation layer PTF1 at (e.g., in or on) the display area DA. Here, the thickness of the first passivation layer PTF1 refers to a distance (e.g., a closest distance) from a lower surface of the partition wall PW to a lower surface of the first passivation layer PTF1 in the third direction DR3. In addition, the maximum thickness T7 of the first passivation layer PTF1 refers to a thickness of a portion of the first passivation layer PTF1 that does not overlap with the plurality of emission areas EA1, EA2, and EA3 at (e.g., in or on) the display area DA.

In another embodiment, the first passivation layer PTF1 may have the same or substantially the same thickness at (e.g., in or on) the display area DA and the non-display area NDA, such that the lower surface of the wavelength conversion substrate 200 adhered to the light emitting element layer 120 may be formed to be flat or substantially flat. Accordingly, adhesion between the wavelength conversion substrate 200 and the light emitting element layer 120 may be easily performed, and an adhesive force between the wavelength conversion substrate 200 and the light emitting element layer 120 may also be improved.

Figure 11:
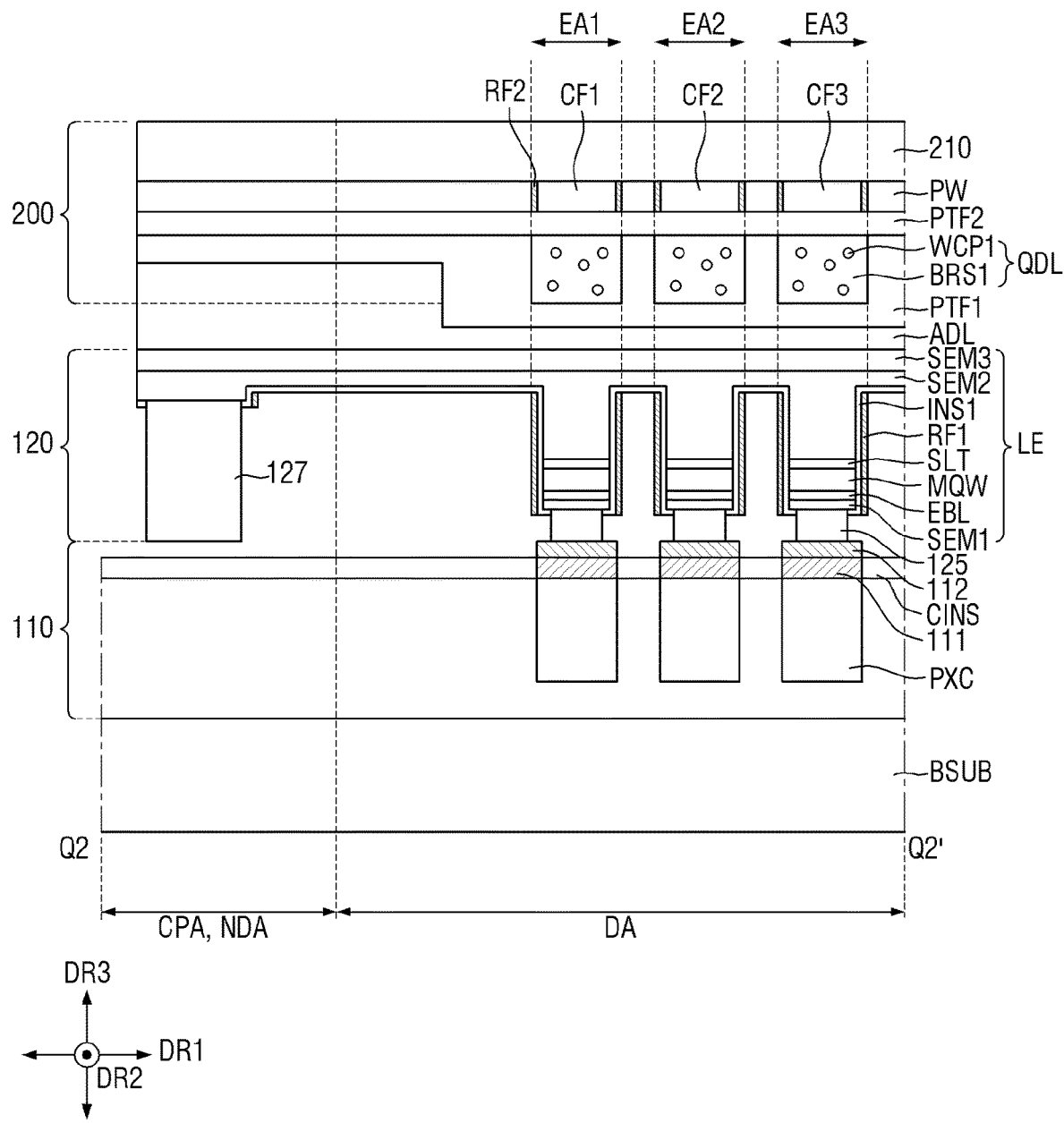
FIG. 11 is a cross-sectional view illustrating a display panel according to another embodiment.

FIG. 11 is a cross-sectional view illustrating a display panel according to another embodiment.

Referring to FIG. 11, a display panel 100 may be different from the display panels according to the embodiments described above with reference to FIGS. 4 to 10, in that the display panel 100 may further include a second passivation layer PTF2 between the wavelength conversion layer QDL and the plurality of color filters CF1, CF2, and CF3. Hereinafter, redundant description for the same or substantially the same configuration as those described above may be simplified or may not be repeated, and the differences therebetween may be mainly described in more detail.

The second passivation layer PTF2 may be disposed throughout the display area DA and the non-display area NDA, and may be disposed between the wavelength conversion layer QDL and the plurality of color filters CF1, CF2, and CF3. The second passivation layer PTF2 may protect the plurality of color filters CF1, CF2, and CF3 from an etchant or the like in a subsequent process.

One surface, for example, an upper surface, of the second passivation layer PTF2 may be in contact with lower surfaces of each of the partition wall PW, the second reflective layers RF2, and the plurality of color filters CF1, CF2, and CF3. Another surface (e.g., an opposite surface), for example, a lower surface, of the second passivation layer PTF2 may be in contact with upper surfaces of each of the wavelength conversion layers QDL and the first passivation layer PTF1.

The second passivation layer PTF2 may include an inorganic insulating material to protect the plurality of color filters CF1, CF2, and CF3. For example, the second passivation layer PTF2 may include silicon oxide (SiOx), silicon nitride (SiNx), silicon oxynitride (SiOxNy), aluminum oxide (AlxOy), aluminum nitride (AlN), or the like, but the present disclosure is not limited thereto. The second passivation layer PTF2 may be formed to have a suitable or desired thickness (e.g., a predetermined thickness), for example, such as a thickness in a range of 0.01 μm to 1 μm. However, the present disclosure is not limited thereto.

In another embodiment, the second passivation layer PTF2 may be provided between the wavelength conversion layers QDL and the plurality of color filters CF1, CF2, and CF3 to prevent or substantially prevent the plurality of color filters CF1, CF2, and CF3 from being damaged by a subsequent process.

Figure 12:
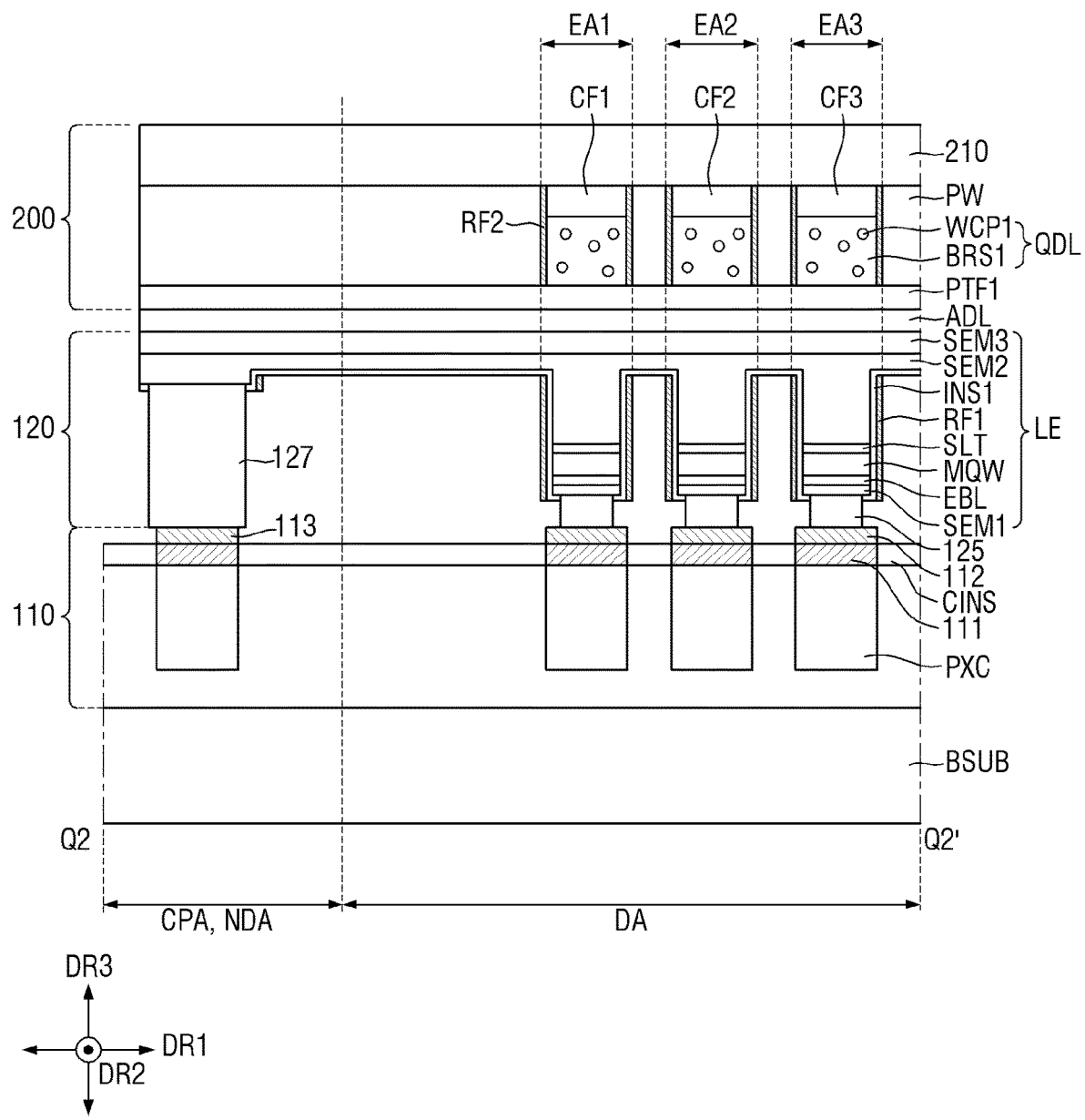
FIG. 12 is a cross-sectional view illustrating a display panel according to another embodiment.

FIG. 12 is a cross-sectional view illustrating a display panel according to another embodiment.

Referring to FIG. 12, a display panel 100 may be different from the display panels according to the embodiments described above with reference to FIGS. 4 to 11, in that the wavelength conversion layers QDL may be disposed in the plurality of openings OP1, OP2, and OP3 of the partition wall PW. Hereinafter, redundant description for the same or substantially the same configuration as those described above may be simplified or may not be repeated, and the differences therebetween may be mainly described in more detail.

The partition wall PW may be formed to have a relatively larger thickness when compared to the embodiments described above. Accordingly, the plurality of color filters CF1, CF2, and CF3 and the wavelength conversion layers QDL may be disposed in the plurality of openings OP1, OP2, and OP3 of the partition wall PW.

In more detail, the wavelength conversion layers QDL may be disposed in the plurality of openings OP1, OP2, and OP3. The first color filter CF1, the second reflective layer RF2, and the wavelength conversion layer QDL may be disposed in the first opening OP1 disposed at (e.g., in or on) the first emission area EA1. The wavelength conversion layer QDL may be in contact with a lower surface of the first color filter CF1, and side surfaces of the second reflective layer RF2. The wavelength conversion layer QDL may fill the first opening OP1, and a lower surface of the partition wall PW may be aligned and coincide with a lower surface of the wavelength conversion layer QDL.

The second color filter CF2, the second reflective layer RF2, and the wavelength conversion layer QDL may be disposed in the second opening OP2 disposed at (e.g., in or on) the second emission area EA2. The wavelength conversion layer QDL may be in contact with a lower surface of the second color filter CF2, and side surfaces of the second reflective layer RF2. The wavelength conversion layer QDL may fill the second opening OP2, and a lower surface of the partition wall PW may be aligned and coincide with a lower surface of the wavelength conversion layer QDL.

The third color filter CF3, the second reflective layer RF2, and the wavelength conversion layer QDL may be disposed in the third opening OP3. The wavelength conversion layer QDL may be in contact with a lower surface of the third color filter CF3, and side surfaces of the second reflective layer RF2. The wavelength conversion layer QDL may fill the third opening OP3, and a lower surface of the partition wall PW may be aligned and coincide with a lower surface of the wavelength conversion layer QDL. However, the present disclosure is not limited thereto, and the wavelength conversion layer QDL may be disposed to protrude further downward than the lower surface of the partition wall PW, or may be upwardly spaced apart from the lower surface of the partition wall PW.

The first passivation layer PTF1 may be disposed beneath the partition wall PW, the second reflective layer RF2, and the wavelength conversion layer QDL. The first passivation layer PTF1 may be in contact with each of the lower surface of the partition wall PW, the lower surface of the second reflective layer RF2, and the lower surface of the wavelength conversion layer QDL. As described above, the lower surface of the partition wall PW and the lower surface of the wavelength conversion layer QDL may coincide with each other, and thus, the first passivation layer PTF1 formed on the lower surfaces of the partition wall PW and the wavelength conversion layer QDL may be formed to be flat or substantially flat. The first passivation layer PTF1 may be formed to be flat or substantially flat, such that an adhesive force between the wavelength conversion substrate 200 and the light emitting element layer 120 may be improved.

In another embodiment, the partition wall PW may be formed to have a larger thickness, and the plurality of color filters CF1, CF2, and CF3 and the wavelength conversion layers QDL may be formed in the plurality of openings OP1, OP2, and OP3, such that alignment between the plurality of color filters CF1, CF2, and CF3 and the wavelength conversion layers QDL may be facilitated, and a thickness of the wavelength conversion layers QDL may be increased to improve light conversion efficiency.

Figure 13:
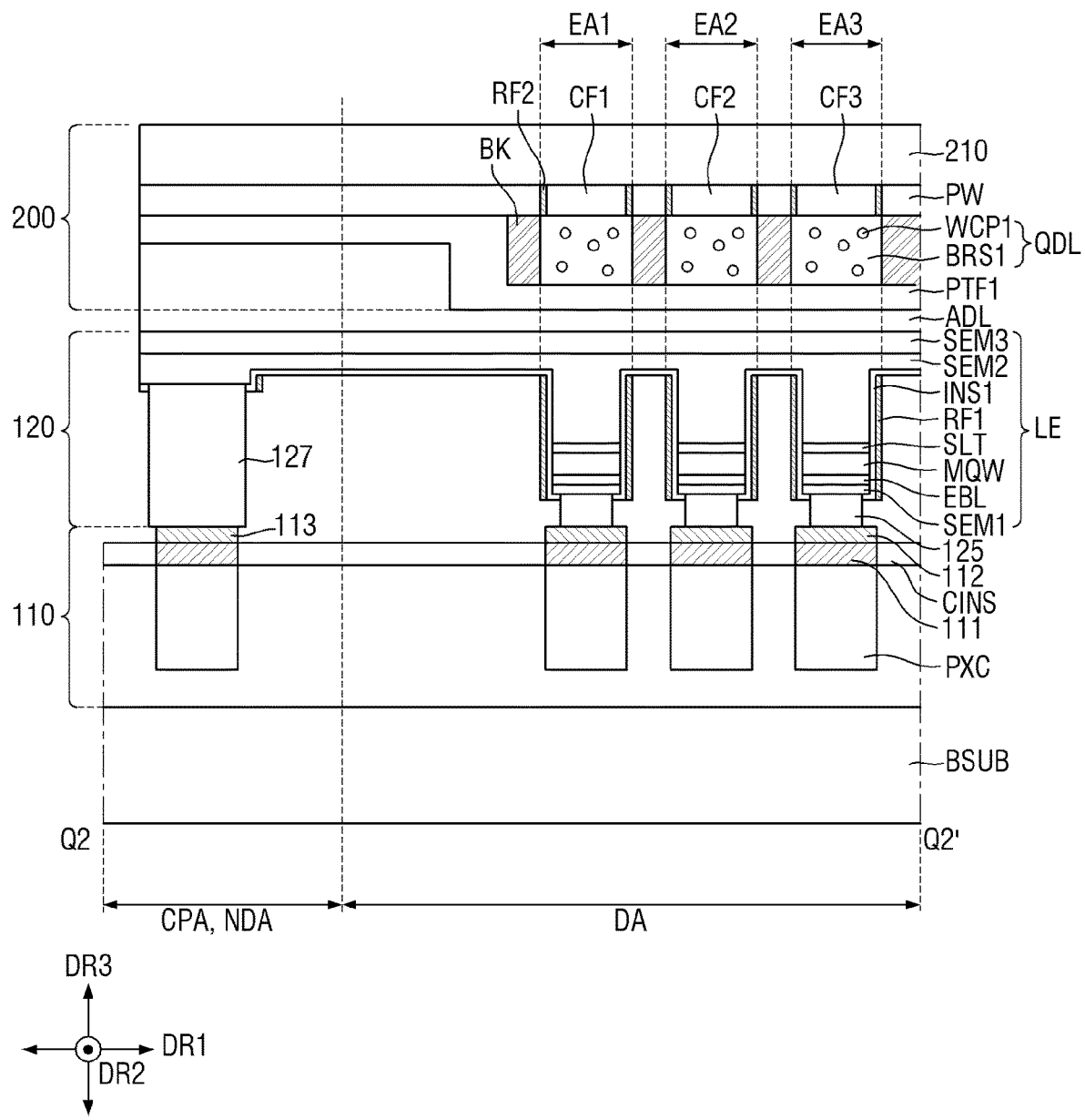
FIG. 13 is a cross-sectional view illustrating a display panel according to another embodiment.

FIG. 13 is a cross-sectional view illustrating a display panel according to another embodiment. FIG. 14 is a plan view illustrating a portion of a display panel according to another embodiment.

Referring to FIGS. 13 and 14, a display panel 100 may be different from the display panels according to the embodiments described above with reference to FIGS. 4 to 12, in that the display panel 100 may further include a light blocking member BK surrounding (e.g., around peripheries of) the wavelength conversion layers QDL. Hereinafter, redundant description for the same or substantially the same configuration as those described above may be simplified or may not be repeated, and the differences therebetween may be mainly described in more detail.

The wavelength conversion substrate 200 may include the light blocking member BK. The light blocking member BK may be disposed on one surface of the partition wall PW. In more detail, the light blocking member BK may be disposed on a lower surface of the partition wall PW. The light blocking member BK may be disposed at (e.g., in or on) the display area DA, and may not overlap with the plurality of emission areas EA1, EA2, and EA3. The light blocking member BK may not overlap with the plurality of color filters CF1, CF2, and CF3 and the second reflective layers RF2. In addition, the light blocking member BK may not overlap with the plurality of light emitting elements LE and the first reflective layers RF1.

The light blocking member BK may block transmission of light. The light blocking member BK may prevent or substantially prevent the light from penetrating between the first to third emission areas EA1, EA2, and EA3 and the mixing of the colors to improve a color reproduction rate. The light blocking member BK may be formed in a lattice shape, so as to surround (e.g., around peripheries of) the first to third emission areas EA1, EA2, and EA3 in a plan view. In addition, the light blocking member BK may be disposed to surround (e.g., around peripheries of) the wavelength conversion layers QDL.

The light blocking member BK may include an organic light blocking material and a liquid repellent component. Here, the liquid repellent component may include (e.g., may be made of) a fluorine-containing monomer or a fluorine-containing polymer, and in more detail, may include, for example, a fluorine-containing aliphatic polycarbonate. For example, the light blocking member BK may include (e.g., may be made of) a black organic material including the liquid repellent component, but the present disclosure is not limited thereto, and the light blocking member BK may be a black matrix (BM).

In another embodiment, the display panel 100 may include the light blocking member BK surrounding (e.g., around peripheries of) the plurality of emission areas EA1, EA2, and EA3 to prevent or substantially prevent the light from penetrating between the first to third emission areas EA1, EA2, and EA3 and mixing the colors, such that color reproduction rate may be improved.

While various embodiments of the present disclosure have been described above with reference to FIGS. 4 to 14, the present disclosure is not limited thereto, and the embodiments described above and illustrated in FIGS. 4 to 14 may be combined with each other in any suitable manner. For example, the flat or substantially flat first passivation layer PFT1 illustrated in FIG. 10 may be applied to the other embodiments other than the embodiment of FIG. 10, and the second passivation layer PFT2 illustrated in FIG. 11 may be applied to the embodiments other than the embodiment of FIG. 11. Similarly, the structures illustrated in each of FIGS. 12 to 14 may be combined with and applied to the other embodiments in any suitable manner.

Hereinafter, various processes of manufacturing a display device 10 according to one or more embodiments will be described with reference to the other figures.

Figure 15:
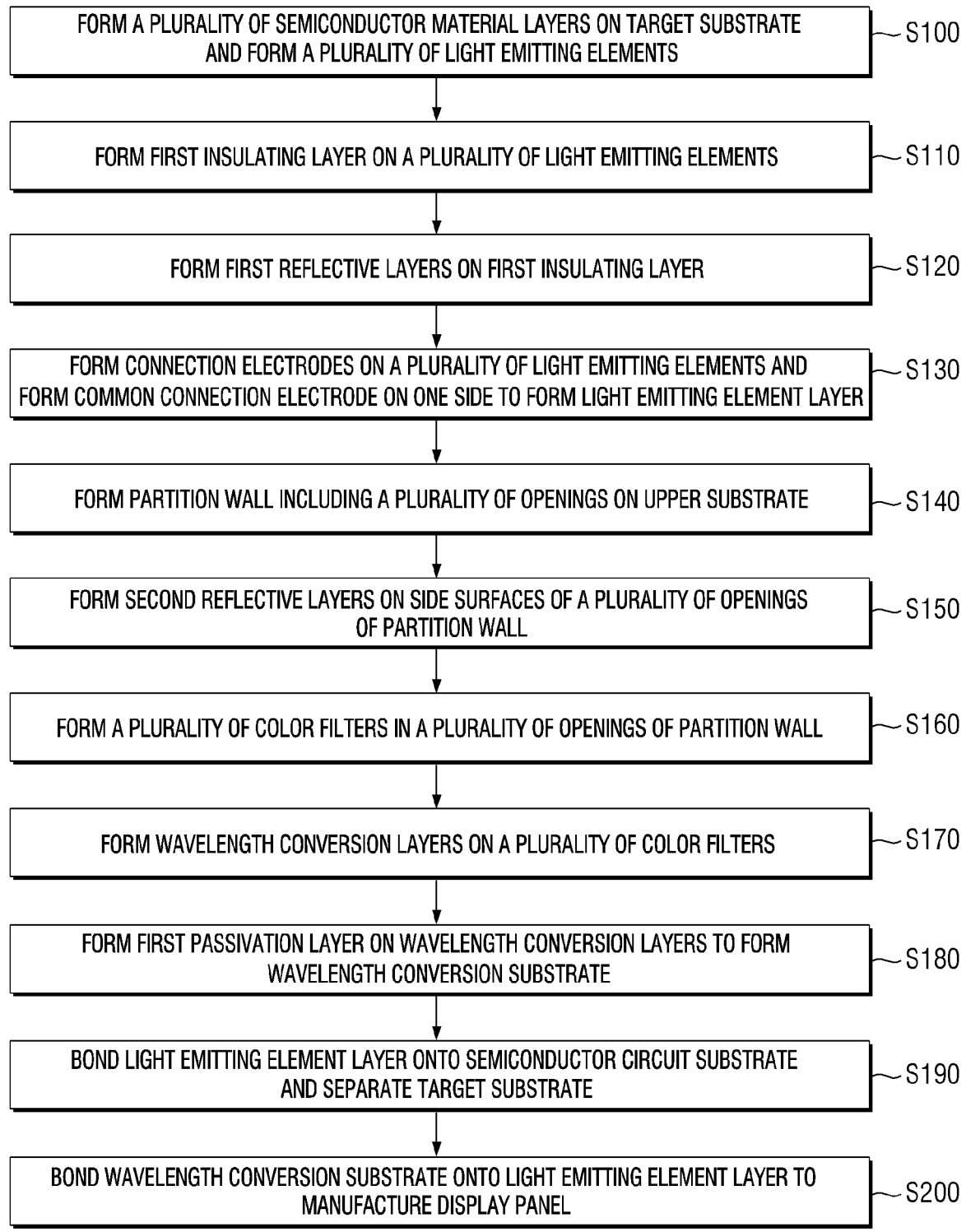
FIG. 15 is a flowchart illustrating a method of manufacturing a display panel according to an embodiment.

FIG. 15 is a flowchart illustrating a method of manufacturing a display panel according to an embodiment. FIGS. 16 to 30 are cross-sectional views illustrating the method of manufacturing a display panel according to an embodiment.

FIGS. 16 to 30 illustrate various structures according to a formation order of the respective layers of the display panel 100 of the display device 10 in cross-sectional views. Processes of manufacturing the light emitting element layer 120 and the wavelength conversion substrate 200 are mainly illustrated in FIGS. 16 to 30, and each of the light emitting element layer 120 and the wavelength conversion substrate 200 may correspond to the cross-sectional view of the structure illustrated in FIG. 5. Hereinafter, a method of manufacturing a display panel illustrated in FIGS. 16 to 30 will be described in conjunction with FIG. 15.

Figure 16:
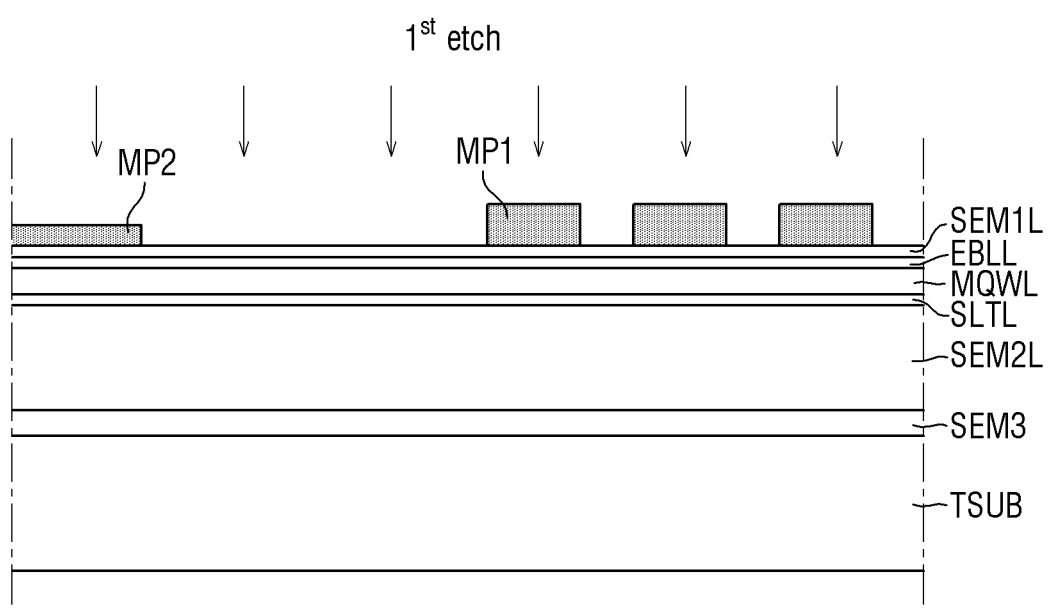

Referring to FIGS. 15 and 16, a plurality of semiconductor material layers SEM3, SEM2L, SLTL, MQWL, EBLL, and SEM1L are formed on a target substrate TSUB and a plurality of light emitting elements LE are formed (S100 in FIG. 15).

First, the target substrate TSUB is prepared. The target substrate TSUB may be a sapphire ($Al_2O_3$) substrate. However, the present disclosure is not limited thereto, and a case where the target substrate TSUB is the sapphire substrate will be described in more detail by way of example according to an embodiment.

The plurality of semiconductor material layers SEM3, SEM2L, SLTL, MQWL, EBLL, and SEM1L are formed on the target substrate TSUB. The plurality of semiconductor material layers may be grown by an epitaxial method by growing a seed crystal. Here, a method of forming the semiconductor material layers may include electron beam deposition, physical vapor deposition (PVD), chemical vapor deposition (CVD), plasma laser deposition (PLD), dual-type thermal evaporation, sputtering, or metal-organic chemical vapor deposition (MOCVD). For example, in an embodiment, the semiconductor material layers may be formed by metal-organic chemical vapor deposition (MOCVD). However, the present disclosure is not limited thereto.

A precursor material for forming the plurality of semiconductor material layers is not particularly limited within a range that may be generally selected for forming a target material. As an example, the precursor material may be a metal precursor including an alkyl group, such as a methyl group or an ethyl group. For example, the precursor material may be a compound, such as trimethyl gallium ($Ga(CH_3)_3$), trimethyl aluminum ($Al(CH_3)_3$), or triethyl phosphate ($(C_2H_5)_3PO_4$), but the present disclosure is not limited thereto.

In more detail, a third semiconductor layer SEM3 is formed on the target substrate TSUB. While it is shown in the drawings that one third semiconductor layer SEM3 is stacked, the present disclosure is not limited thereto, and a plurality of third semiconductor layers may be formed. The third semiconductor layer SEM3 may be disposed to reduce a difference in lattice constant between the second semiconductor material layer SEM2L and the target substrate TSUB. As an example, the third semiconductor layer SEM3 may include an undoped semiconductor, and may be made of a material that is not doped with an n-type or a p-type dopant. In an embodiment, the third semiconductor layer SEM3 may include (e.g., may be made of) at least one of undoped InAlGaN, GaN, AlGaN, InGaN, AlN, or InN, but the present disclosure is not limited thereto.

The second semiconductor material layer SEM2L, a superlattice material layer SLTL, an active material layer MQWL, an electron blocking material layer EBLL, and a first semiconductor layer SEM1L are sequentially formed on the third semiconductor layer SEM3 using the above-described method.

Next, the plurality of light emitting elements LE are formed by etching the plurality of semiconductor material layers SEM2L, SLTL, MQWL, EBLL, and SEM1L.

In more detail, a plurality of first mask patterns MP1 and a second mask pattern MP2 are formed on the first semiconductor material layer SEM1L. The first mask patterns MP1 and the second mask pattern MP2 may be hard masks including an inorganic material, or photoresist masks including an organic material. The first mask patterns MP1 are formed to have a greater thickness than that of the second mask pattern MP2, so that portions of the plurality of semiconductor material layers SEM2L, SLTL, MQWL, EBLL, and SEM1L below the first mask pattern MP1 are not etched.

Portions of the plurality of semiconductor material layers are etched (e.g., $1^{st}$ etch) using the plurality of first mask patterns MP1 and the second mask pattern MP2 as masks.

Figure 17:
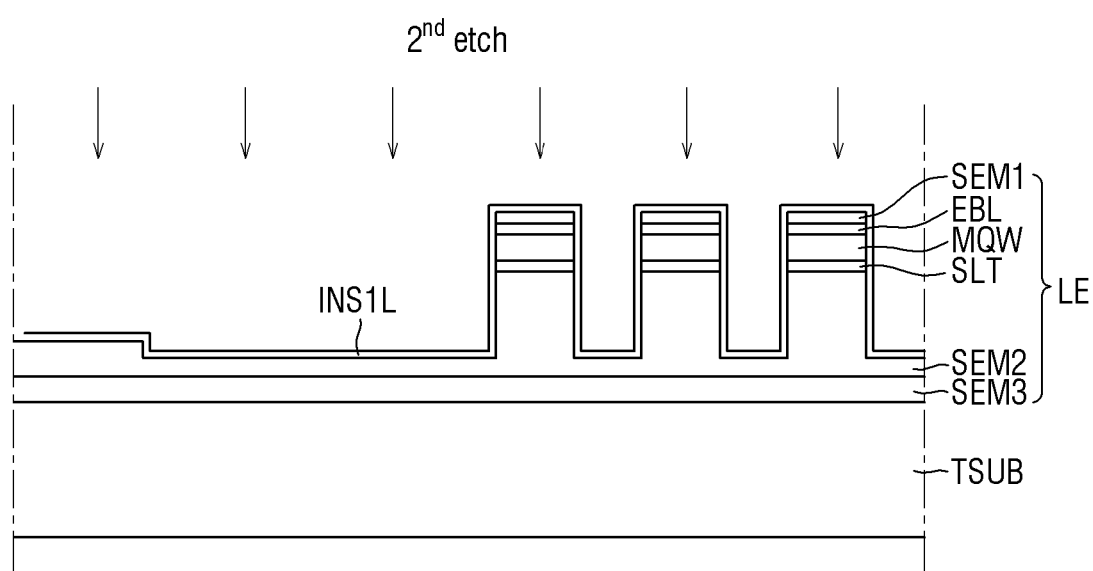

Referring to FIG. 17, portions of the plurality of semiconductor material layers SEM2L, SLTL, MQWL, EBLL, and SEM1L may be etched and removed on the target substrate TSUB, and the portions of the plurality of semiconductor material layers that are not etched may be formed as the plurality of light emitting elements LE. The semiconductor material layers may be etched by a general method. For example, a process of etching the semiconductor material layers may include dry etching, wet etching, reactive ion etching (RIE), deep reactive ion etching (DRIE), inductively coupled plasma reactive ion etching (ICP-RIE), or the like. In the case of dry etching, anisotropic etching may be used, and thus, the dry etching may be suitable for vertical etching. When the above-described etching method is used, an etchant may be $Cl_2$, $O_2$, or the like. However, the present disclosure is not limited thereto.

The portions of the plurality of semiconductor material layers SEM2L, SLTL, MQWL, EBLL, and SEM1L overlapping with the first mask patterns MP1 are not etched, and are formed as the plurality of light emitting elements LE. In the plurality of semiconductor material layers SEM2L, SLTL, MQWL, EBLL, and SEM1L overlapping with the second mask pattern MP2, as the second mask pattern MP2 is etched, the superlattice material layer SLTL, the active material layer MQWL, the electron blocking material layer EBLL, and the first semiconductor material layer SEM1L are etched and removed, and a portion of the second semiconductor material layer SEM2L and the third semiconductor layer SEM3 are not etched and remain. The superlattice material layer SLTL, the active material layer MQWL, the electron blocking material layer EBLL, and the first semiconductor material layer SEM1L from among the plurality of semiconductor material layers SEM2L, SLTL, MQWL, EBLL, and SEM1L that do not overlap the mask patterns MP1 and MP2 are etched and removed, and a portion of the second semiconductor material layer SEM2L and the third semiconductor layer SEM3 are not etched and remain by adjusting an etching process. The second semiconductor material layer SEM2L is formed to be relatively thicker particularly at an edge of the target substrate TSUB than in an adjacent area to set a position where a common connection electrode described in more detail below is disposed.

As a result, the plurality of light emitting elements LE are formed to include the third semiconductor layer SEM3, the second semiconductor layer SEM2, the superlattice layer SLT, the active layer MQW, the electron blocking layer EBL, and the first semiconductor layer SEM1. In addition, the third semiconductor layer SEM3 and the second semiconductor layer SEM2 are formed to be entirely disposed on the target substrate TSUB.

Next, a first insulating layer INS1 is formed on the target substrate TSUB including the plurality of light emitting elements LE (S110 of FIG. 15).

Referring to FIG. 17, a first insulating material layer INS1L is formed on the target substrate TSUB. The first insulating material layer INS1L may completely cover the plurality of light emitting elements LE. The first insulating material layer INS1L may be formed by a method of applying an insulating material onto the target substrate TSUB, or immersing the target substrate TSUB in an insulating material. As an example, the first insulating material layer INS1L may be formed by atomic layer deposition (ALD).

Figure 18:
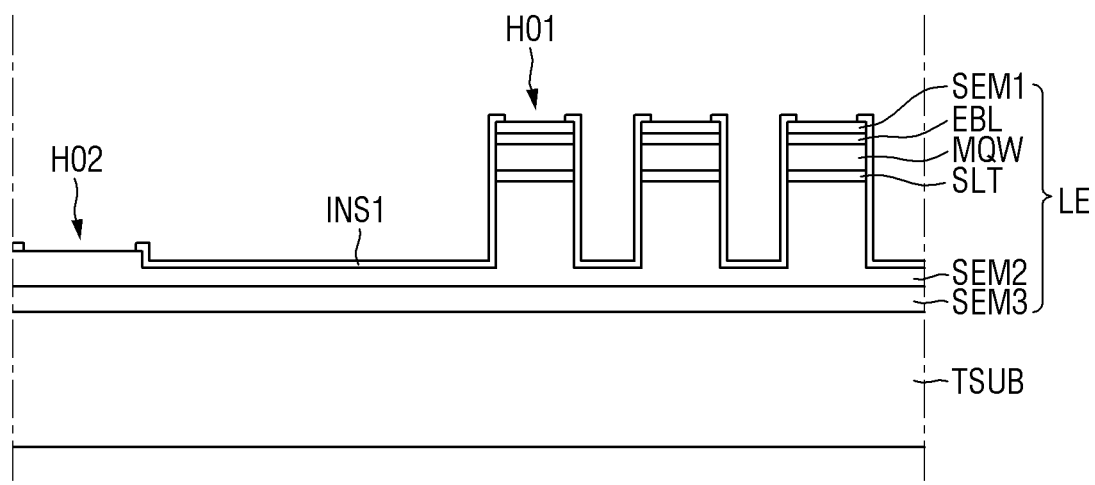

Next, referring to FIG. 18, the first insulating layer INS1 is formed by partially etching (e.g., $2^{nd}$ etch), and removing the first insulating material layer INS1L, so that upper surfaces of the plurality of light emitting elements LE and an upper surface of the second semiconductor layer SEM2 disposed on at least a portion of the edge of the target substrate TSUB are exposed. The first insulating material layer INS1L may be removed by the above-described etching method.

Figure 19:
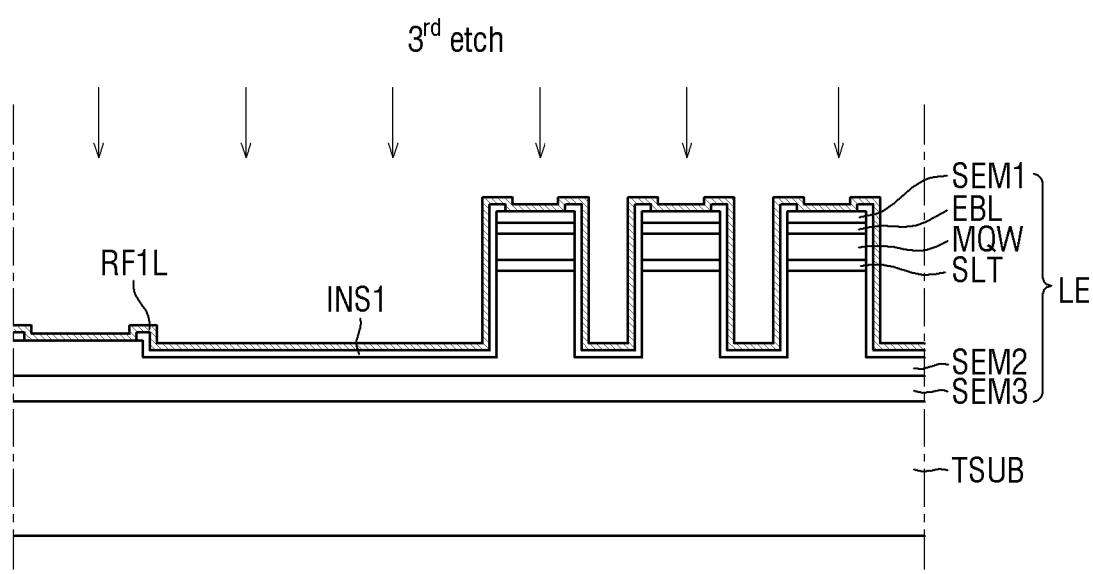

Next, referring to FIG. 19, first reflective layers RF1 are formed on the first insulating layer INS1 (S120 of FIG. 15).

In more detail, a first reflective material layer RF1L is formed on the target substrate TSUB on which the first insulating layer INS1 is formed. The first reflective material layer RF1L may include a metal having high reflectivity, for example, such as aluminum (Al). The first reflective material layer RF1L may be formed by a metal deposition method, for example, such as the above-described sputtering method. The first reflective material layer RF1L may be entirely stacked on the first insulating layer INS1 and the entire light emitting elements LE.

Figure 20:
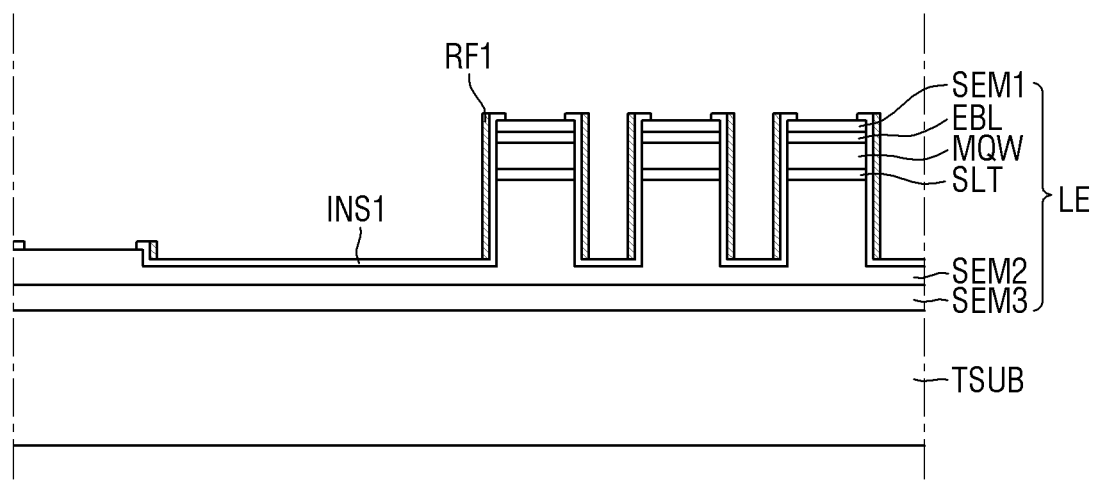

Next, referring to FIGS. 19 and 20, the first reflective layers RF1 are formed by etching (e.g., $3^{rd}$ etch) the first reflective material layer RF1L. When a voltage difference is made to be large, and a suitable etching gas (e.g., a predetermined etching gas) EG2 is used in an etching process, the first reflective material layer RF1L stacked in parallel or substantially in parallel with the target substrate TSUB may be removed. On the other hand, the first reflective material layers RF1L disposed on vertical surfaces that are perpendicular to or substantially perpendicular to an upper surface of the target substrate TSUB, for example, such as the side surfaces of the light emitting elements LE, may not be removed.

Accordingly, the first reflective layers RF1 may be disposed on side surfaces of the first insulating layers INS1 disposed on the side surfaces of the plurality of light emitting elements LE. In addition, the first reflective layer RF1 may also be disposed on a side surface of the first insulating layer INS1 disposed on a side surface of the second semiconductor layer SEM2 disposed on the edge of the target substrate TSUB. In other words, the first reflective layers RF1 may be disposed on the vertical surfaces that are perpendicular to or substantially perpendicular to the upper surface of the target substrate TSUB.

Figure 21:
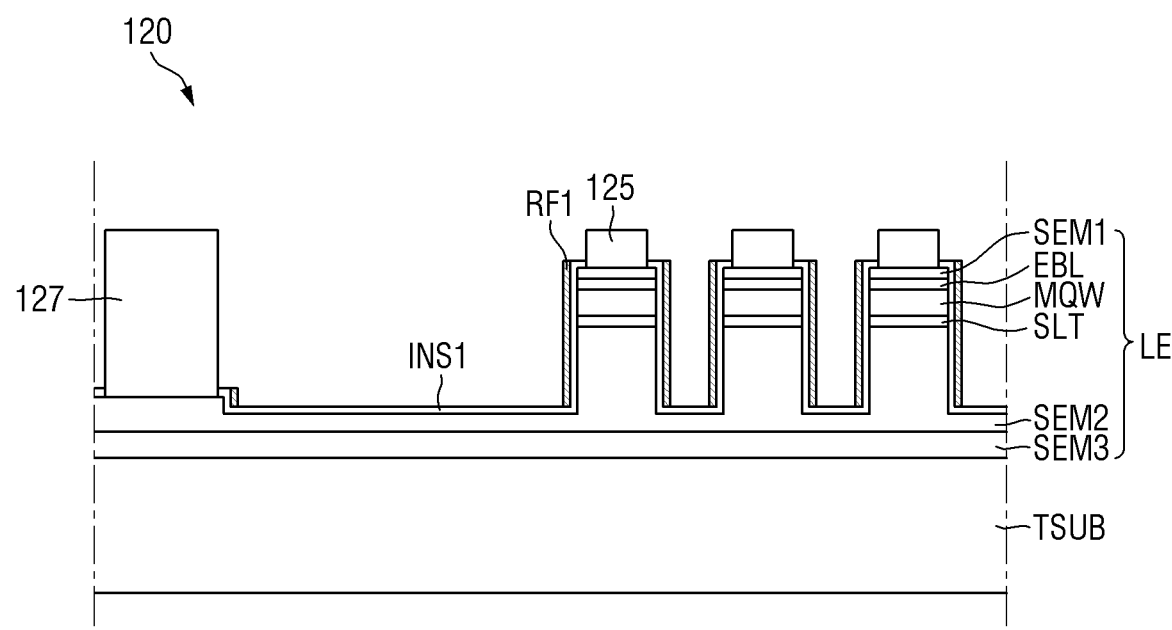

Next, referring to FIG. 21, connection electrodes 125 are formed on the plurality of light emitting elements LE, and a common connection electrode 127 is formed on the second semiconductor layer SEM2 exposed at the edge of the target substrate TSUB to form a light emitting element layer 120 (S130 in FIG. 15).

In more detail, the connection electrodes 125 are formed on the plurality of light emitting elements LE exposed by the first insulating layer INS1, by stacking a common electrode material layer on the target substrate TSUB and etching the common electrode material layer. The connection electrodes 125 may be directly formed on upper surfaces of the first semiconductor layers SEM1 of the light emitting elements LE. In addition, the common connection electrode 127 is formed on the second semiconductor layer SEM2 exposed by the first insulating layer INS1 at the edge of the target substrate TSUB. The common connection electrode 127 may be directly formed on an upper surface of the second semiconductor layer SEM2.

The connection electrode 125 and the common connection electrode 127 may include a transparent conductive material. The common electrode CE may be formed of transparent conductive oxide (TCO), for example, such as indium tin oxide (ITO) or indium zinc oxide (IZO).

Next, a partition wall PW including a plurality of openings OP1, OP2, and OP3 is formed on an upper substrate 210 (S140 of FIG. 15).

Figure 22:
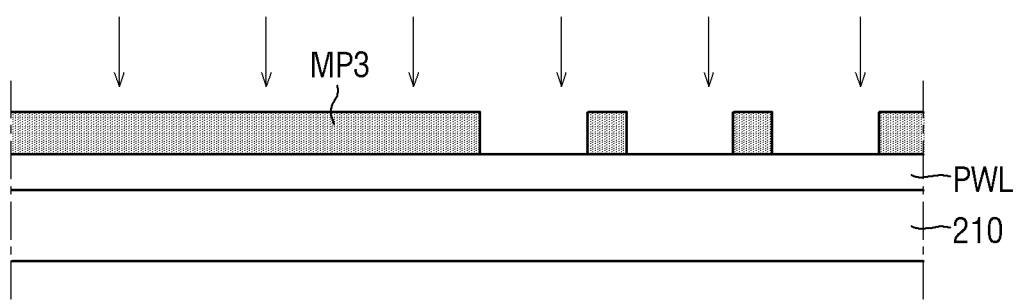
Figure 23:
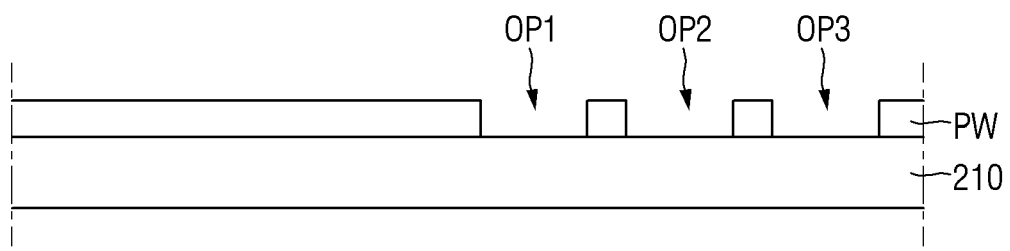

Referring to FIGS. 22 and 23, the upper substrate 210 is prepared. The upper substrate 210 may be a sapphire substrate, similar to the above-described target substrate TSUB. A partition wall layer PWL is formed on the upper substrate 210. The partition wall layer PWL may include silicon (Si). The partition wall layer PWL may be a silicon single crystal layer including a silicon single crystal. The silicon single crystal layer may be grown and formed on the upper substrate 210 by an epitaxial growth method. A thickness of the partition wall layer PWL may be approximately 1 μm to 10 μm.

Next, a third mask pattern MP3 is formed on the partition wall layer PWL. The third mask pattern MP3 may include the same or substantially the same material as that of the above-described first mask pattern MP1. The third mask pattern MP3 may be a mask for forming a plurality of openings in the partition wall layer PWL. The partition wall PW including the plurality of openings OP1, OP2, and OP3 is formed by etching (e.g., $4^{th}$ etch) the partition wall layer PWL using the third mask pattern MP3 as a mask. As a process of etching the partition wall layer PWL, the same or substantially the same process as the process of etching the semiconductor material layer described above may be used.

The partition wall PW including silicon may be etched to have a high aspect ratio using a deep reactive ion etching (DRIE) method. As a result, the partition wall PW having the high aspect ratio may be manufactured. Accordingly, the openings OP1, OP2, and OP3 having ultra-high resolution may be formed in the partition wall PW, and the openings OP1, OP2, and OP3 correspond to the emission areas EA1, EA2, and EA3, respectively. Thus, the display device 10 having ultra-high resolution may be manufactured.

Next, second reflective layers RF2 are formed on side surfaces of the plurality of openings OP1, OP2, and OP3 of the partition wall PW (S150 of FIG. 15).

Figure 24:
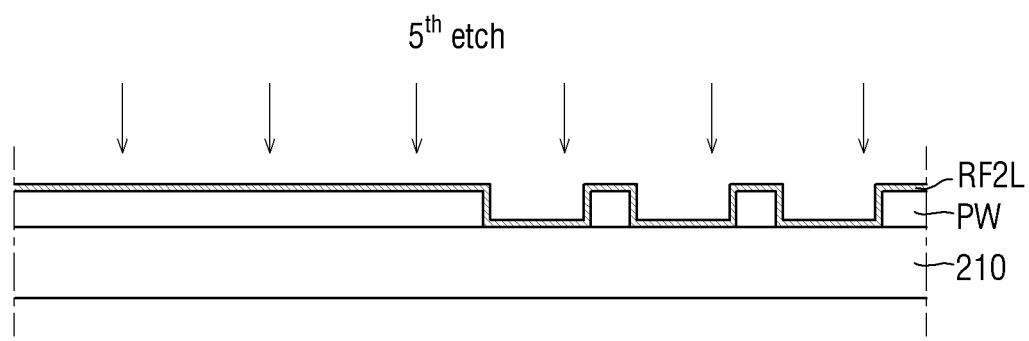
Figure 25:
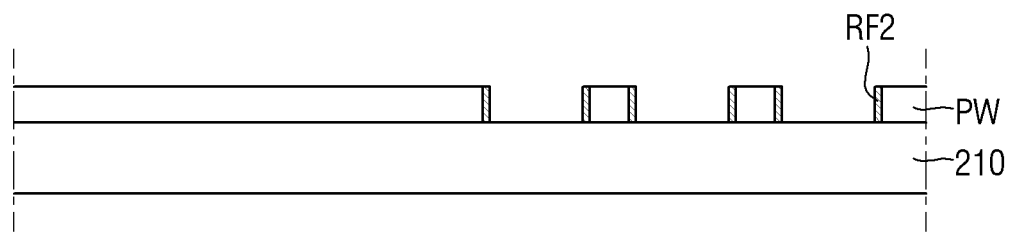

Referring to FIGS. 24 and 25, a second reflective material layer RF2L is stacked on the upper substrate 210 including the partition wall PW in which the plurality of openings OP1, OP2, and OP3 are formed. The second reflective material layer RF2L may include the same or substantially the same material as that of the above-described first reflective material layer RF1L. The second reflective material layer RF1L may be formed by a metal deposition method, for example, such as the above-described sputtering. The second reflective material layer RF2L may be entirely stacked on the upper substrate 210 and the partition wall PW.

Next, the second reflective layers RF2 are formed by etching (e.g., $5^{th}$ etch) the second reflective material layer RF2L. When a voltage difference is made to be large, and a suitable etching gas (e.g., a predetermined etching gas) EG2 is used in an etching process, the second reflective material layer RF2L stacked in parallel or substantially in parallel with the upper substrate 210 may be removed. On the other hand, the second reflective material layers RF2L disposed on vertical surfaces perpendicular to or substantially perpendicular to an upper surface of the upper substrate 210, for example, such as the side surfaces of the plurality of openings OP1, OP2, and OP3 of the partition wall PW, may not be removed.

Accordingly the second reflective layers RF2 may be disposed on side surfaces of the partition wall PW, or in other words, the side surfaces of the plurality of openings OP1, OP2, and OP3. In addition, the second reflective layers RF2 may be in contact with the upper surface of the upper substrate 210. In other words, the second reflective layers RF2 may be disposed on the vertical surfaces perpendicular to or substantially perpendicular to the upper surface of the upper substrate 210.

Next, a plurality of color filters CF1, CF2, and CF3 are formed in the plurality of openings OP1, OP2 and OP3 of the partition wall PW (S160 of FIG. 15).

Figure 26:
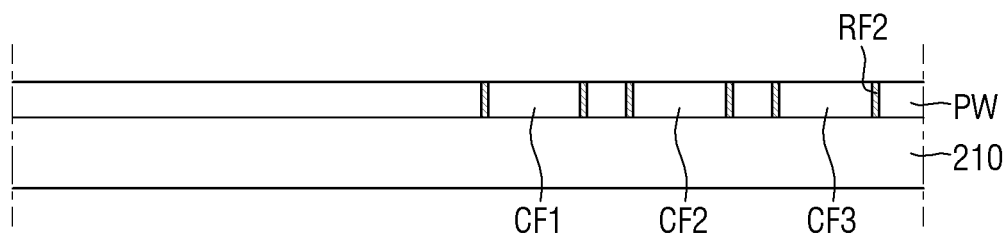

Referring to FIG. 26, a first color filter CF1 is formed in a first opening OP1, a second color filter CF2 is formed in a second opening OP2, and a third color filter CF3 is formed in a third opening OP3. The plurality of color filters CF1, CF2, and CF3 may be formed by a photo process. The plurality of color filters CF1, CF2, and CF3 may be formed to have a thickness of 1 μm or less, but the present disclosure is not limited thereto. The thickness of the plurality of color filters CF1, CF2, and CF3 may be variously adjusted according to a thickness of the partition wall PW.

In more detail, a first color filter material layer is applied onto the upper substrate 210 including the partition wall PW, and patterned through a photo process to form the first color filter CF1 in the first opening OP1. Then, a second color filter material layer is applied onto the upper substrate 210, and patterned through a photo process to form the second color filter CF2 in the second opening OP2. Then, a third color filter material layer is applied onto the upper substrate 210, and patterned through a photo process to form the third color filter CF3 in the third opening OP3. While it is shown that the first color filter CF1, the second color filter CF2, and the third color filter CF3 are sequentially formed, the present disclosure is not limited thereto, and the order in which the first color filter CF1, the second color filter CF2, and the third color filter CF3 are formed may be variously modified and is not limited thereto.

Next, wavelength conversion layers QDL are formed on the plurality of color filters CF1, CF2, and CF3 (S170 of FIG. 15).

Figure 27:
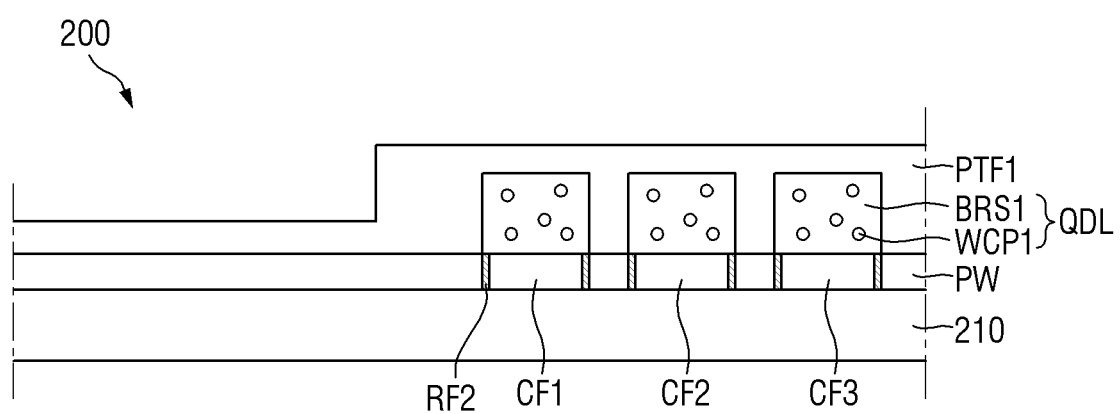

Referring to FIG. 27, the wavelength conversion layers QDL may be formed to correspond to the plurality of color filters CF1, CF2, and CF3, respectively. The wavelength conversion layers QDL may be formed by a solution process, for example, such as imprinting, but the present disclosure is not limited thereto. The wavelength conversion layers QDL may be formed to overlap with the plurality of openings OP1, OP2, and OP3, respectively, and may be formed to overlap with the plurality of color filters CF1, CF2, and CF3 and the second reflective layers RF2.

Next, a first passivation layer PTF1 is formed on the wavelength conversion layers QDL to form the wavelength conversion substrate 200 (S180 of FIG. 15).

The first passivation layer PTF1 may be entirely formed on the upper substrate 210 on which the wavelength conversion layers QDL are formed. The first passivation layer PTF1 may be formed of an organic insulating material, and may be formed by a general solution process. The first passivation layer PTF1 may be flat or substantially flat at (e.g., in or on) an area adjacent to the wavelength conversion layers QDL, but may be formed to have a relatively smaller thickness due to a step of the wavelength conversion layers QDL at (e.g., in or on) an area where the wavelength conversion layers QDL are not disposed. However, the present disclosure is not limited thereto, and the thickness of the wavelength conversion layer QDL may be the same or substantially the same over the entire upper substrate 210.

Figure 28:
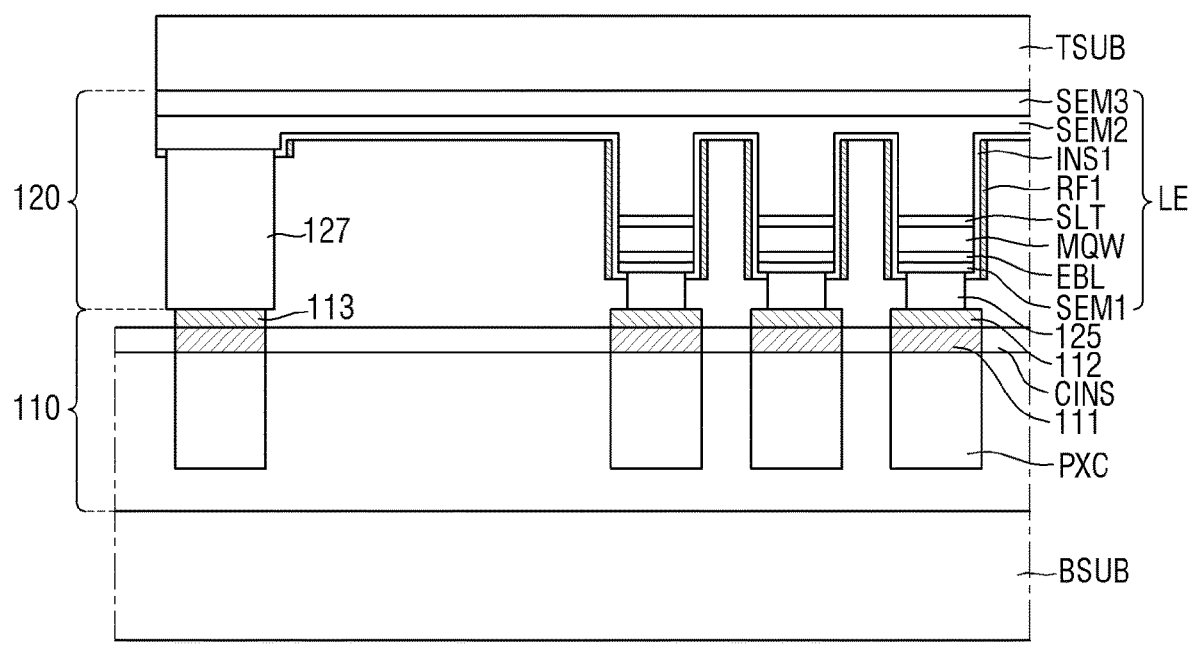

Next, referring to FIG. 28, the light emitting element layer 120 is bonded onto a semiconductor circuit substrate 110, and the target substrate TSUB is separated (S190 of FIG. 15).

First, the semiconductor circuit substrate 110 is prepared. The semiconductor circuit substrate 110 may include a plurality of pixel circuit parts PXC, a circuit insulating layer CINS, pixel electrodes 111, contact electrodes 112, and a common contact electrode 113.

In more detail, the pixel electrodes 111 are formed on the semiconductor circuit substrate 110 on which the plurality of pixel circuit parts PXC are formed, and the circuit insulating layer CINS for planarizing or substantially planarizing a step of the pixel electrodes 111 is formed. Then, the contact electrodes 112 and the common contact electrode 113 are formed by stacking and etching contact electrode material layers on the pixel electrodes 111. The contact electrode material layer may include gold (Au), copper (Cu), aluminum (Al), or tin (Sn).

Next, the light emitting element layer 120 is aligned on and with the semiconductor circuit substrate 110, and the semiconductor circuit substrate 110 and the light emitting element layer 120 are then bonded to each other.

In more detail, the contact electrodes 112 of the semiconductor circuit substrate 110 and the connection electrodes 125 of the light emitting element layer 120 are brought into contact with each other. In addition, the common contact electrode 113 of the semiconductor circuit substrate 110 and the common connection electrode 127 of the light emitting element layer 120 are brought into contact with each other. Next, the semiconductor circuit substrate 110 and the light emitting element layer 120 are bonded to each other by fusing and bonding the contact electrodes 112 and 113 and the connection electrodes 125 and 127 to each other at a suitable temperature (e.g., a predetermined temperature).

Next, referring to FIG. 29, the target substrate TSUB of the light emitting element layer 120 is separated. In more detail, the target substrate TSUB is separated from the third semiconductor layer SEM3 of the light emitting element layer 120. A process of separating the target substrate TSUB may include (e.g., may be) a laser lift off (LLO) process. The laser lift-off process uses a laser, and may use a KrF excimer laser (e.g., having a wavelength of 248 nm) as a source. An energy density of the excimer laser may be in a range of approximately 550 mJ/cm$^2$ to 950 mJ/cm$^2$, and an incident area of the excimer laser may be in a range of 50×50 μm$^2$ to 1×1 cm$^2$, but the present disclosure is not limited thereto.

Next, the wavelength conversion substrate 200 is bonded onto the light emitting element layer 120 to manufacture the display panel 100 (S200 of FIG. 15).

Referring to FIG. 30, an adhesive layer ADL is applied onto the light emitting element layer 120, and the light emitting element layer 120 and the wavelength conversion substrate 200 are aligned with and physically bonded to each other. In this case, the plurality of light emitting elements LE of the light emitting element layer 120 may be disposed to overlap with the plurality of openings OP1, OP2, and OP3 of the wavelength conversion substrate 200. The plurality of openings OP1, OP2, and OP3 may define the plurality of emission areas EA1, EA2, and EA3, and the plurality of light emitting elements LE may overlap with the plurality of emission areas EA1, EA2 and EA3.

The adhesive layer ADL may include a material having excellent transparency, for example, such as an acryl-based material, a silicone-based material, or a urethane-based material. For example, the adhesive layer ADL may be an optical clear resin (OCR). The adhesive layer ADL may be UV-cured or thermally cured. Accordingly, the display panel 100 according to one or more embodiments may be manufactured.

As described above with reference to FIGS. 15 to 30, in the display device 10 according to one or more embodiments, the partition wall PW including silicon may be formed, such that the openings OP1, OP2, and OP3 having the ultra-high resolution may be formed. Accordingly, the display device 10 having the ultra-high resolution may be provided by forming the color filters CF1, CF2, and CF3 in the openings OP1, OP2, and OP3 of the partition wall PW.

Figure 31:
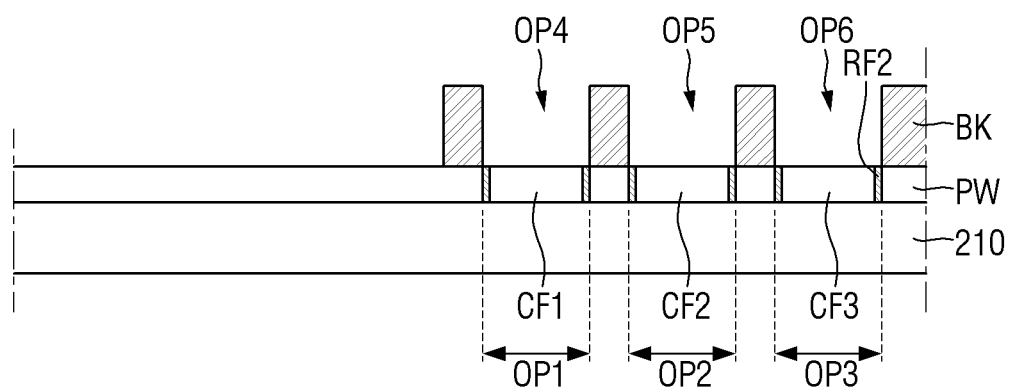
FIGS. 31-32 are cross-sectional views illustrating processes of a method of manufacturing a display panel according to another embodiment.
Figure 32:
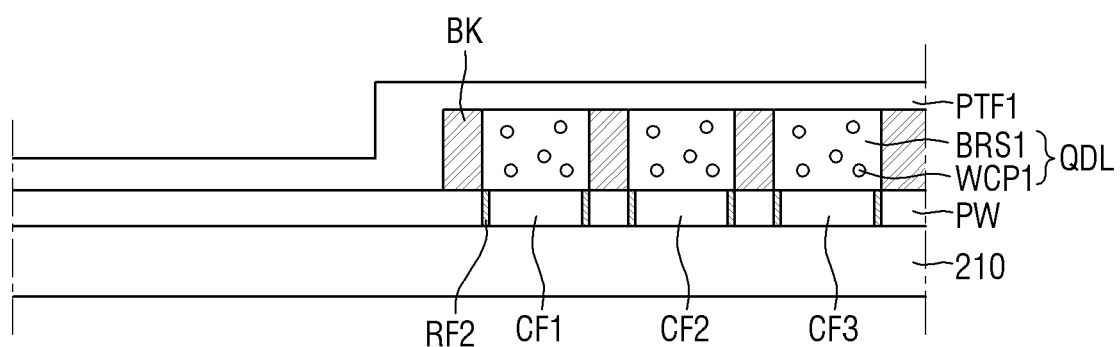

FIGS. 31 and 32 are cross-sectional views illustrating processes of a method of manufacturing a display panel according to another embodiment.

Referring to FIGS. 31 and 32, the method of manufacturing the display panel may be different from the embodiments described above with reference to FIGS. 15 to 30, in that a wavelength conversion substrate 200 including a light blocking member BK may be further manufactured. The wavelength conversion substrate 200 illustrated in FIGS. 31 and 32 may correspond to the structure described above and illustrated in FIG. 13. Hereinafter, a process of forming the light blocking member BK may be described in more detail, and the other processes may be the same or substantially the same as those of FIGS. 15 to 30, and thus, redundant description thereof may not be repeated.

Referring to FIG. 31 in conjunction with FIG. 26, the light blocking member BK is formed on the upper substrate 210 on which the plurality of color filters CF1, CF2, and CF3, the partition wall PW, and the second reflective layers RF2 are formed. The light blocking member BK may be formed by a photo process, and may be formed in a lattice shape so as to surround (e.g., around peripheries of) the plurality of openings OP1, OP2, and OP3. The light blocking member BK may not overlap with the plurality of openings OP1, OP2, and OP3, and may not overlap with the plurality of color filters CF1, CF2, and CF3 and the second reflective layers RF2. A plurality of openings OP4, OP5, and OP6 may be formed in the light blocking member BK. The plurality of openings OP4, OP5, and OP6 may include a fourth opening OP4 corresponding to the first opening OP1 of the partition wall PW, a fifth opening OP5 corresponding to the second opening OP2 of the partition wall PW, and a sixth opening OP6 corresponding to the third opening OP3 of the partition wall PW.

The light blocking member BK may be formed to have a thickness corresponding to a thickness of a wavelength conversion layer QDL described in more detail below. For example, the light blocking member BK may be formed to have a thickness of 5 μm or less, but the present disclosure is not limited thereto.

Next, the wavelength conversion layers QDL are formed in the plurality of openings OP4, OP5, and OP6 of the light blocking member BK. The wavelength conversion layers QDL may be formed to correspond to the plurality of color filters CF1, CF2, and CF3, respectively, and may be formed in the plurality of openings OP4, OP5, and OP6 of the light blocking member BK. The wavelength conversion layers QDL may be formed by a solution process, for example, such as imprinting, but the present disclosure is not limited thereto. The wavelength conversion layers QDL may be formed to overlap with the plurality of color filters CF1, CF2, and CF3 and the second reflective layers RF2.

Next, the first passivation layer PTF1 may be formed on the light blocking member BK, the wavelength conversion layers QDL, and the partition wall PW to manufacture the wavelength conversion substrate 200.

As described above, in the display device according to one or more embodiments, the partition wall having a high aspect ratio may be easily manufactured by forming the partition wall including silicon, and etching the partition wall in a high aspect ratio. Accordingly, the emission areas having ultra-high resolution may be formed, and thus, the display device having ultra-high resolution may be realized.

In addition, in the display device according to one or more embodiments, light emission efficiency of the blue light, the green light, and the red light may be improved by forming the wavelength conversion layers including the light transmission pattern, the first wavelength conversion pattern, and the second wavelength conversion pattern.

Further, in the display device according to one or more embodiments, the first passivation layer may have the same or substantially the same thickness (e.g., at the display area and the non-display area), such that the lower surface of the wavelength conversion substrate adhered to the light emitting element layer may be formed to be flat or substantially flat. Accordingly, adhesion between the wavelength conversion substrate and the light emitting element layer may be easily performed, and an adhesive force between the wavelength conversion substrate and the light emitting element layer may also be improved.

Further, in the display device according to one or more embodiments, the second passivation layer may be provided between the color filters and the wavelength conversion layers to prevent or substantially prevent the color filters from being damaged by a subsequent process.

Further, in the display device according to one or more embodiments, the partition wall may be formed to have a relatively larger thickness, and the color filters and the wavelength conversion layers may be formed in the openings, such that alignment between the color filters and the wavelength conversion layers may be facilitated, and a thickness of the wavelength conversion layers may be increased to improve light conversion efficiency.

Further, in the display device according to one or more embodiments, the display panel may include the light blocking member surrounding (e.g., around peripheries of) the emission areas to prevent or substantially prevent the light from penetrating between the emission areas and mixing the colors, such that color reproduction rate may be improved.

Figure 33:
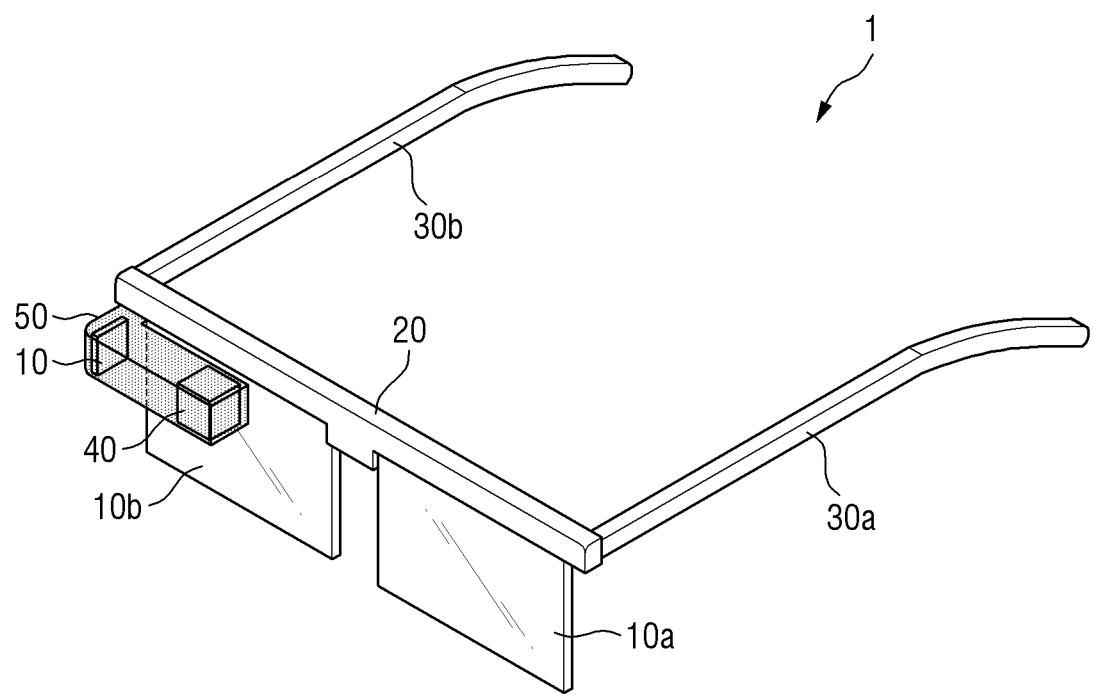
FIG. 33 is an illustrative view illustrating a virtual reality device including a display device according to one or more embodiments.

FIG. 33 is an illustrative view illustrating a virtual reality device including the display device according to one or more embodiments. A virtual reality device 1 to which the display device 10 according to one or more embodiments is applied is illustrated in FIG. 33.

Referring to FIG. 33, the virtual reality device 1 according to an embodiment may be a glasses-type device. The virtual reality device 1 according to an embodiment may include the display device 1, a left eye lens 10a, a right eye lens 10b, a support frame 20, eyeglass frame legs 30a and 30b, a reflective member 40, and a display device accommodating part 50.

The virtual reality device 1 including the eyeglass frame legs 30a and 30b has been illustrated in FIG. 33, but the present disclosure is not limited thereto, and the virtual reality device 1 according to an embodiment may be applied to a head mounted display including a head mounted band that may be mounted on a user's head instead of the eyeglass frame legs 30a and 30b. In other words, the virtual reality device 1 according to an embodiment is not limited to that illustrated in FIG. 33, and may be applied in various suitable forms to various other electronic devices.

The display device accommodating part 50 may include the display device 10 and the reflective member 40. An image displayed on the display device 10 may be reflected by the reflective member 40, and provided to a user's right eye through the right eye lens 10b. Accordingly, a user may view a virtual reality image displayed on the display device 10 through his/her right eye.

While FIG. 33 shows that the display device accommodating part 50 is disposed at a right distal end of the support frame 20, the present disclosure is not limited thereto. For example, the display device accommodating part 50 may be disposed at a left distal end of the support frame 20. In this case, an image displayed on the display device 10 may be reflected by the reflective member 40, and provided to a user's left eye through the left eye lens 10a. Accordingly, the user may view a virtual reality image displayed on the display device 10 through his/her left eye. As another example, the display device accommodating part 50 may be disposed at both the left and right distal ends of the support frame 20. In this case, the user may view a virtual reality image displayed on the display device 10 through both his/her left and right eyes.

Figure 34:
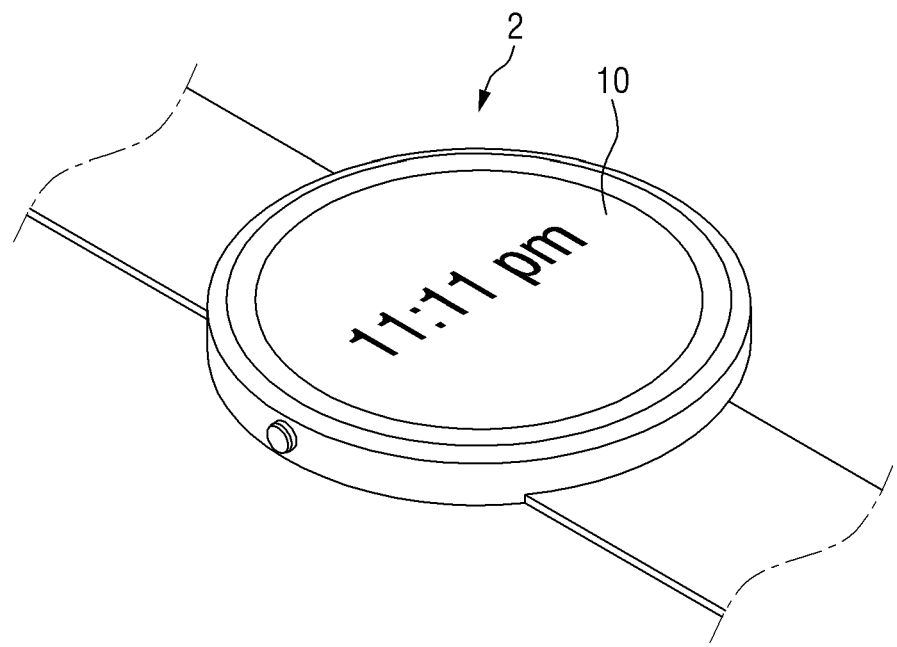
FIG. 34 is an illustrative view illustrating a smart device including a display device according to one or more embodiments.

FIG. 34 is an illustrative view illustrating a smart device including the display device according to one or more embodiments.

Referring to FIG. 34, the display device 10 according to an embodiment may be applied to a smartwatch 2, which is one example of various suitable smart devices.

Figure 35:
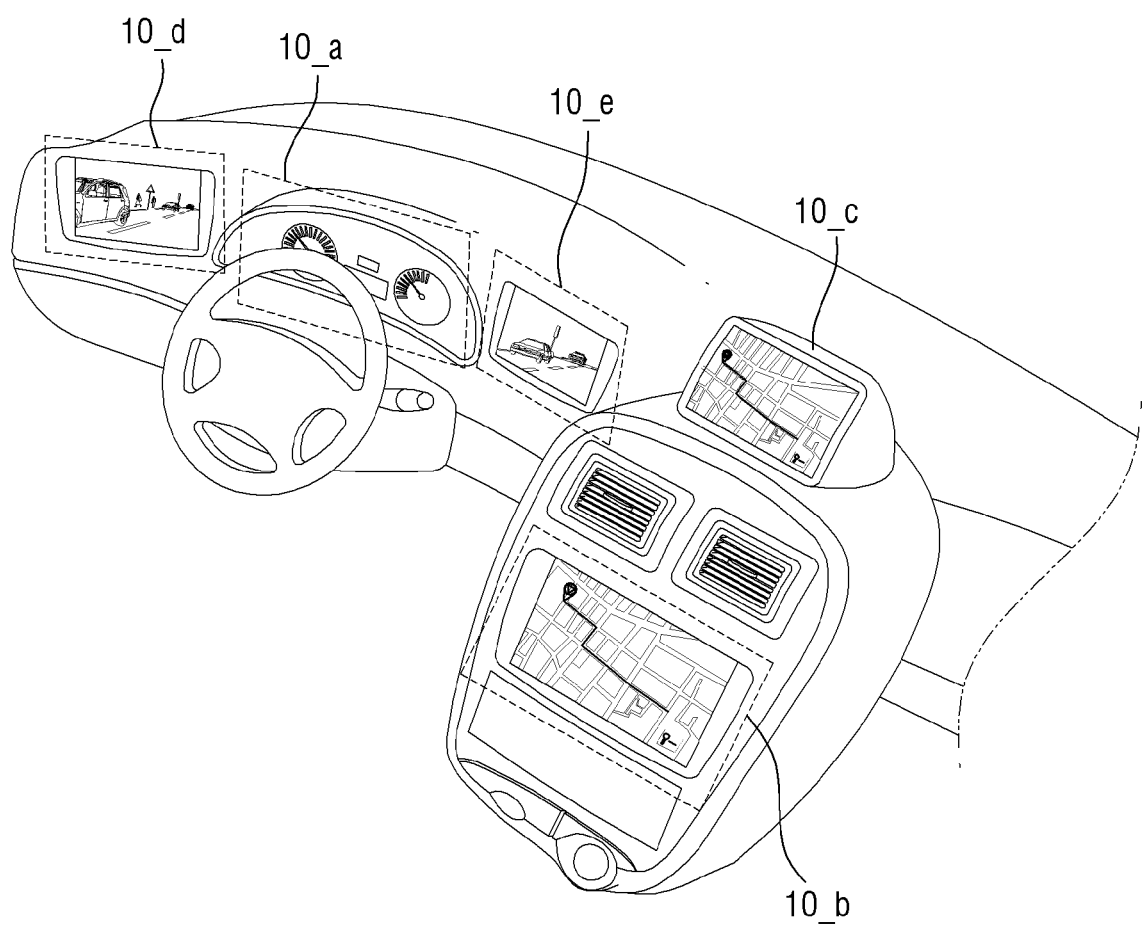
FIG. 35 is an illustrative view illustrating a vehicle including the display device according to an embodiment.

FIG. 35 is an illustrative view illustrating a vehicle including the display device according to one or more embodiments. A vehicle to which the display device 10 according to one or more embodiments is applied is illustrated in FIG. 35.

Referring to FIG. 35, a display device 10_a, 10_b, or 10_c according to an embodiment may be applied to an instrument board of the vehicle, applied to a center fascia of the vehicle, or applied to a center information display (CID) disposed on a dashboard of the vehicle. In addition, a display device 10_d or 10_e according to an embodiment may be applied to a room mirror display substituting for a side mirror of the vehicle.

Figure 36:
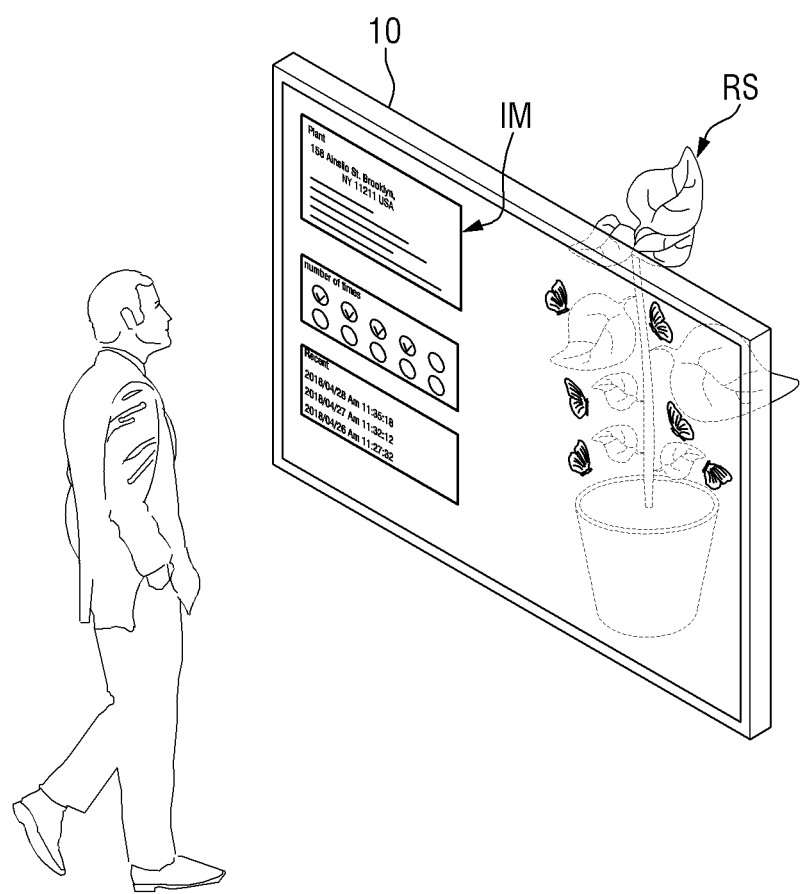
FIG. 36 is an illustrative view illustrating a transparent display device including a display device according to one or more embodiments.

FIG. 36 is an illustrative view illustrating a transparent display device including the display device according to one or more embodiments.

Referring to FIG. 36, the display device 10 according to an embodiment may be applied to a transparent display device. The transparent display device may transmit light while displaying an image IM. Therefore, a user positioned at a front surface of the transparent display device may not only view the image IM displayed on the display device 10, but may also see an object RS or a background positioned at a rear surface of the transparent display device. When the display device 10 is applied to the transparent display device, the semiconductor circuit substrate 100 of the display device 10 (e.g., illustrated in FIG. 4) may include a light transmitting part capable of transmitting light, or may include (e.g., may be made of) a material capable of transmitting light.

Figure 37A:
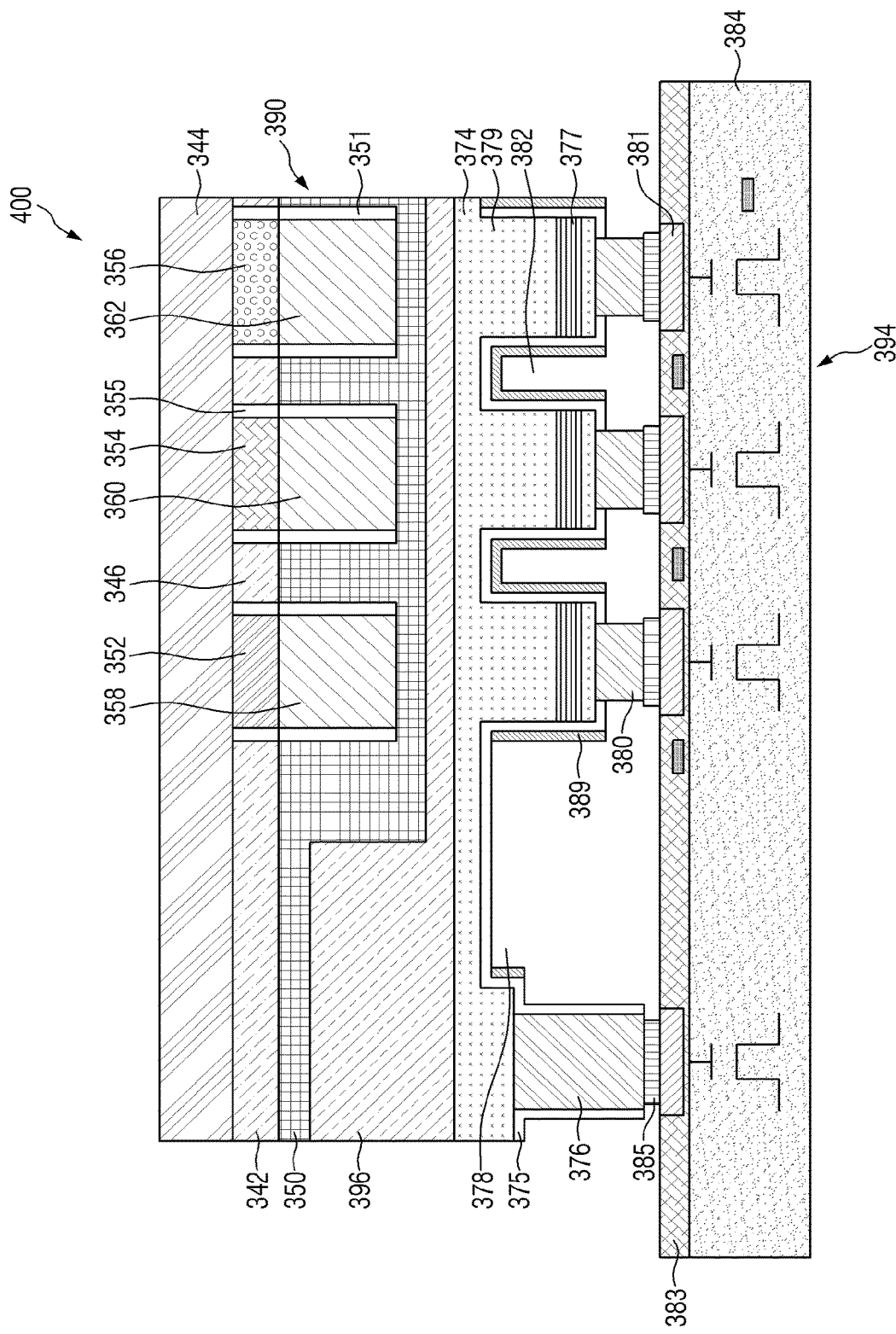
FIG. 37A is a schematic cross-sectional view of a display device according to an embodiment of the present disclosure.

FIG. 37A is a schematic cross-sectional view of a display device 400 according to an embodiment of the present disclosure. The display device 400 includes a color conversion layer 390 and a display layer 394 that are coupled (or combined) with each other. The color conversion layer 390 may also be referred to as an upper substrate or an upper layer, and the display layer 394 may also be referred to as a lower substrate or a lower layer. The display layer 394 includes a driving substrate 384 and a light emitting layer 374 that are coupled (or combined) with each other. By way of example, the light emitting layer 374 may have been bonded to the driving substrate 384 via bonding (e.g., chip-to-wafer bonding) in one or more embodiments.

The driving substrate 384 may be formed on a silicon wafer, and may include a number of CMOS transistors to operate as driving circuitry, such as, for example, driving circuitry for an active matrix display device. One or more layers 383 may be formed or coated on the driving substrate 384. The one or more layers 383 may include one or more of a buffer layer, a passivation layer, an insulation layer, and a planarization layer, but the present disclosure is not limited thereto.

A number of first electrical contacts (e.g., first contact metals) 381 may be formed on or placed on the one or more layers 383, and may have a portion embedded in the one or more layers 383. Hence, the first electrical contacts 381 may be partially embedded in the one or more layers 383. In some embodiments, the first electrical contacts 381 may be located on an upper surface of the one or more layers 383. The first electrical contacts 381 may be formed of aluminum, but the present disclosure is not limited thereto, and any suitable metal, semiconductor or other material for transferring signals and/or power between the driving substrate 384 and the light emitting layer 374 may be used to form the first electrical contacts 381.

Located on top of the first electrical contacts 381 are respective second electrical contacts (e.g., second contact metals) 385. The second electrical contacts 381 may be made of, for example, SAC 305 including 96.5 wt %, 3.0 wt %, 0.5 wt % respectively of tin (Sn), silver (Ag) and copper (Cu); AuSn including 70 wt % and 30 wt % respectively of gold (Au) and tin (Sn), 80 wt % and 20 wt % respectively of gold (Au) and tin (Sn), or 90 wt % and 10 wt % respectively of gold (Au) and tin (Sn); or gold (Au), tin (Sn), or copper (Cu), and/or the like. However, the present disclosure is not limited thereto, and any other suitable combinations of known materials (e.g., metals) may be used to fabricate the second electrical contacts 385.

The light emitting layer 374 includes a plurality of light emitting diodes (LEDs) 379, which may have a micro scale size, and may be referred to as micro LEDs. For example, the LEDs 379 may have been fabricated from a layer of gallium nitride (GaN) that has been epitaxially grown on a substrate (e.g., a sapphire substrate), however, the present disclosure is not limited thereto. Each of the LEDs may have formed therein multi quantum wells (MQW) 377 for emitting light (e.g., a blue light). The LEDs 379 are spaced from each other by a gap (or an interval) 382 therebetween.

The LEDs 379 have formed or placed thereon respective second electrodes 380. By way of example, the second electrodes 380 may be anodes (or anode electrodes) when ends (e.g., bottom ends shown in FIG. 37A) of the LEDs 379 at which the second electrodes 380 are placed (e.g., formed or attached) are P-side of the LEDs 379. Further, the second electrodes 380 may be cathodes (or cathode electrodes) when the ends (e.g., the bottom ends shown in FIG. 37A) of the LEDs 379 at which the second electrodes are placed (e.g., formed or attached) are N-side of the LEDs 379. By way of example, the P-side of the LEDs may have been doped with magnesium (Mg), and the N-side of the LEDs may have been doped with silicon (Si), but the present disclosure is not limited thereto, and any other suitable P-type and N-type doping materials known to those of ordinary skill in the art may be used.

A first electrode 376 is spaced from the LEDs 379 with a gap 378 therebetween. The first electrode 376 is to be applied with a polarity (or sign) of voltage that is opposite to that of the second electrodes 380. For example, when the second electrodes 380 are anodes (or anode electrodes), the first electrode 376 is a cathode (or a cathode electrode), and when the second electrodes 380 are cathodes (or cathode electrodes), the first electrode 376 is an anode (or an anode electrode). Unlike the second electrodes 380, the first electrode is common to multiple LEDs 379 of the light emitting layer 374. Therefore, the first electrode 376 may also be referred to as a common electrode.

As shown in FIG. 37A, a passivation layer 375 is formed (or coated) on exposed surfaces of the light emitting layer 374 (including the LEDs 379) as well as the first electrode 376. The passivation layer 375 may protect the underlying devices (e.g., the light emitting layer 374 including the LEDs 379) from external environment such as moisture and/or heat. In one or more other embodiments, the passivation layer may also be formed (or coated) on exposed surfaces of the second electrodes 380. In one or more other embodiments, a reflector (e.g., a metal layer or a reflecting metal) 389 may be placed (e.g., formed or coated) on side surfaces of the LEDs 379 so as to prevent light from leaking from one LED to another. In one or more embodiments, the reflector 389 may be made of aluminum (Al), however, the present disclosure is not limited thereto, and the reflector 389 may be made of any suitable metal or other material that is known to those of ordinary skill in the art. Also, the thickness of the reflector 389 may be between about 1 μm and about 100 μm, but the present disclosure is not limited thereto. While the reflector 389 may not be specifically illustrated in some of the drawings, those of ordinary skill in the art would know that the reflector 389 or a similar reflecting member would be on side surfaces of the LEDs according to one or more embodiments. It is illustrated in FIGS. 41A-B, 42 and 43, for example, one or more layers 371 are formed (or coated) on the light emitting layer 374 including the LEDs 379, and the side surfaces of the first electrode 376. The one or more layers 371 may include the passivation layer 375, the reflector 389 (for example, see FIGS. 37A and 37B), and/or any other suitable layer or layers known to those skilled in the art.

The second electrical contacts 385 may be formed or placed on the first electrode 376 and/or the plurality of second electrodes 380. In some embodiments, the second electrical contacts 385 that are formed or placed on the first electrode 376 and the plurality of second electrodes 380, are used when the light emitting layer 374 is combined with (or attached to) the driving substrate 384. Here, the light emitting layer 374 may be referred to as a chip or a micro LED chip, and the light emitting layer 374 (a chip or a micro LED chip) may be combined with (or attached to) the driving substrate 384 via chip-to-wafer (C2W) bonding, however, the present disclosure is not limited thereto. The process of fabricating the display layer 394 including the light emitting layer 374, the LEDs 379, and the display substrate 384 will be discussed in more detail below in reference to FIGS. 38, 41A-B and 44 according to one or more embodiments of the present disclosure.

The color conversion layer 390 includes a sapphire substrate 344 on which a color filter layer (e.g., formed from a silicon layer) 342 is placed. By way of example, the color filter layer (e.g., formed from a silicon layer) 342 may be an epitaxial silicon layer that was epitaxially grown on the sapphire substrate 344, however, the present disclosure is not limited thereto. The color filter layer (e.g., formed from a silicon layer) 342, based on the thickness of the silicon layer, may have a thickness of about 1 μm to a few μm or more, however, the present disclosure is not limited thereto.

In one or more embodiments, the thickness of the silicon layer may be about 3 μm to about 5 μm, for example.

The sapphire substrate 344 may have a thickness of about 600 μm with some variations (e.g., ±15 μm or less) in thickness, however, the present disclosure is not limited thereto, and any suitable thickness less than or more than 600 μm may be used in one or more other embodiments. When the silicon layer is epitaxially grown on the sapphire substrate 344, stress may be caused due to lattice mismatching, such that sapphire may be bent. Therefore, the sapphire substrate 344 should have a suitable thickness to prevent or reduce bending or deformation thereof due to lattice mismatching or the like.

The color filter layer 342 has a plurality of openings in which color filters 352, 354, 356 are located (e.g., placed or formed). While color filters 352, 354 and 356 are red, green and blue in color, respectively, the present disclosure is not limited thereto. For example, the color filters 352, 354 and 356 in one or more other embodiments may have other suitable colors used together to represent full or partially full colors. Further, there may be more of one color filter from among the red, green and blue color filters than other filters having the other two colors. For example, there may be twice as many green color filters as there are red and blue color filters in one or more embodiments. Further, the color filter layer 342 may include a clear or transparent material or window, in addition to, or instead of, one or more red, green and/or blue color filters, to allow the emitted light to pass therethrough without substantive change in components, luminosity, or frequency of the light. Each of the color filters may be surrounded along its edge or periphery by a peripheral layer 355. In one or more embodiments, the peripheral layer 355 may include a reflective metal and/or a black matrix for preventing light leakage, or may be a passivation layer, but the present disclosure is not limited thereto.

On each of the red color filter 352, the green color filter 354 and the blue color filter 356 is a respective white quantum dot (W-QD) layer 358, 360 or 362. In one or more embodiments, the W-QD may be formed by a mixture of red quantum dots (R-QD) and green quantum dots (G-QD), and may be yellowish in color. When a blue light is incident on (or applied to) the W-QD layer 358, 360 or 362, the W-QD layer converts the frequency of the blue light to a frequency or frequencies corresponding to a white or substantially white light. The W-QD layers 358, 360 and 362 may each have a thickness of about 5 μm to about 7 μm, however, the present disclosure is not limited thereto, and the W-QD layers 358, 360 and 362 may each have any other suitable thickness. In one or more embodiments, an imprint method may be used to form the W-QD layers 358, 360 and 362, however, the present disclosure is not limited thereto. In one or more embodiments, the W-QD layers 358, 360 and 362 may each be formed using a photolithographic process, or any other suitable process that is known to those of ordinary skill in the art.

According to one or more embodiments, the quantum dots included in the W-QD layers 358, 360 and 362 may include a nanocrystalline material, such as a silicon-based nanocrystal, a group II-VI-based compound semiconductor nanocrystal, a group III-V-based compound semiconductor nanocrystal, a group IV-VI-based compound semiconductor nanocrystal, or a mixture thereof. The group II-VI-based compound semiconductor nanocrystal may include at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The group III-V-based compound semiconductor nanocrystal may include at least one selected from GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The group IV-VI-based compound semiconductor nanocrystal may include SbTe. However, the present disclosure is not limited to these particular materials for quantum dots.

A passivation and/or planarization layer 350 may be formed to surround W-QD layers 358, 360 and 362. In other words, the W-QD layers 358, 360 and 362 may be encased or embedded in the passivation and/or planarization layer 350. The passivation and/or planarization layer 350, for example, may protect the W-QD layers 358, 360 and 362 from environment, such as, for example, from heat and/or moisture. The passivation and/or planarization layer 350 may be made of an organic material, an inorganic material, or a suitable combination or layers (e.g., a stack) of organic materials and inorganic materials. The organic and/or inorganic materials may be transparent or semi-transparent. By way of example, the inorganic material may be silicon oxide (SiOx) or silicon nitride (SixNy), and the organic material may include acrylate, however, the present disclosure is not limited thereto.

In one or more other embodiments, a reflector (e.g., a metal layer or a reflecting metal) 351 may be placed (e.g., formed or coated) on side surfaces of the W-QD layers 358, 360 and 362 so as to prevent light from leaking from one W-QD layer to an adjacent W-QD layer. In one or more embodiments, the reflector 351 may be made of aluminum (Al), however, the present disclosure is not limited thereto, and the reflector 351 may be made of any suitable metal or other material that is known to those of ordinary skill in the art. Also, the thickness of the reflector 351 may be between about 1 μm and about 100 μm, but the present disclosure is not limited thereto. While the reflector 351 may not be specifically illustrated in some of the drawings, those of ordinary skill in the art would understand that one or more embodiments may include the reflector 351 or a similar reflecting member around or surrounding the QD layers to prevent or reduce leakage of light to adjacent QD layer or layers.

The color filter layer 390 is combined with the displayer layer 394 using an adhesive layer 396 applied to the passivation and/or planarization layer 350. The adhesive layer 396 may be formed of one of various suitable adhesive materials that are known to those of ordinary skill in the art. The adhesive layer 396 in one or more embodiments, for example, may be made of optically clear resin (OCR), which may be acryl type, silicone type, or urethane type, and may have good or suitable transparency, and may be hardened using ultraviolet radiation or heat (i.e., thermally hardened). The process of fabricating the color conversion layer 390 including the sapphire substrate 344, the color filters 352, 354 and 356, and the W-QD layers 358, 360 and 362 will be discussed in more detail below with references to FIGS. 39A, 40A-B, 41A-B and 42 according to one or more embodiments of the present disclosure.

Figure 37B:
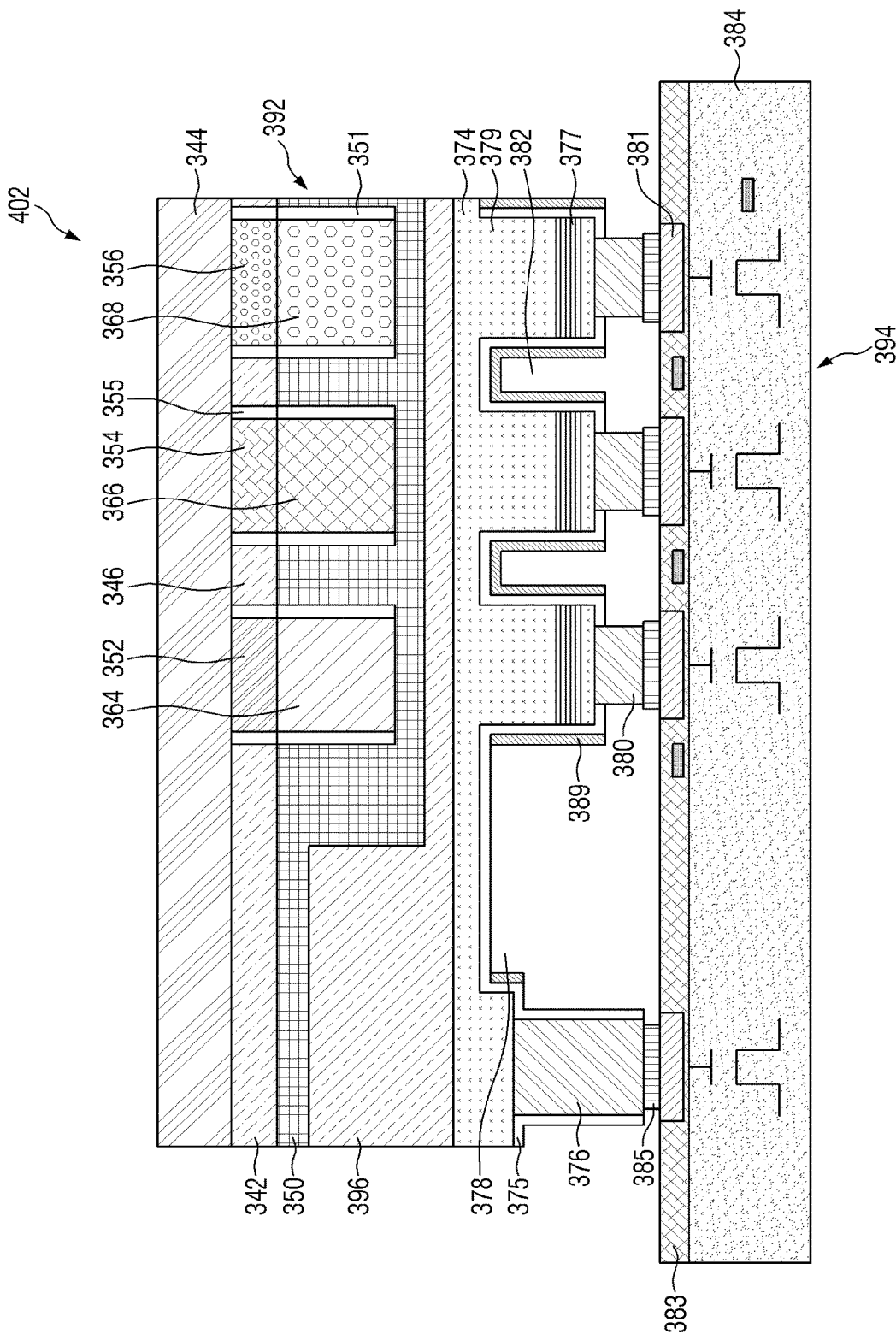
FIG. 37B is a schematic cross-sectional view of a display device according to an embodiment of the present disclosure.

FIG. 37B is a schematic cross-sectional view of a display device 402 according to an embodiment of the present disclosure. The display device 402 includes a color conversion layer 392 and the display layer 394 that are coupled (or combined) with each other. The display layer 394 includes the driving substrate 384 and the light emitting layer 374 that are coupled (or combined) with each other. By way of example, the light emitting layer 374 may have been bonded to the driving substrate 384 via bonding (e.g., chip-to-wafer (C2 W) bonding) in one or more embodiments. As the display layer 394 is substantially the same as the display layer 394 of FIG. 37A according to one or more embodiments, a redundant description of the display layer 394 will not be repeated herein.

The color conversion layer 392 includes a sapphire substrate 344 on which a color filter layer (e.g., formed from a silicon layer) 342 is placed. By way of example, the color filter layer (e.g., formed from a silicon layer) 342 may be an epitaxial silicon layer that was epitaxially grown on the sapphire substrate 344, however, the present disclosure is not limited thereto. The color filter layer (e.g., formed from a silicon layer) 342 may have a thickness of about 1 μm to a few μm or more, however, the present disclosure is not limited thereto. The sapphire substrate may have a thickness of about 600 μm with some variations (e.g., ±15 μm or less) in thickness, however, the present disclosure is not limited thereto, and any suitable thickness less than or more than 600 μm may be used in one or more other embodiments.

The color filter layer 342 has a plurality of openings in which color filters 352, 354, 356 are located (e.g., placed or formed). While color filters 352, 354 and 356 are red, green and blue in color, respectively, the present disclosure is not limited thereto. For example, the color filters 352, 354 and 356 in one or more other embodiments may have other suitable colors used to together represent full or partially full colors. Further, there may be more of one color filter from among the red, green and blue color filters than filters having other two colors. For example, there may be twice as many green color filters as red and blue color filters in one or more embodiments. Further, the color filter layer 342 may include a clear or transparent material or window, in addition to or instead of one or more red, green and/or blue color filters, to allow the emitted light to pass therethrough without substantive change in components, luminosity, or frequency of light. Each of the color filters may be surrounded along its edge or periphery by a peripheral layer 355. In one or more embodiments, the peripheral layer 355 may be a reflective metal and/or a black matrix for preventing light leakage, or may be a passivation layer, but the present disclosure is not limited thereto.

A red quantum dot (R-QD) layer 364 is formed on the red color filter 352, a green quantum dot (G-QD) layer 366 is formed on the green color filter 354, and a scattering layer and/or a filler 368 is formed on the blue color filter 356. The R-QD layer 364 is configured to convert a blue light from the LED into a red light, and the G-QD layer 366 is configured to convert a blue light from the LED into a green light. The scattering layer and/or the/filler 368 does not convert the color of light. The scattering layer and/or the filler 368 receives a blue light and passes through the blue light to the blue color filter 356. While the R-QD layer 364, the G-QD layer 366 and the scattering layer and/or the filler 368 may emit or pass through red, green and blue color lights, respectively, the corresponding red, green and blue color filters 352, 354 and 356 may improve or enhance color purity as desired.

The R-QD layer 364, the G-QD layer 366, and the scattering layer and/or the filler 368 may each have a thickness of about 5 μm to about 7 μm, however, the present disclosure is not limited thereto, and the R-QD layer 364, the G-QD layer 366, and the scattering layer and/or the filler 368 may each have any other suitable thickness. In one or more embodiments, a photolithographic process may be used to form the R-QD layer 364 and the G-QD layer 366, however, the present disclosure is not limited thereto. In one or more embodiments, the R-QD layer 364 and the G-QD layer 366 may each be formed using an imprint method, or any other suitable method that is known to those of ordinary skill in the art.

According to one or more embodiments, the quantum dots included in the R-QD layer 364 and the G-QD layer 366 may include a nanocrystalline material, such as a silicon-based nanocrystal, a group II-VI-based compound semiconductor nanocrystal, a group III-V-based compound semiconductor nanocrystal, a group IV-VI-based compound semiconductor nanocrystal, or a mixture thereof. The group II-VI-based compound semiconductor nanocrystal may include at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The group III-V-based compound semiconductor nanocrystal may include at least one selected from GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The group IV-VI-based compound semiconductor nanocrystal may include SbTe. However, the present disclosure is not limited to these particular materials for quantum dots.

A passivation and/or planarization layer 350 may be formed to surround the R-QD layer 364, the G-QD layer 366 and the scattering layer and/or the filler 368. In other words, the R-QD layer 364, the G-QD layer 366 and the scattering layer and/or the filler 368 may be encased or embedded in the passivation and/or planarization layer 350. The passivation and/or planarization layer 350, for example, may prevent the R-QD layer 364, the G-QD layer 366 and the scattering layer and/or the filler 368 from environment, such as, for example, from heat and/or moisture. The passivation and/or planarization layer 350 may be made of an organic material, an inorganic material, or a suitable combination or layers (e.g., a stack) of organic materials and inorganic materials. The organic and/or inorganic materials may be transparent or semi-transparent. By way of example, the inorganic material may be silicon oxide (SiOx) or silicon nitride (SixNy), and the organic material may include acrylate, however, the present disclosure is not limited thereto.

In one or more other embodiments, a reflector (e.g., a metal layer or a reflecting metal) 351 may be placed (e.g., formed or coated) on side surfaces of the R-QD layer 364, the G-QD layer 366 and the scattering layer and/or the filler 368, so as to prevent light from leaking from one QD layer or the scattering layer and/or the filler 368 to an adjacent QD layer or the scattering layer and/or the filler 368. In one or more embodiments, the reflector 351 may be made of aluminum (Al), however, the present disclosure is not limited thereto, and the reflector 351 may be made of any suitable metal or other material that is known to those of ordinary skill in the art. Also, the thickness of the reflector 351 may be between about 1 μm and about 100 μm, but the present disclosure is not limited thereto. While the reflector 351 may not be specifically illustrated in some of the drawings, those of ordinary skill in the art would understand that one or more embodiments may include the reflector 351 or a similar reflecting member around or surrounding the QD layers and/or the scattering layer and/or the filler 368 to prevent or reduce leakage of light to adjacent QD layer or layers, or the scattering layer and/or the filler 368.

The color filter layer 392 is combined with the displayer layer 394 using an adhesive layer 396 applied to the passivation and/or planarization layer 350. The adhesive layer 396 may be formed of one of various suitable adhesive material that is known to those of ordinary skill in the art. The adhesive layer 396 in one or more embodiments, for example, may be made of optically clear resin (OCR), which may be acryl type, silicone type, or urethane type, and may have good or suitable transparency, and may be hardened using ultraviolet radiation or heat (i.e., thermally hardened). The process of fabricating the color conversion layer 392 including the sapphire substrate 344, the color filters 352, 354 and 356, the R-QD layer 364, the G-QD layer 366 and the scattering layer and/or the filler 368 will be discussed in more detail below in reference to FIGS. 39B, 40A-B, 41A-B and 43 according to one or more embodiments of the present disclosure.

Figure 38:
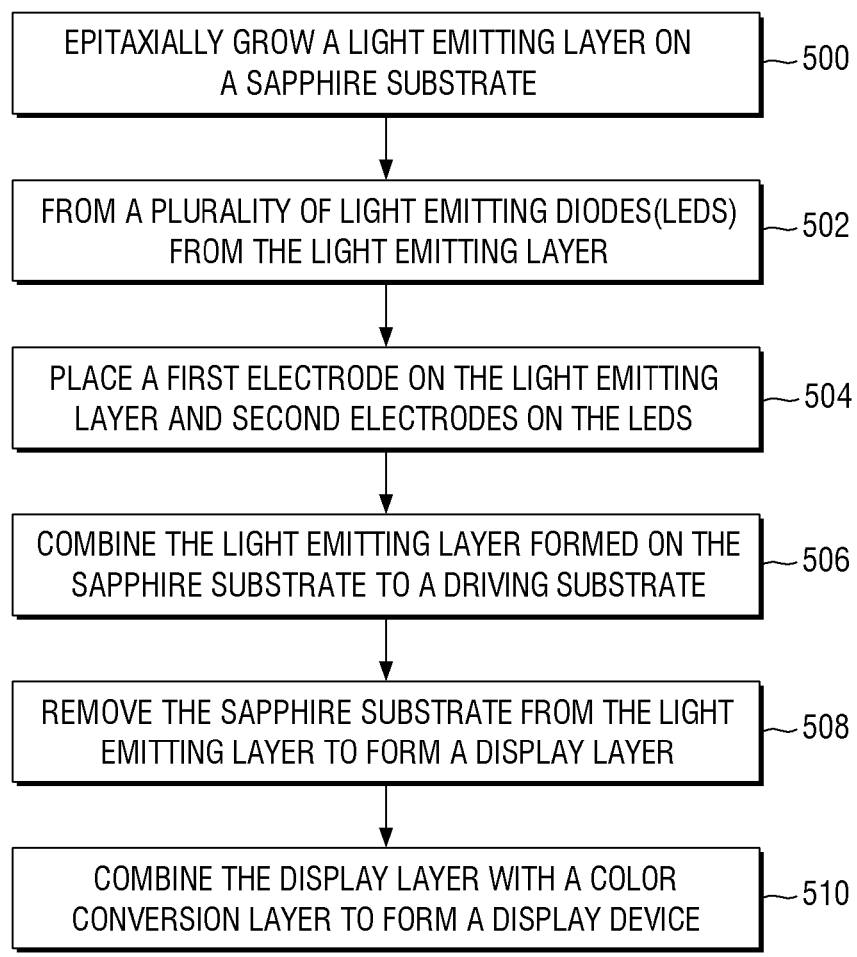
FIG. 38 is a flow diagram illustrating a process of fabricating the display device of FIG. 37A or FIG. 37B.
Figure 41A:
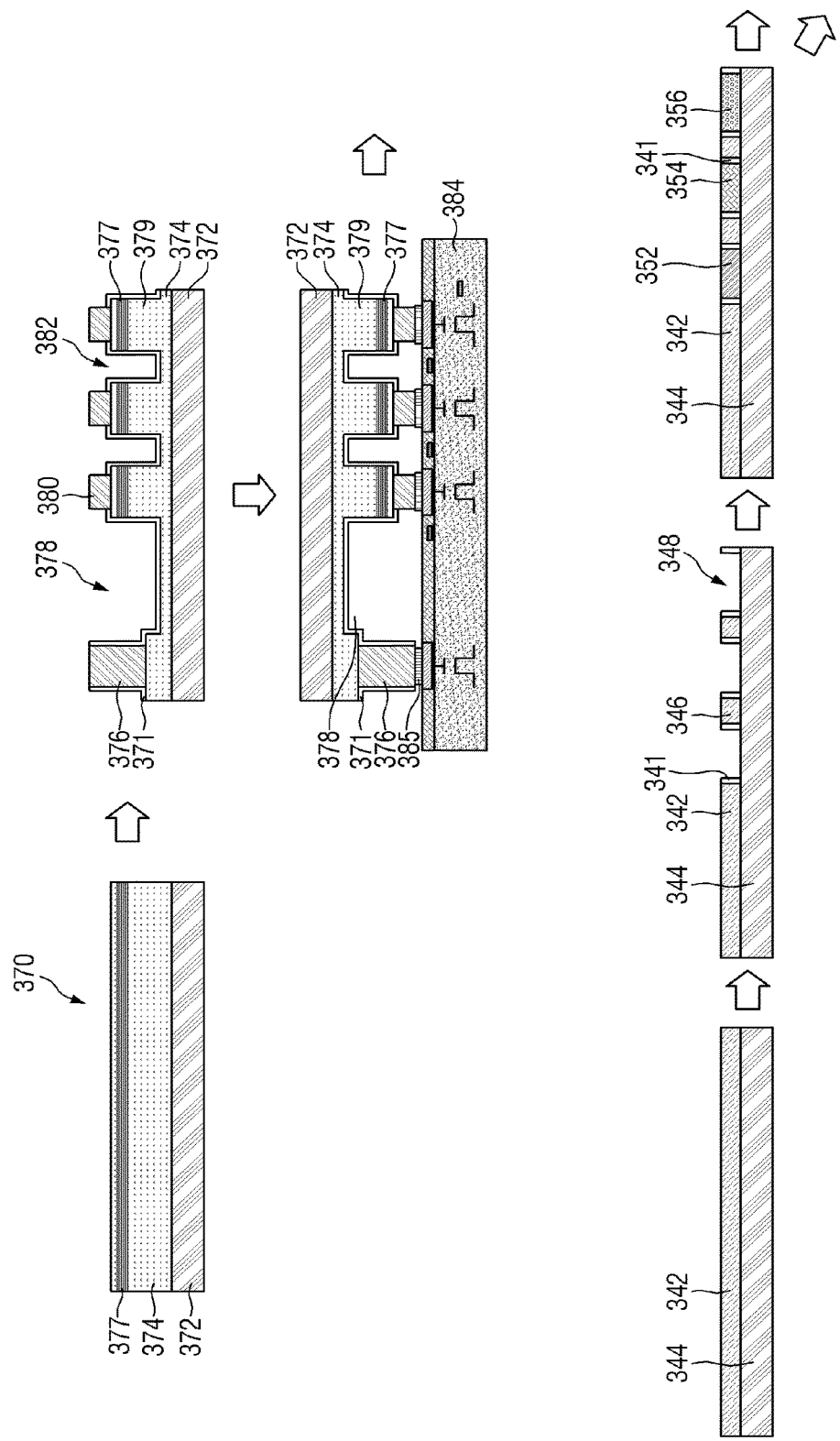
FIGS. 41A and 41B illustrate a process of fabricating a display device according to one or more embodiments of the present disclosure.
Figure 41B:
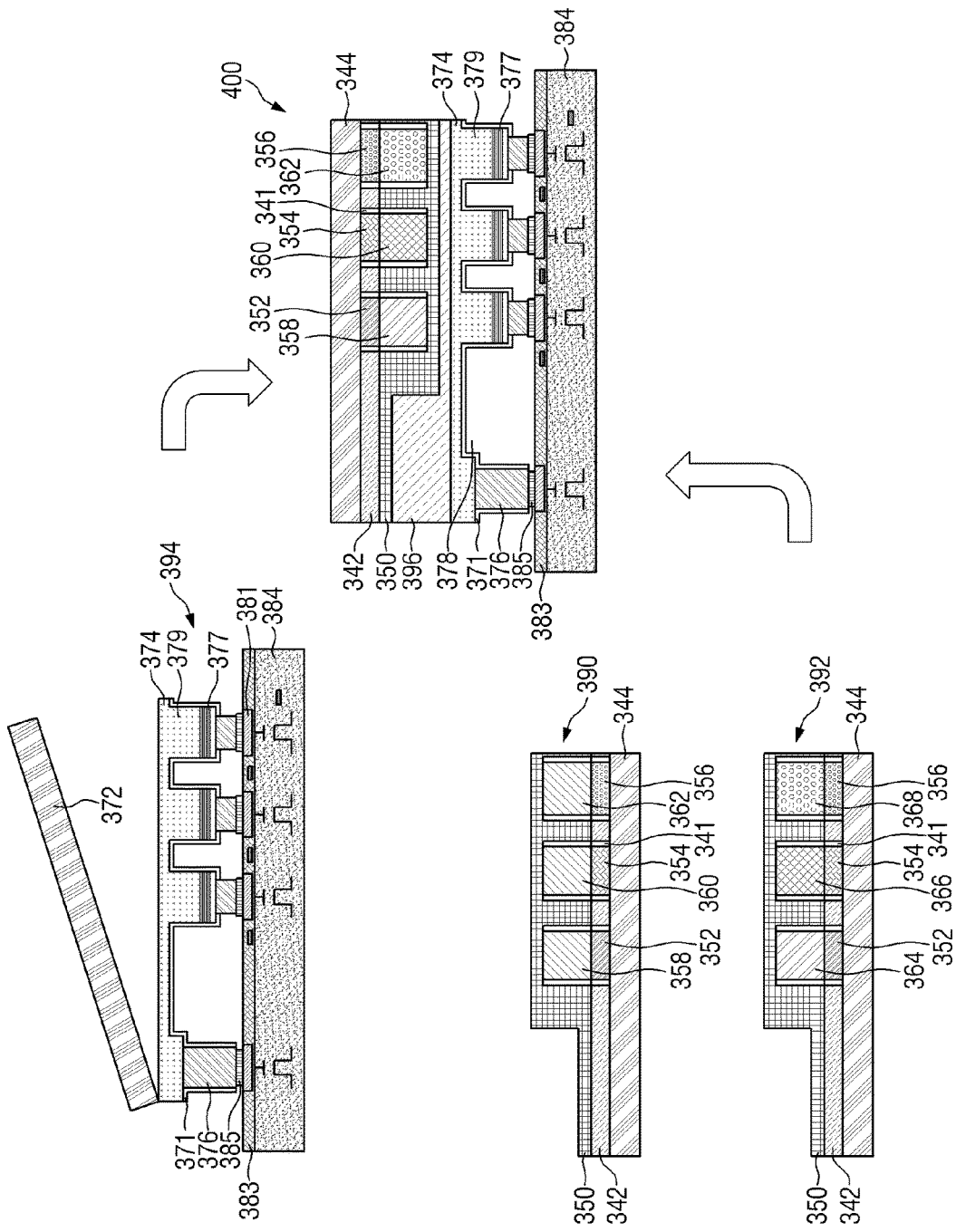

FIG. 38 is a flow diagram illustrating a process of fabricating the display device of FIG. 37A or FIG. 37B with emphasis on the display layer 394. FIGS. 41A and 41B illustrate a process of fabricating a display device according to one or more embodiments of the present disclosure, including the fabrication of the display layer 394, and FIG. 44 illustrates a process of fabricating the display layer 394.

Figure 44:
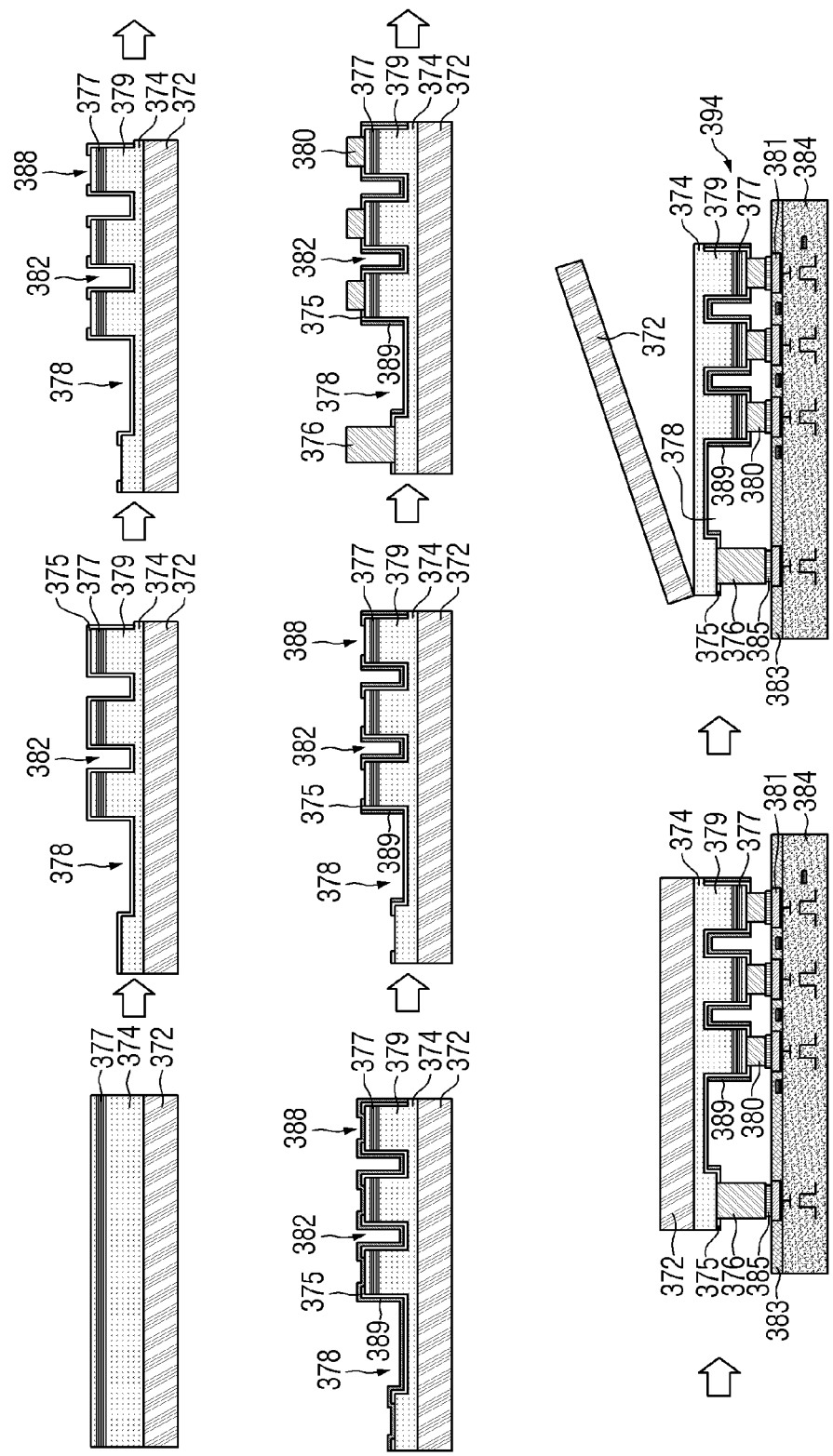
FIG. 44 illustrates a process of fabricating a display substrate according to one or more embodiments of the present disclosure.

In box 500 of FIG. 38, as shown in FIGS. 41A-B and 44, the light emitting layer 374 is epitaxially grown on the sapphire substrate 372 to form a chip substrate 370. The sapphire substrate may have a thickness of about 600 μm with some variations (e.g., ±15 μm or less) in thickness, however, the present disclosure is not limited thereto. In one or more embodiments, the thickness of the sapphire substrate may be any suitable thickness less than or more than 600 μm. The light emitting layer 374, for example, may be made of epitaxially grown gallium nitride (GaN), and may have multiple quantum wells (MQW) for light emitting formed therein. However, the present disclosure is not limited to any particular material for the light emitting layer 374. The light emitting layer 374 may be doped to create a PN junction for light emission when suitable voltage is applied across the PN junction. By way of example, the side (i.e., one end) attached to the sapphire substrate 372 may be doped with a N-type material such as silicon, and the side (i.e., the other end) away from the sapphire substrate 372 may be doped with a P-type material such as magnesium. However, the present disclosure is not limited to any particular doping materials or as to which side is doped with N-type or P-type material.

In box 502 of FIG. 38, a plurality of light emitting diodes 379 are formed from the light emitting layer 374. By way of example, as can be seen in FIGS. 41A and 41B, the chip substrate 370 is processed (e.g., through a chip process) to fabricate a plurality of LEDs (e.g., micro LEDs). In the LED fabrication process, portions of the light emitting layer 374 are removed (e.g., via etching or any other suitable method) to form a plurality of LEDs that are separated (e.g., spaced from each other) by gaps (or intervals) 382. As can be seen in FIGS. 41A and 41B, one end of each of the LEDs 379 remains attached and integral to the light emitting layer 374. The first electrode 376 (e.g., a cathode or a cathode electrode) is formed or positioned on the light emitting layer 374 at a location separated by a gap 378 from the LEDs 379. The plurality of second electrodes (e.g., anodes or anode electrodes) 380 are formed or positioned on respective ones of the LEDs 379. Therefore, after the LED fabrication process (e.g., the chip process including etching) has been completed, the plurality of LEDs 379 that are electrically connected to the first electrode 376 and respective second electrodes 380 have been fabricated. In one or more embodiments, the first electrode 376 is a common cathode electrode, and the second electrodes 380 are anode electrodes (e.g., pixel electrodes), but the present disclosure is not limited thereto. For example, in one or more other embodiments, the first electrode 376 may be a common anode electrode and the second electrodes 380 may be pixelized cathode electrodes.

The fabrication process for the LEDs (e.g., box 502 of FIG. 38) according to one or more embodiments are described in more detail with reference to FIG. 44. First, portions of the light emitting layer 374 are removed through etching (e.g., mesa etching) to form a plurality of LEDs 379, each of the LEDs including multi quantum wells (MQW) for emitting light. By way of example, the LEDs 379 may be fabricated from gallium nitride (GaN) and configured to emit a blue light (or a blue color light), but the present disclosure is not limited thereto. The LEDs 379 are separated from each other via gaps (or intervals) 382, and the LED 379 that is closest to a first electrode contact point may be spaced from the first electrode contact point by a gap 378, for example. One end of each of the LEDs 379 remain attached to and integral to the light emitting layer 374.

After fabrication of the LEDs 379, a passivation layer 375 may be formed (applied or coated, for example) on a surface (e.g., an entire surface) of the light emitting layer 374 including top and side surfaces of LEDs 379. The passivation layer 375 may have a thickness of between about 1 μm and about 100 μm, but the present disclosure is not limited thereto, and the thickness of the passivation layer 375 may be any suitable thickness less than about 1 μm or greater that about 100 μm in one or more embodiments of the present disclosure. The passivation material, for example, may include one or more of silicon oxide (SiOx), aluminum oxide ($Al_2O_3$) or hafnium oxide (HfOx), but the present disclosure is not limited thereto, and any suitable material known to those of ordinary skill in the art may be used to form the passivation layer 375.

After the passivation layer 375 is formed, portions of the passivation layer 375 are removed (e.g., openings 388 are formed) to expose portions of the underlying structure to place (e.g., form) the first electrode 376 and the second electrodes 380 (e.g., see box 504 of FIG. 38). For example, contact locations for the first electrode 376 and the second electrodes 380 may be removed to form the openings 388. To remove portions of the passivation layer 375, any suitable process (e.g., etching or any other suitable method of selectively removing portions of the passivation layer) known to those of ordinary skill in the art may be used.

After the openings 388 are formed in the passivation layer 375, a metal layer 389 is deposited on a surface (e.g., an entire surface) of the light emitting layer 374 including the passivation layer 375 and the areas exposed by the openings in the passivation layer. The metal layer 389 may be deposited using vapor deposition or any other suitable method known to those of ordinary skill in the art. In one or more embodiments, the metal in the metal layer 389 may be a reflective metal, such as, for example, aluminum (Al), but the present disclosure is not limited thereto. Also, the thickness of the metal layer 389 may be between about 1 μm and about 100 μm, but the present disclosure is not limited thereto. In one or more embodiments, one reason for forming the metal layer 389 is to reflect light generated by the LEDs 379 such that the generated light is not leaked into surrounding areas, thereby creating light interference between lights emitted by neighboring LEDs 379 and/or unintended luminosity (or brightness) at one or more pixels.

After the metal layer 389 is deposited on the surface (e.g., the entire surface) of the light emitting layer 374, portions of the metal layer 389 are removed from top surfaces of the LEDs 379 and a surface of the light emitting layer 374 including and around an area where the first electrode 376 is to be formed (or positioned), using a process (e.g., etching or any other suitable process) that is known to those of ordinary skill in the art.

After the portions of the metal layer 389 are removed from the metal layer 389 as shown in FIG. 44, the first electrode 376 and the second electrodes 380 are formed (or positioned) at locations where the portions of the metal layer 389 have been removed. In one or more embodiments, one reason for removing the portions of the metal layer is to ensure that the first electrode 376 and the second electrodes 380 are electrically isolated from each other such that there is no electrical short created by the metal layer 389 contacting two or more of the first and second electrodes. The first electrode 376 and the second electrodes 380 may be made of, for example, SAC 305 including 96.5 wt %, 3.0 wt %, 0.5 wt % respectively of tin (Sn), silver (Ag) and copper (Cu); AuSn including 70 wt % and 30 wt % respectively of gold (Au) and tin (Sn), 80 wt % and 20 wt % respectively of gold (Au) and tin (Sn), or 90 wt % and 10 wt % respectively of gold (Au) and tin (Sn); or gold (Au), tin (Sn), or copper (Cu), and/or the like. However, the present disclosure is not limited thereto, and any other suitable combinations of known materials (e.g., metals) may be used to fabricate the first electrode 376 and/or second electrodes 380. In some embodiments, a passivation layer (e.g., a passivation layer substantially similar to the passivation layer 375), may be formed (or coated) on side surfaces of the first electrode 376 and/or second electrodes 380.

After the first electrode 376 is formed on the light emitting layer 374 and the second electrodes 380 are formed on the LEDs 379, in box 506 of FIG. 38, light emitting layer 374 and the LEDs 379 (of the LED chip or chip) formed on the sapphire substrate 372 are combined with the driving substrate 384 to form the display layer 394 as shown in FIGS. 41A-B and 44. The combination (or attachment) may take place using chip-to-wafer (C2 W) bonding as those of ordinary skill in the art would appreciate after studying the present disclosure.

After the light emitting layer 374 and the LEDs 379 are combined with the driving substrate 384, in box 508 of FIG. 38, the sapphire substrate 372 is removed from the light emitting diodes to form the display layer. The sapphire substrate 372 may be removed through a laser lift off (LLO) process, for example, in which the laser is applied from above (e.g., from the upper side of) the sapphire substrate 372. In one or more embodiments, the laser wavelength is 248 nm from a KrF excimer laser. The laser energy density may be about 550 mJ/cm$^2$ to about 950 mJ/cm$^2$, but the present disclosure is not limited thereto.

The laser may be applied to a point, or to an area. The laser may also be applied in a line and be scanned, or applied on an area and be scanned over an entire surface area of the sapphire substrate. For example, as the size of the device increases, the laser beam may be applied multiple times across the surface of the sapphire. In one or more embodiments, the laser incident area (or the beam size) may be from about 50×50 μm$^2$ to about 1×1 cm$^2$, but the present disclosure is not limited thereto, and the laser incident area may be controlled in any suitable manner. Also, the duration of applying the laser may vary according to the size of the device being fabricated, and it may typically be between a few seconds and a few minutes, but the present disclosure is not limited thereto.

After the sapphire substrate 372 is removed, the fabrication of the display layer 394 has been completed. Then in box 510 of FIG. 38, the display layer 394 is combined with a color conversion layer to form a display device. The color conversion layer may, for example, be the color conversation layer 390 of FIG. 37A or the color conversion layer 392 of FIG. 37B. However, the present disclosure is not limited thereto, and the color conversion layer combined with the display layer 394 in box 510 can be any other color conversion layer according to one or more embodiments of the present disclosure. For example, the color conversion layer may include color conversion structures illustrated in FIGS. 45 and 46 of the present disclosure.

Figure 39A:
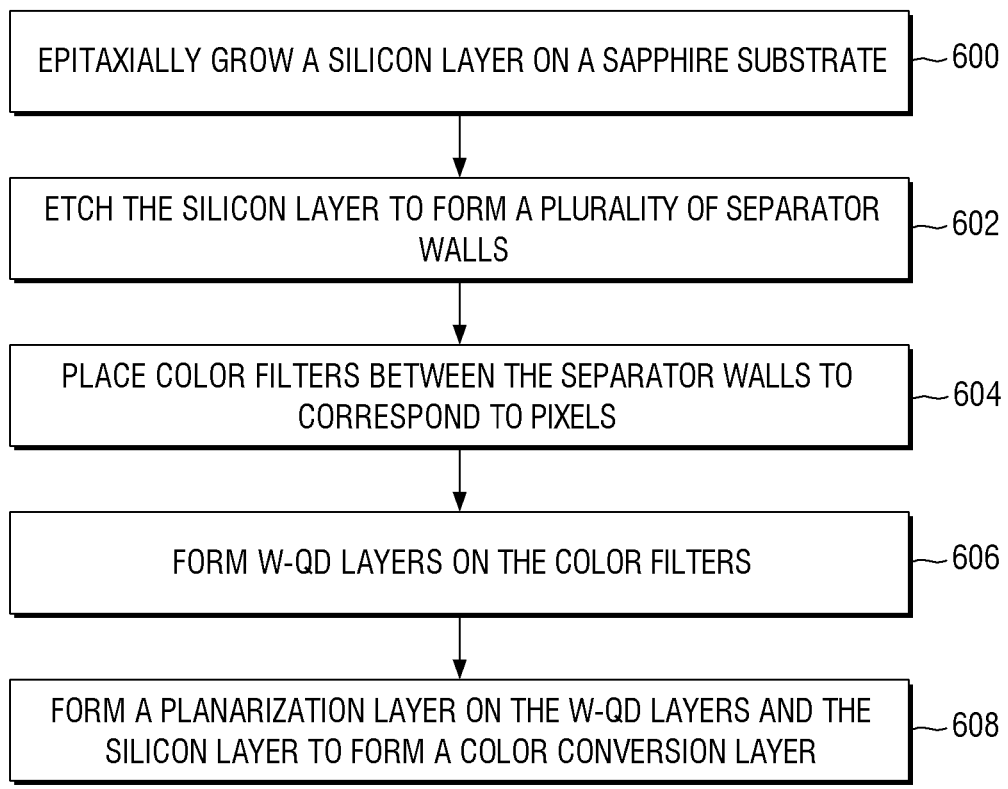
FIG. 39A is a flow diagram illustrating a process of fabricating a color conversion layer shown in the display device of FIG. 37A.
Figure 40A:
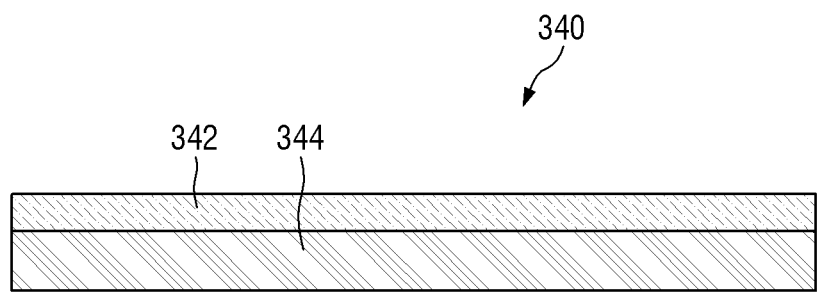
FIG. 40A is a silicon-on-sapphire (SOS) substrate that may be applied to one or more embodiments of the present disclosure.

To form the color conversion layer 390, first a silicon layer 342 is grown epitaxially on a sapphire substrate 344 as shown in box 600 of FIG. 39A to form a silicon-on-sapphire (SOS) substrate 340. FIG. 40A illustrates the silicon-on-sapphire (SOS) substrate 340 that may be applied to one or more embodiments of the present disclosure. By way of example, a silicon layer 342 has been grown (e.g., epitaxially grown) to a thickness of about 1 μm on a sapphire substrate, however, the present disclosure is not limited thereto, and the silicon layer 342 may be grown to any suitable thickness for the formation of the color filter layer 342.

Figure 40B:
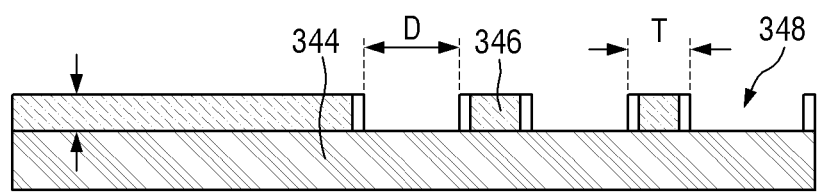
FIG. 40B is an SOS substrate after deep reactive ion etching (DRIE) of silicon to fabricate a plurality of separation walls according to one or more embodiments of the present disclosure.

FIG. 40B is an SOS substrate after deep reactive ion etching (DRIE) of silicon to fabricate a plurality of separation walls 346 according to one or more embodiments of the present disclosure as shown in box 602 of FIG. 39A. By way of example, DRIE may have been used to etch the silicon layer 342 to generate a plurality of cavities (or openings) 348, each of which may have a width (e.g., a separation distance or diameter) D of about 5.5 μm. The thickness T of the separation wall 346 between two adjacent cavities (or openings) 348, for example, may be about 2.5 μm. However, the present disclosure is not limited to these width and thickness, and the width and the thickness may be suitably selected in consideration of factors such as, for example, a desired resolution, the size of the resulting display device, and/or the like, as those of ordinary skill in the art would appreciate after studying the present disclosure. In one or more embodiments, the width of the separation wall 346 may include widths (or thickness) of one or more coatings or layers formed at side walls (e.g., a peripheral wall) of the separation wall 346 in a direction parallel to a planar surface of the sapphire substrate 344.

By etching (e.g., DRIE) the SOS substrate 340 (i.e., the silicon layer 342 of the SOS substrate 340), a plurality of silicon separation walls (or separators) 346 may be formed on the sapphire substrate 344. The etching, for example, may be a high aspect ratio etching, in which the height of the separation walls compared to the width (or thickness) of the separation walls is relatively high. Here, the height of the separation walls may correspond to the depth of the cavities (or openings) 348 formed through etching in a direction perpendicular to a planar surface of the silicon layer, and the separation distance (D) between the separation walls 346 may correspond to the diameter (or the width) of the cavities (or openings) 348 in a direction parallel to the planar surface of the silicon layer. Further, the thickness (T) of the separation walls in a direction parallel to the planar surface of the silicon layer may correspond to a distance between two adjacent ones of the cavities (or openings) 348.

According to one or more embodiments, the SOS substrate may be used to fabricate a light-emitting-diode on silicon (LEDoS) display. By way of example, the silicon layer 342 may be formed on an r-plane sapphire through epitaxial growth known to those of ordinary skill in the art. The sapphire may be an r-plane (1012) sapphire, and may have been processed through single side polishing (SSP), however, the present disclosure is not limited thereto. Also, while the present disclosure is discussed primarily in reference to an SOS substrate, the underlying substrate is not limited to a sapphire substrate, and other suitable substrates may be used in one or more other embodiments.

The aspect ratio of the separation walls may be adjusted depending on the desired resolution of the resulting display device. For example to realize a 2000 pixels per inch (ppi) (1920×1080) in a 0.7" display device, the ratio D/T between the separation wall distance (D) and the separation wall thickness (T) may be 5.5 μm/2.5 μm. For another example, to realize a 6000 ppi (1800×1350) in a 0.36" display device, the ratio D/T between the separation wall distance (D) and the separation wall thickness (T) may be 2.2 μm/0.5 μm.

Because it is possible to control the thickness of the silicon layer at the top (e.g., through the epitaxial growth) according to one or more embodiments, the thickness of the silicon layer may be controlled from, for example, about 1 μm to tens of μm to secure (or obtain) sufficient thickness for color filters having different colors used for color conversion.

Figure 42:
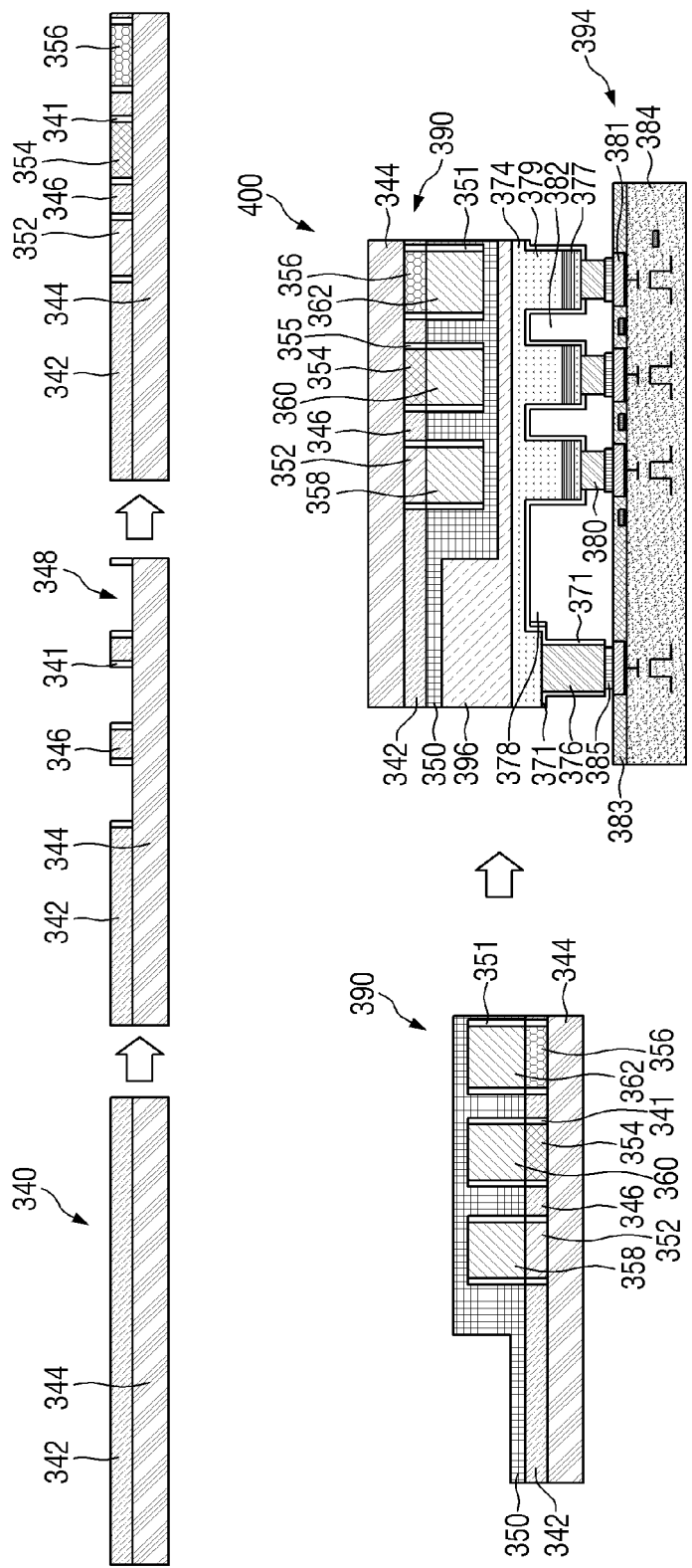
FIG. 42 illustrates a process of fabricating the color conversion layer in the display device of FIG. 37A according to an embodiment of the present disclosure.

FIGS. 41A and 41B illustrate a process of fabricating a display device according to one or more embodiments of the present disclosure. FIG. 42 illustrates a process of fabricating a color conversion substrate in more detail according to an embodiment of the present disclosure. As illustrated in FIGS. 41A-B and 42, and as shown in box 604 of FIG. 39A, color filters are placed in (e.g., formed in) the cavities (or openings) 348 between the separation walls 346. As illustrated in FIGS. 41A-B and 42, one or more layers 341 are formed (or coated) on a side surface of the silicon layer 342 and side surfaces of the separation walls 346, between the side surfaces and the respective color filters. The one or more layers 341 may include a passivation layer, a metal layer (e.g., a metal layer 345 of FIGS. 45 and 46) and/or any other suitable layer or layers known to those skilled in the art. It can be seen in FIGS. 41A-B and 42 that the color filters include red, green and blue color filters 352, 354 and 356, respectively. However, the present disclosure is not limited thereto, and any other suitable color filters may be used as those of ordinary skill in the art would appreciate after studying the present disclosure. In one or more embodiments, the color filters 352, 354 and 356 may be formed using photolithography, however, the present disclosure is not limited thereto, and an imprint method or any other suitable method may be used to form the color filters 352, 356 and 356.

On the color filter layer (formed from a silicon layer) 342 and the color filters 352, 354 and 356 included therein, a passivation layer 350 is formed. Here, the white quantum dot layers (W-QD) 358, 360 and 362 may be first formed on the color filters 352, 354 and 356, and then the passivation layer 350 may be formed on the white quantum dot layers (W-QD) 358, 360 and 362, such that the white quantum dot layers (W-QD) 358, 360 and 362 (e.g., see box 606 of FIG. 39A) that respectively correspond to red, green and blue filters 352, 354, and 356 are formed and then embedded in (or surrounded by) the passivation layer 350. Each of the W-QD layers 358, 360 and 362 may have a thickness of about 5 μm to about 7 μm, for example, however, the present disclosure is not limited thereto. After the formation of the W-QD layers 358, 360 and 362, a reflector (e.g., a metal layer or a reflecting metal) may be formed around (e.g., around the side walls of) the W-QD layers, so as to prevent or reduce light from one of the W-QD layers from leaking into an adjacent one or more of the W-QD layers. In some embodiments, the reflector may be formed first, and then the QD layers and/or the scattering layer and/or the filler 368 may be formed, inserted, or placed to be surrounded by the reflector. The reflector may be made of any suitable metal or material such as aluminum (Al) and may have a thickness between about 1 μm and about 100 μm, but the present disclosure is not limited thereto.

In one or more embodiments, the light emission layer 394 may include light emitting elements that generate a single color light. For example, the light emitting elements in some embodiments may be blue light emitting diodes (LEDs) 379 that emit a blue light. The white quantum layers (W-QD) 358, 360, 362 may be configured to convert the blue light to a white light that may eventually be filtered by the red, blue and green filters 352, 354 and 356, respectively, to realize full color images. As shown in box 608 of FIG. 39A, a planarization layer 350 is formed on the color filter layer 342 and the white quantum layers (W-QD) 358, 360 and 362 to form the color conversion layer 390.

As can be seen in FIGS. 41A-B and 42, the color conversion layer 390 is attached to the light emission layer 394 to form (or fabricate) the display device 400. The adhesive layer 396 is used to attach the color conversion layer 390 to the display layer 394. The display device 400 may be an LEDoS display, for example, however, the present disclosure is not limited thereto.

Figure 43:
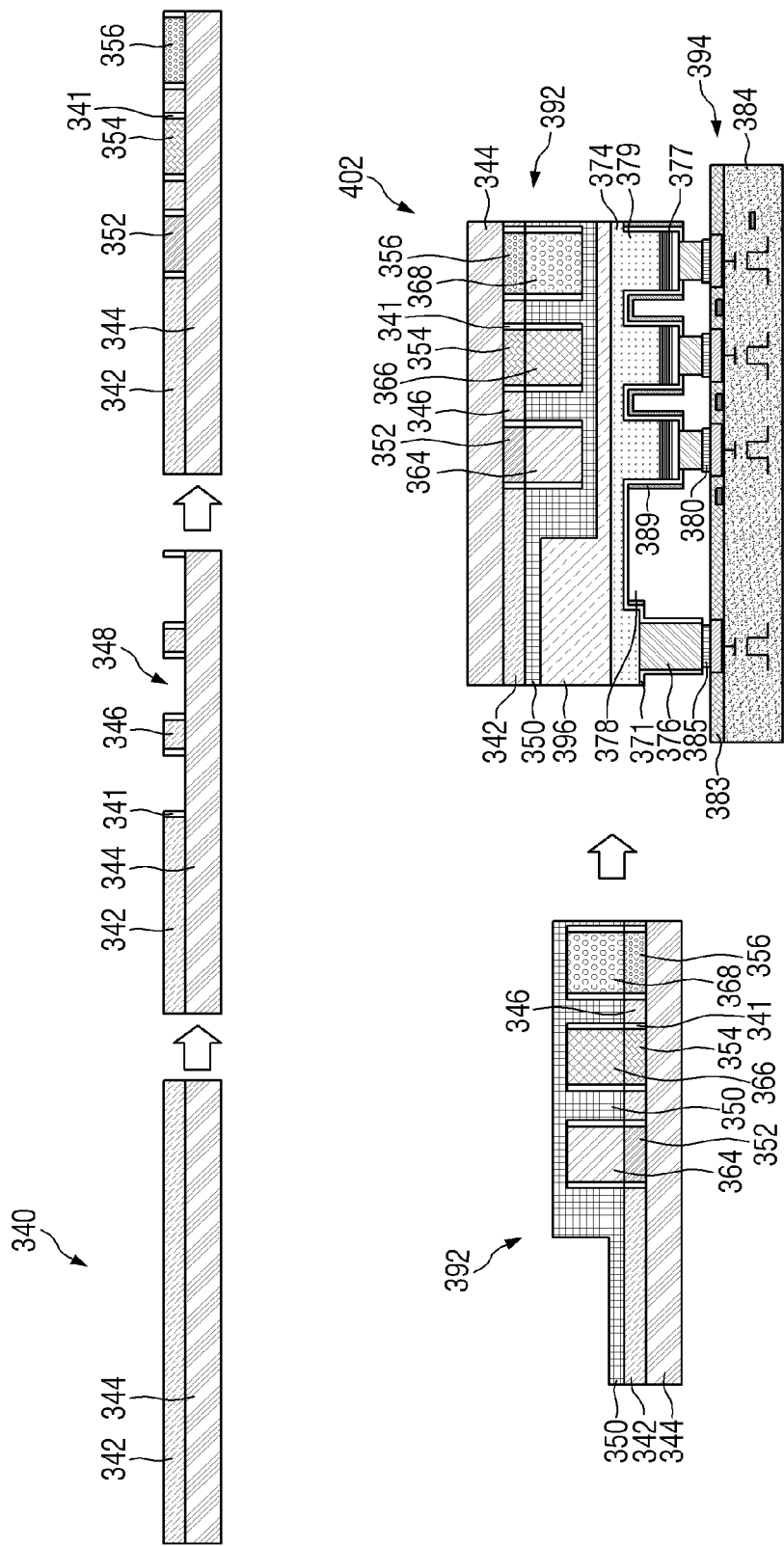
FIG. 43 illustrates a process of fabricating the color conversion layer in the display device of FIG. 37B according to another embodiment of the present disclosure.

FIG. 43 illustrates a process of fabricating the color conversion layer 392 according to another embodiment of the present disclosure. Here, the display layer 394 combined with the color conversion layer 392 is substantially identical to the light emission layer 394 discussed with reference to the display device 400, such that a redundant description of the light emission layer 394 will not be repeated.

Figure 39B:
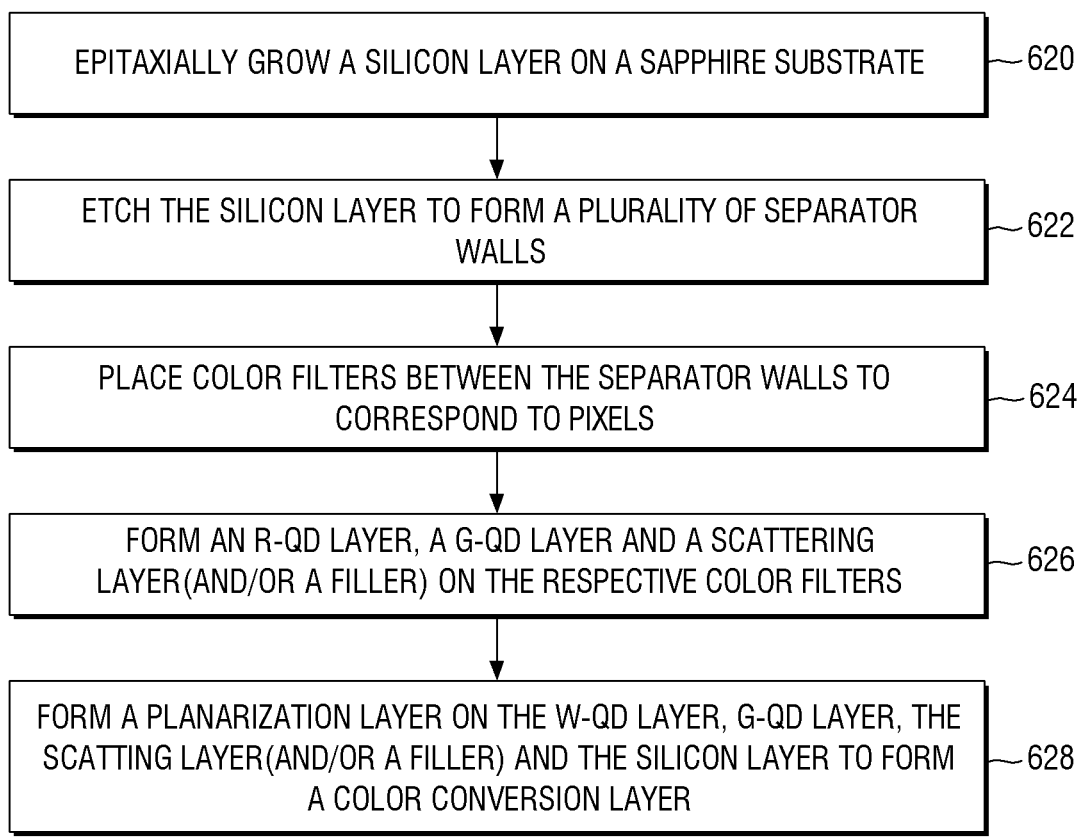
FIG. 39B is a flow diagram illustrating a process of fabricating a color conversion layer shown in the display device of FIG. 37B.

As discussed in detail with references to FIGS. 40A and 40B, the SOS substrate 340 is prepared by forming (e.g., epitaxially growing) the silicon layer 342 on the sapphire substrate 344 as shown in box 620 of FIG. 39B. The silicon layer 342 may have a thickness of about 1 μm, for example. However, the present disclosure is not limited thereto, and the silicon layer 342 may be formed to any other suitable thickness as those of ordinary skill in the art would appreciate after studying the present disclosure.

As shown in FIGS. 41A-B and 43, color filters are placed in (e.g., formed in) the cavities (or openings) 348 between the separation walls 346 as shown in box 624 of FIG. 39B after etching the silicon layer 342 as shown in box 622 of FIG. 39B. As illustrated in FIGS. 41A-B and 43, one or more layers 341 are formed (or coated) on a side surface of the silicon layer 342 and side surfaces of the separation walls 346, between the side surfaces and the respective color filters. The one or more layers 341 may include a passivation layer, a metal layer (e.g., a metal layer 345 of FIGS. 45 and 46) and/or any other suitable layer or layers known to those skilled in the art. It can be seen in FIGS. 41A-B and 43 that the color filters are red, green and blue color filters 352, 354 and 356, respectively. However, the present disclosure is not limited thereto, and any other suitable color filters may be used as those of ordinary skill in the art would appreciate after studying the present disclosure. In one or more embodiments, the color filters 352, 354 and 356 may be formed using photolithography, however, the present disclosure is not limited thereto, and an imprint method or any other suitable method may be used to form the color filters 352, 356 and 356. The number, structure and formation of the color filters in the color conversion layer 392 of FIG. 43, for example, may be substantially the same as those described with reference to the color conversion layer 390 of FIG. 42.

The color conversion layer 392 illustrated in FIGS. 41A-B and 43 are substantially similar to the color conversion layer 390 illustrated in FIGS. 41A-B and 42, except that instead of white quantum dot layers (W-QD) 358, 360 and 362, the color conversion layer 392 includes a red quantum dot layer (R-QD) 364 and a green quantum dot layer (G-QD) 366 as shown in box 626 of FIG. 39B. Also, instead of quantum dots, the blue filter 356 may be coupled (e.g., optically coupled) with a suitable scattering layer and/or a filler 368 that may not correspond to any quantum dot or color conversion. This is because the color conversion layer 392, instead of converting the blue color light to a white color light, does not convert the blue color light, and only filters it using the blue filter 356 to output a blue light.

Further, the red quantum dot layer (R-QD) 364 and the green quantum dot layer (G-QD) 366 are utilized to convert the incident light to red and green lights, respectively. Similar to the W-QD 358, 360, 362 of the color conversion layer 390, the R-QD 364 and the G-QD 366 may each have a thickness of about 5 µm to about 7 µm. After the formation of the R-QD layer 364, the G-QD layer 366 and the scattering layer and/or the filler 368, a reflector (e.g., a metal layer or a reflecting metal) may be formed around (e.g., around the side walls of) the R-QD layer 364, the G-QD layer 366 and the scattering layer and/or the filler 368, so as to prevent or reduce light from one of the R-QD layer 364, the G-QD layer 366 and the scattering layer and/or the filler 368 from leaking into an adjacent one or more of the QD layers and/or the scattering layer and/or the filler 368. In some embodiments, the reflector may be formed first, and then the QD layers and/or the scattering layer and/or the filler 368 may be formed, inserted, or placed to be surrounded by the reflector. The reflector may be made of any suitable metal or material such as aluminum (Al) and may have a thickness between about 1 µm and about 100 µm, but the present disclosure is not limited thereto.

According to one or more embodiments, the quantum dots included in the red quantum dot layer (R-QD) 364 and the green quantum dot layer (G-QD) 366 may include a nanocrystalline material, such as a silicon-based nanocrystal, a group II-VI-based compound semiconductor nanocrystal, a group III-V-based compound semiconductor nanocrystal, a group IV-VI-based compound semiconductor nanocrystal, or a mixture thereof. The group II-VI-based compound semiconductor nanocrystal may include at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The group III-V-based compound semiconductor nanocrystal may include at least one selected from GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The group IV-VI-based compound semiconductor nanocrystal may include SbTe. However, the present disclosure is not limited to these particular materials for quantum dots.

As can be seen in FIGS. 41A-B and 43, after forming the planarization layer 350 on the color filter layer 342 to form the color conversion layer 392 (e.g., see box 628 of FIG. 39B), the color conversion layer 392 is attached to the display layer 394 to fabricate the display device 402. An adhesive layer 396 is used to attach the color conversion layer 392 to the light emission layer 394. The display device 402 may be an LEDoS display, for example, however, the present disclosure is not limited thereto.

Figure 45:
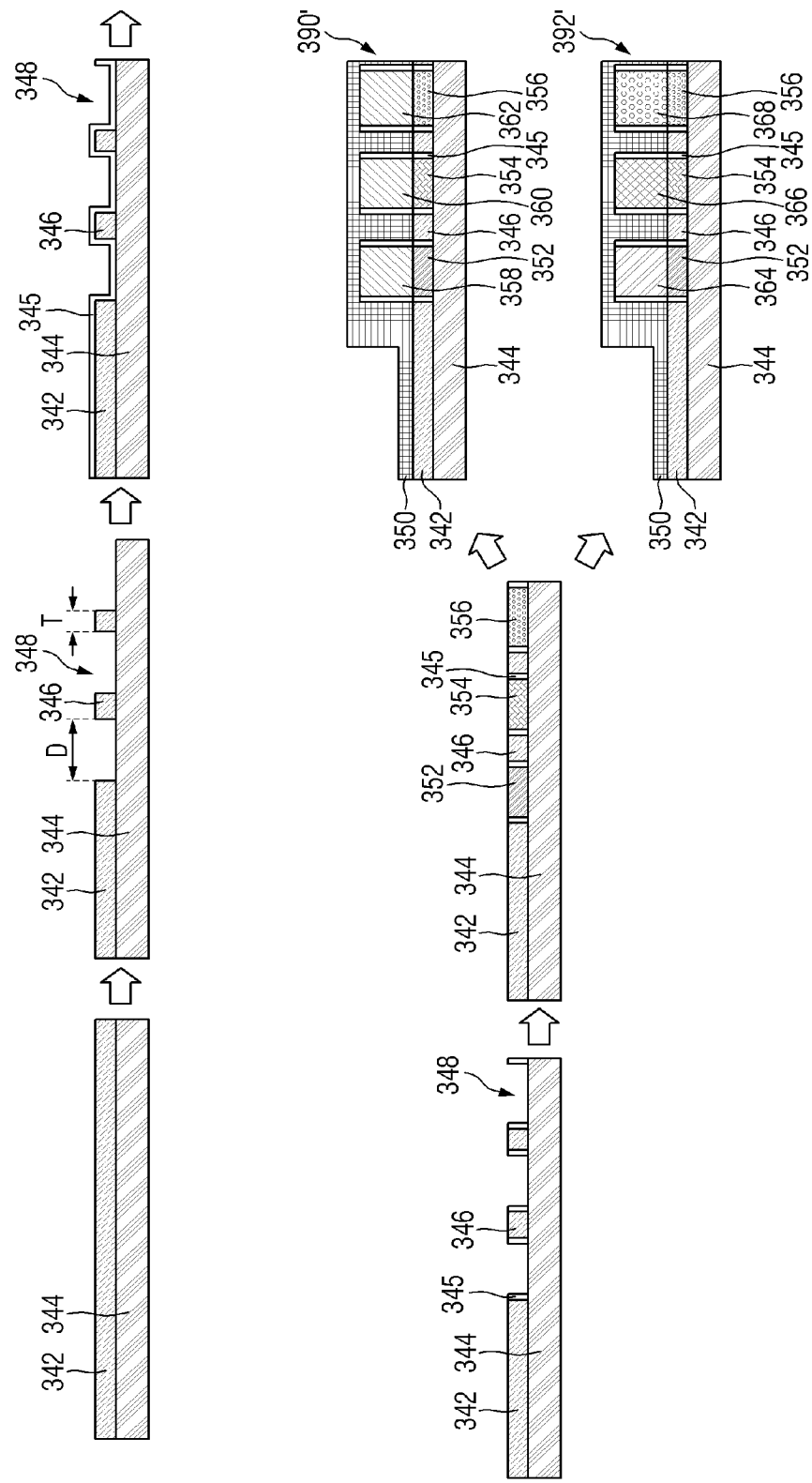
FIG. 45 illustrates a process of fabricating a color conversion layer according to one or more embodiments of the present disclosure.

FIG. 45 illustrates a process of fabricating color conversion layers in one or more embodiments according to the present disclosure. The process of FIG. 45 is substantially similar to the flow diagrams of FIGS. 39A and 39B as well as the processes illustrated in FIGS. 41-43, except that FIG. 45 illustrates formation and processing of a metal layer 345. While FIG. 45 is described in reference to the formation and processing of metal layer 345 only, FIG. 45 may also include one or more other layers of the one or more layers 341 (for example, see FIGS. 41A-B, 42, and 43), which may include a passivation layer and/or any other suitable layer known to those skilled in the art. After etching the silicon layer 342 to form the plurality of separation walls 346, the metal layer 345 is deposited on a surface (e.g., an entire surface) of remaining portions of the silicon layer 342 and the sapphire substrate 344. The metal layer may be deposited also on side walls of the openings (or cavities) 348, for example. The thickness of the metal layer 345 may be about 1 µm to about 100 µm, but the present disclosure is not limited thereto, and any suitable thickness may be used as those of ordinary skill in the art would appreciate after studying the present disclosure. The metal layer 345 may be formed of aluminum through a vapor deposition process and/or the like, but the present disclosure is not limited thereto. Thereafter, portions of the metal layer 345, except for portions formed on the side walls of the openings (or cavities) 348 that are adjacent to the color filters 352, 354 and 356, are removed using a suitable process (e.g., etching) that is known to those of ordinary skill in the art.

In one or more embodiments, the metal layer 345 may be used to reflect light so as to prevent or reduce light leakage between neighboring color filters, for example. After etching, color filters are placed in the openings. According to one or more embodiments, the remaining process may be substantially similar to those shown and illustrated in FIGS. 39A and 42 to fabricate a color conversion layer 390', which may be substantially similar to the color conversion layer 390 of FIG. 37A, except that the color conversion layer 390' additionally includes the metal layer 345 around the periphery or an edge of each color filter. According to one or more embodiments, the remaining process may be substantially similar to those shown and illustrated in FIGS. 39B and 43 to fabricate a conversion layer 392', which may be substantially similar to the color conversion layer 392 of FIG. 37B, except that the color conversion layer 392' additionally includes the metal layer 345 around the periphery or an edge of each color filter.

Figure 46:
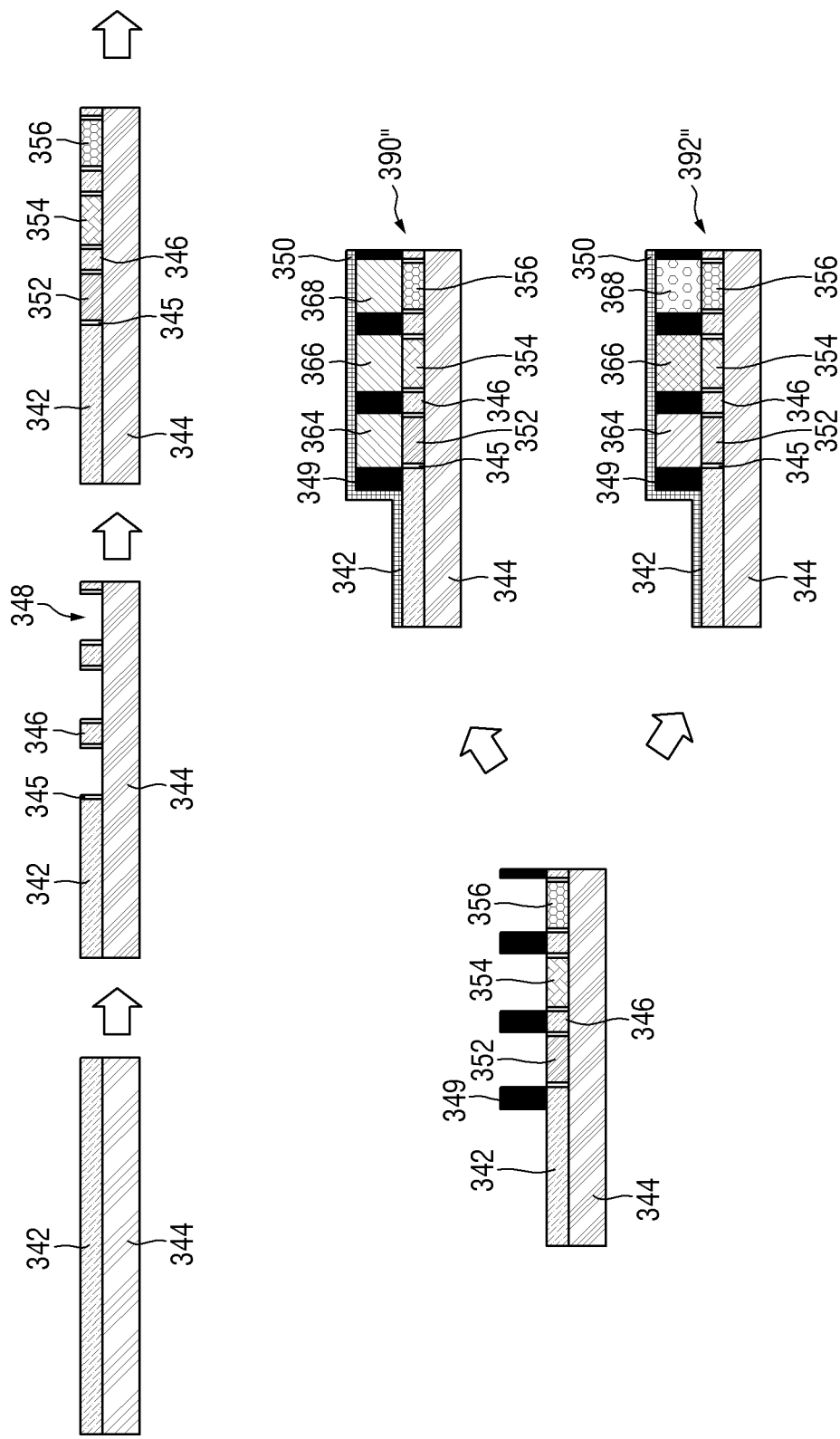
FIG. 46 illustrates a process of fabricating a color conversion layer according to one or more embodiments of the present disclosure.

The process of fabricating a color conversion layer according to one or more embodiments of FIG. 46 is substantially similar to that of FIG. 45, except that a black matrix 349 is formed instead of (or in addition to) the metal layer 345 of FIG. 45. In one or more embodiments, the metal layer 345 and the black matrix 349 can both be formed in the same color conversion layer (e.g., a color conversion layer 390" that is substantially similar to the color conversion layer 390' of FIG. 45 or a color conversion layer 392" that is substantially similar to the color conversion layer 392' of FIG. 45). While not specifically described in reference to FIG. 46, in addition to the metal layer 345, FIG. 46 may also include one or more other layers of the one or more layers 341 (for example, see FIGS. 41A-B, 42, and 43), which may include a passivation layer and/or any other suitable layer known to those skilled in the art.

After etching the silicon layer 342 to form the plurality of separator walls 346 that define a plurality of color filter openings (or cavities) 348, red, green and blue color filters 352, 354 and 356 are placed or formed in the openings (or cavities) 348. In one or more embodiments, the metal layer 345 may be formed in a substantially similar manner as illustrated in FIG. 45, but the present disclosure is not limited thereto, and the metal layer 345 may be formed using a different process, or no metal layer may be formed in some embodiments. By way of example, the openings 348 according to one or more embodiments may be filled with the color filters 352, 354, 356 through photolithography. In one or more embodiments, an imprint method or any other suitable method may be used to form the color filters 352, 354 and 356. A black matrix 349 is formed on the color filter layer 342. The black matrix 349 may block off (or absorb) light, so as to prevent light leakage between adjacent pixels, for example. In one or more embodiments, for example, the black matrix may be made of low reflectance chrome or resin, however, the present disclosure is not limited thereto.

According to one or more embodiments, the process illustrated in FIG. 46 would result in the color conversion layer 390" that is substantially similar to the color conversion layer 390 of FIG. 37A or the color conversion layer 390' of FIG. 45, except that the color conversion layer 390" also includes the metal layer 345 and/or the black matrix 349. According to one or more embodiments, the process illustrated in FIG. 46 would result in the color conversion layer 392" that is substantially similar to the color conversion layer 392 of FIG. 37B or the color conversion layer 392' of FIG. 45, except that the color conversion layer 392" also includes the metal layer 345 and/or the black matrix 349.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
    a plurality of light emitting elements on a first substrate;
    a second substrate facing the first substrate;
    a partition wall on one surface of the second substrate facing the first substrate, and including a plurality of openings;
    a plurality of color filters in the plurality of openings;
    wavelength conversion layers on the plurality of color filters, respectively, and configured to convert wavelengths of light emitted from the plurality of light emitting elements; and
    an adhesive layer overlapping with the plurality of light emitting elements in a thickness direction, and located between the wavelength conversion layers and the light emitting elements in the thickness direction to adhere the first substrate and the second substrate to each other,
    wherein the partition wall comprises a silicon single crystal.

2. The display device of claim 1, wherein the plurality of light emitting elements are configured to emit first light, and
    wherein the plurality of color filters comprise:
        a first color filter configured to transmit the first light;
        a second color filter configured to transmit second light having a wavelength band different from that of the first light; and
        a third color filter configured to transmit third light having a wavelength band different from those of the first light and the second light.

3. The display device of claim 2, wherein the plurality of openings comprise:
    a first opening;
    a second opening spaced from the first opening; and
    a third opening spaced from the first and second openings, and
    wherein the first color filter is located in the first opening, the second color filter is located in the second opening, and the third color filter is located in the third opening.

4. The display device of claim 3, wherein the wavelength conversion layers are configured to convert a portion of the first light into fourth light, and emit fifth light formed by mixing the first light with the fourth light therein.

5. The display device of claim 4, wherein:
    the first color filter is configured to convert the fifth light emitted from the wavelength conversion layers into the first light;
    the second color filter is configured to convert the fifth light emitted from the wavelength conversion layers into the second light; and
    the third color filter is configured to convert the fifth light emitted from the wavelength conversion layers into the third light.

6. The display device of claim 3, wherein the wavelength conversion layers comprise:
    a light transmission pattern configured to transmit the first light;
    a first wavelength conversion pattern configured to convert the first light into the second light; and
    a second wavelength conversion pattern configured to convert the first light into the third light.

7. The display device of claim 6, wherein the light transmission pattern overlaps with the first color filter, the first wavelength conversion pattern overlaps with the second color filter, and the second wavelength conversion pattern overlaps with the third color filter.

8. The display device of claim 1, wherein the partition wall has a thickness of 1 μm to 10 μm.

9. The display device of claim 1, wherein each of the plurality of light emitting elements comprises:
    a first semiconductor layer;
    an active layer on the first semiconductor layer;
    a second semiconductor layer on the active layer; and
    a third semiconductor layer on the second semiconductor layer.

10. The display device of claim 9, wherein the second semiconductor layer and the third semiconductor layer are common layers that are commonly connected to the plurality of light emitting elements.

11. The display device of claim 10, wherein a thickness of an area of the second semiconductor layer that overlaps with the first semiconductor layer is greater than a thickness of an area of the second semiconductor layer that does not overlap with the first semiconductor layer.

12. The display device of claim 9, wherein each of the plurality of light emitting elements further comprises:
first insulating layers on side surfaces of the first semiconductor layer, the active layer, and the second semiconductor layer; and
first reflective layers on side surfaces of the first insulating layers.

13. The display device of claim 9, wherein the first substrate comprises:
a plurality of pixel circuit parts comprising at least one transistor;
pixel electrodes on the plurality of pixel circuit parts, and connected to the plurality of pixel circuit parts, respectively;
a circuit insulating layer between the plurality of pixel circuit parts and the pixel electrodes; and
contact electrodes on the pixel electrodes, respectively.

14. The display device of claim 13, wherein each of the plurality of light emitting elements comprises a connection electrode between the first semiconductor layer and a corresponding one of the contact electrodes, and
wherein the corresponding one of the contact electrodes is in contact with the connection electrode.

15. The display device of claim 1, further comprising second reflective layers on side surfaces of each of the plurality of openings,
wherein the second reflective layers surround the plurality of color filters, respectively.

16. The display device of claim 15, wherein the wavelength conversion layers overlap with the plurality of color filters, the second reflective layers, and the plurality of openings.

17. The display device of claim 1, further comprising a second passivation layer between the plurality of color filters and the wavelength conversion layers.

18. The display device of claim 1, wherein the plurality of color filters and the wavelength conversion layers are located in the plurality of openings, respectively.

19. The display device of claim 1, further comprising a light blocking member on the partition wall, and partitioning the wavelength conversion layers,
wherein the light blocking member does not overlap with the plurality of openings.

20. A display device comprising:
a plurality of light emitting elements on a first substrate;
a second substrate facing the first substrate;
a partition wall on one surface of the second substrate facing the first substrate, and including a plurality of openings;
a plurality of color filters in the plurality of openings;
wavelength conversion layers on the plurality of color filters, respectively, and configured to convert wavelengths of light emitted from the plurality of light emitting elements;
an adhesive layer adhering the first substrate and the second substrate to each other; and
a first passivation layer covering the partition wall and the wavelength conversion layers,
wherein the partition wall comprises a silicon single crystal, and
wherein one surface of the first passivation layer that is adjacent to the light emitting elements is flat.

21. A display device comprising:
a first substrate and a second substrate facing each other, the first and second substrates comprising a first emission area configured to emit first light, a second emission area configured to emit second light, and a third emission area configured to emit third light;
a plurality of light emitting elements on the first substrate in the first emission area, the second emission area, and the third emission area;
a partition wall on one surface of the second substrate facing the first substrate, and including a plurality of openings corresponding to the first emission area, the second emission area, and the third emission area;
a plurality of color filters in the plurality of openings;
wavelength conversion layers on the plurality of color filters, respectively; and
an adhesive layer overlapping with the plurality of light emitting elements in a thickness direction, and located between the wavelength conversion layers and the light emitting elements in the thickness direction to adhere the first substrate and the second substrate to each other,
wherein the partition wall comprises a silicon single crystal, and
wherein the plurality of openings include a first opening corresponding to the first emission area, a second opening corresponding to the second emission area, and a third opening corresponding to the third emission area.

22. The display device of claim 21, wherein the plurality of color filters comprise:
a first color filter configured to transmit the first light,
a second color filter configured to transmit the second light, and
a third color filter configured to transmit the third light, and
wherein the first color filter is located in the first opening, the second color filter is located in the second opening, and the third color filter is located in the third opening.

23. The display device of claim 21, wherein the wavelength conversion layers correspond to the plurality of openings in a one-to-one manner, and completely overlap with the plurality of openings.

24. The display device of claim 21, wherein the first substrate and the second substrate comprise a display area including the first emission area, the second emission area, and the third emission area, and a non-display area other than the display area.

25. The display device of claim 24, wherein each of the plurality of light emitting elements comprises:
a first semiconductor layer;
an active layer on the first semiconductor layer;
a second semiconductor layer on the active layer; and
a third semiconductor layer on the second semiconductor layer, and
wherein the second semiconductor layer and the third semiconductor layer extend from the display area to the non-display area.

26. The display device of claim 25, wherein the first substrate further comprises:
a plurality of pixel circuit parts comprising at least one transistor;

pixel electrodes on the plurality of pixel circuit parts, and connected to the plurality of pixel circuit parts, respectively;

a circuit insulating layer between the plurality of pixel circuit parts and the pixel electrodes;

contact electrodes on the pixel electrodes, respectively, at the display area; and common contact electrodes on the pixel electrodes, respectively, at the non-display area.

27. The display device of claim 26, further comprising common connection electrodes between the second semiconductor layer and the common contact electrodes at the non-display area, wherein the common connection electrodes are in contact with the common contact electrodes.

* * * * *